(12) United States Patent
Sato et al.

(10) Patent No.: US 12,101,966 B2
(45) Date of Patent: Sep. 24, 2024

(54) DISPLAY DEVICE AND ELECTRONIC DEVICE

(71) Applicant: Semiconductor Energy Laboratory Co., Ltd., Atsugi (JP)

(72) Inventors: Manabu Sato, Oyama (JP); Hironori Matsumoto, Tochigi (JP); Masataka Nakada, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/138,765

(22) Filed: Apr. 25, 2023

(65) Prior Publication Data
US 2023/0354643 A1 Nov. 2, 2023

(30) Foreign Application Priority Data
Apr. 28, 2022 (JP) .................. 2022-075019

(51) Int. Cl.
| | |
|---|---|
| *G09G 3/20* | (2006.01) |
| *G06F 3/041* | (2006.01) |
| *G06F 3/042* | (2006.01) |
| *G06V 40/13* | (2022.01) |
| *G09G 3/3233* | (2016.01) |
| *H10K 39/34* | (2023.01) |
| *H10K 59/121* | (2023.01) |

(52) U.S. Cl.
CPC ....... *H10K 59/1213* (2023.02); *G06F 3/0412* (2013.01); *G06F 3/042* (2013.01); *G06V 40/1318* (2022.01); *G09G 3/3233* (2013.01); *H10K 39/34* (2023.02); *G06F 2203/04108* (2013.01); *G09G 2300/0852* (2013.01); *G09G 2354/00* (2013.01)

(58) Field of Classification Search
CPC .................................................. G09G 3/3696
See application file for complete search history.

(56) References Cited

U.S. PATENT DOCUMENTS

| | | | |
|---|---|---|---|
| 7,399,991 B2 | 7/2008 | Seo et al. | |
| 7,663,149 B2 | 2/2010 | Seo et al. | |
| 2008/0106251 A1* | 5/2008 | Cabral | G09F 9/33 |
| | | | 315/150 |
| 2010/0163874 A1 | 7/2010 | Koyama et al. | |
| 2014/0068301 A1 | 3/2014 | Watanabe | |
| 2014/0175436 A1 | 6/2014 | Yamazaki | |
| 2016/0190331 A1 | 6/2016 | Miyake et al. | |
| 2017/0019972 A1 | 1/2017 | Kimura et al. | |

(Continued)

FOREIGN PATENT DOCUMENTS

JP 2002-324673 A 11/2002

*Primary Examiner* — Nan-Ying Yang
(74) *Attorney, Agent, or Firm* — Eric J. Robinson; Robinson Intellectual Property Law Office, P.C.

(57) ABSTRACT

An inexpensive display device with a narrow bezel is provided. The display device includes a first pixel including a light-emitting device, a second pixel including a light-receiving device, and a reading circuit for reading data obtained by the second pixel. The reading circuit includes a first circuit included in a mounted IC chip and a second circuit monolithically formed over a substrate over which a pixel circuit is formed. With this structure, a circuit corresponding to the second circuit can be omitted from the IC chip, so that the IC chip can be downsized.

18 Claims, 24 Drawing Sheets

(56) References Cited

U.S. PATENT DOCUMENTS

| | | |
|---|---|---|
| 2018/0374841 A1 | 12/2018 | Anderson et al. |
| 2020/0006554 A1 | 1/2020 | Cheng et al. |
| 2020/0279858 A1 | 9/2020 | Xie et al. |
| 2020/0292998 A1 | 9/2020 | Yoshizumi et al. |
| 2021/0005126 A1* | 1/2021 | Wang ............... G09G 3/20 |
| 2021/0020785 A1 | 1/2021 | Sato et al. |
| 2021/0091207 A1 | 3/2021 | Yu et al. |
| 2021/0167194 A1 | 6/2021 | Yamazaki et al. |
| 2021/0320212 A1 | 10/2021 | Yamazaki et al. |
| 2021/0376126 A1 | 12/2021 | Sohn et al. |
| 2022/0045167 A1 | 2/2022 | Do et al. |
| 2022/0101781 A1* | 3/2022 | Baumheinrich ......... G09G 3/32 |
| 2022/0123143 A1 | 4/2022 | Song et al. |
| 2022/0165623 A1 | 5/2022 | Jun et al. |
| 2022/0190125 A1 | 6/2022 | Wu et al. |
| 2022/0328694 A1 | 10/2022 | Hanaoka et al. |
| 2023/0029551 A1 | 2/2023 | Hsieh |
| 2023/0050036 A1 | 2/2023 | Yamazaki et al. |
| 2023/0072305 A1 | 3/2023 | Cheng et al. |
| 2023/0079244 A1 | 3/2023 | Yamazaki et al. |
| 2023/0103070 A1 | 3/2023 | Jun et al. |
| 2023/0126578 A1 | 4/2023 | Reznicek et al. |
| 2023/0178558 A1 | 6/2023 | Do |
| 2023/0187493 A1 | 6/2023 | Hong et al. |

* cited by examiner

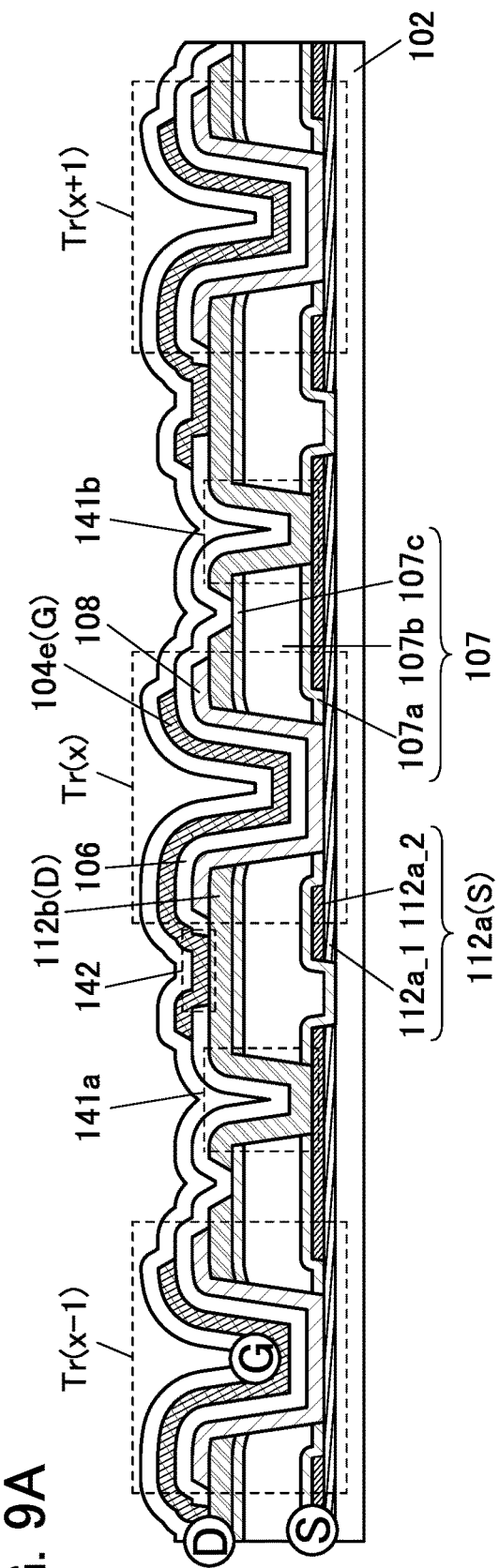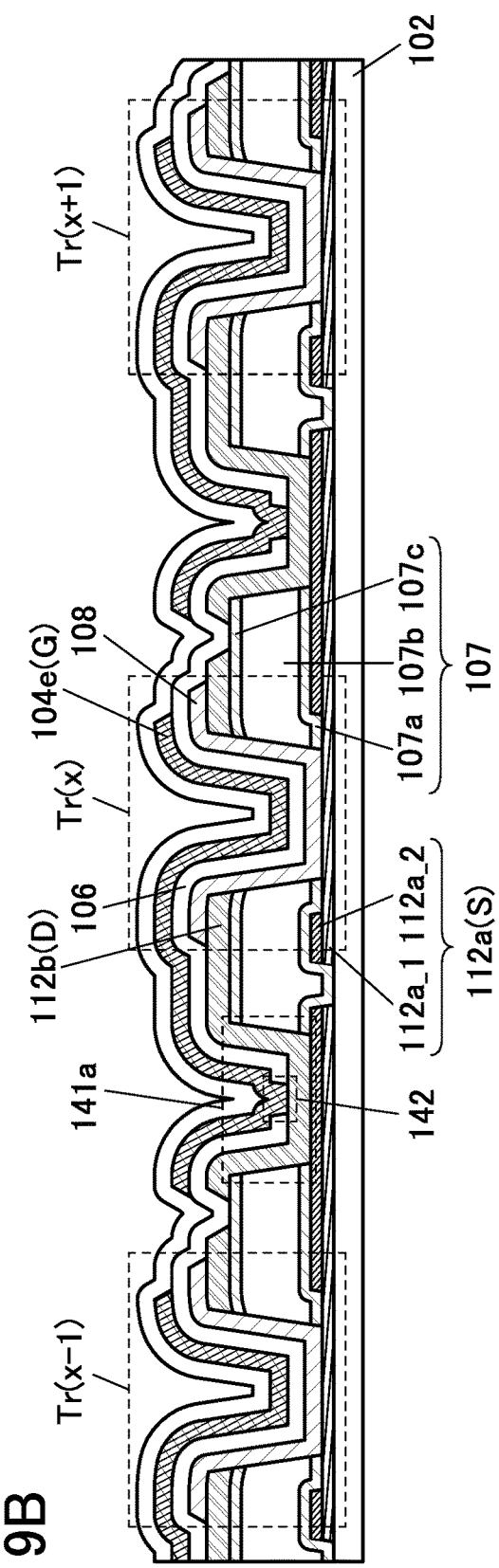

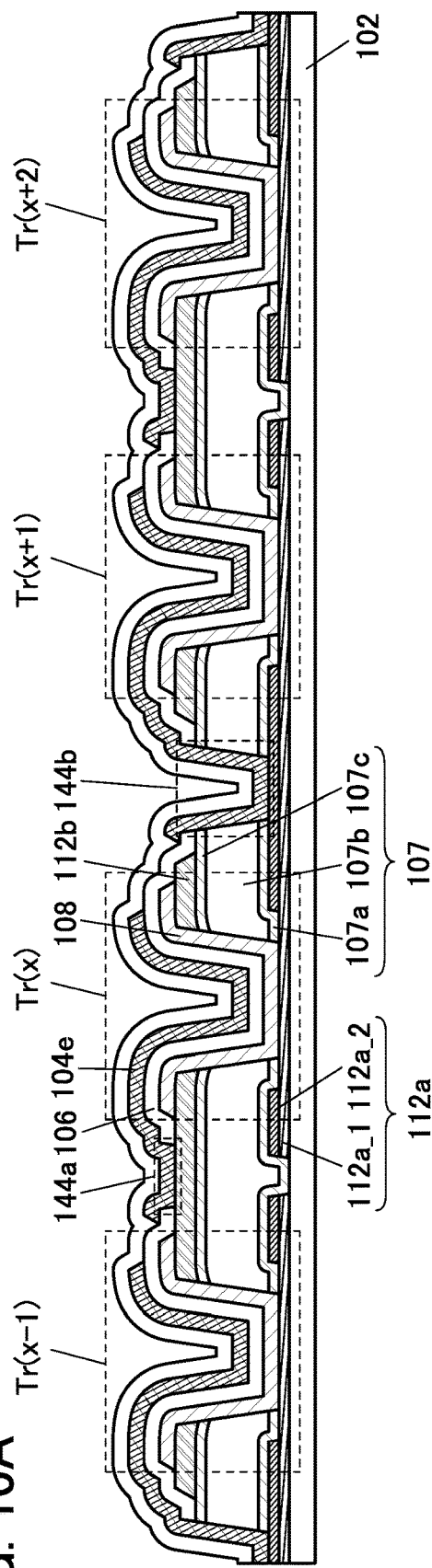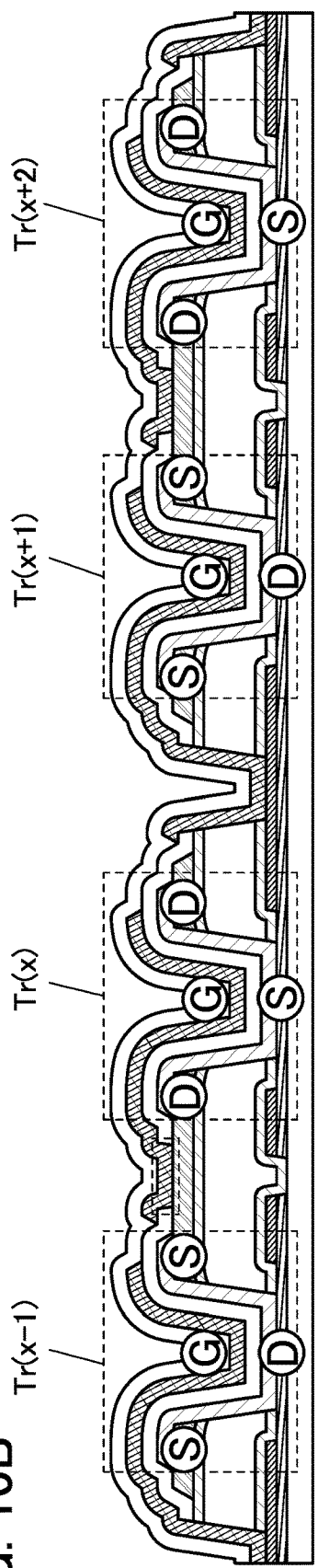

PIX1

PIX2

PIX2

PIX3

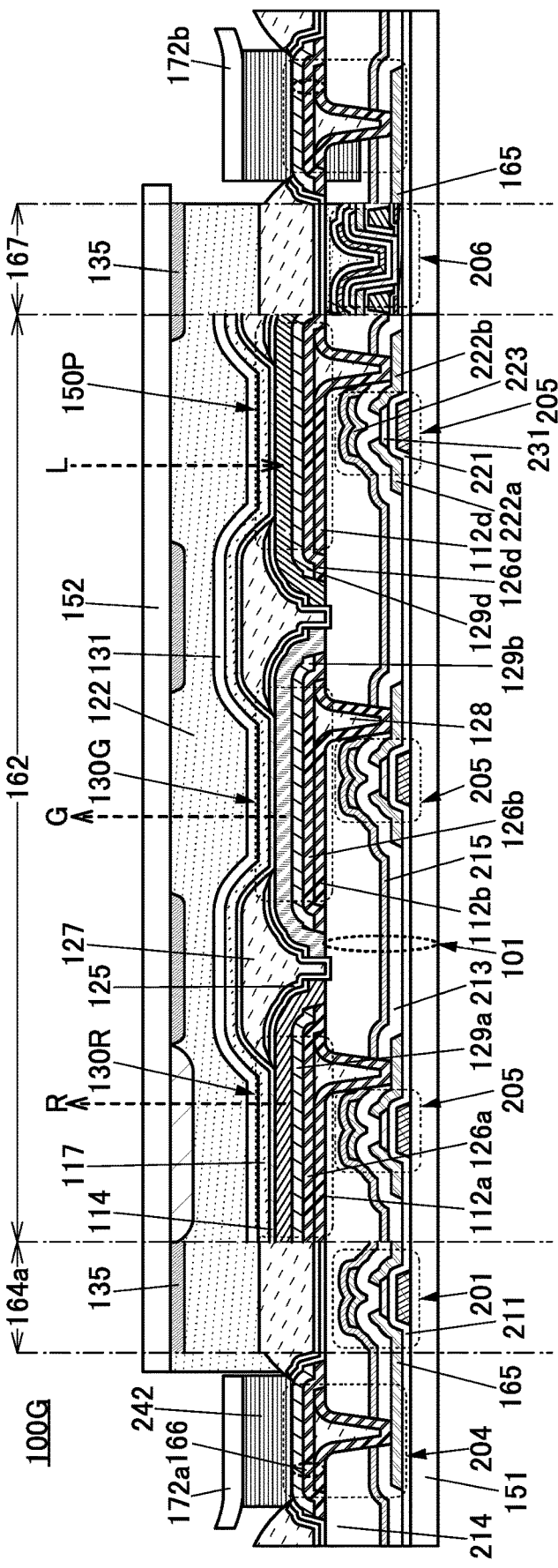
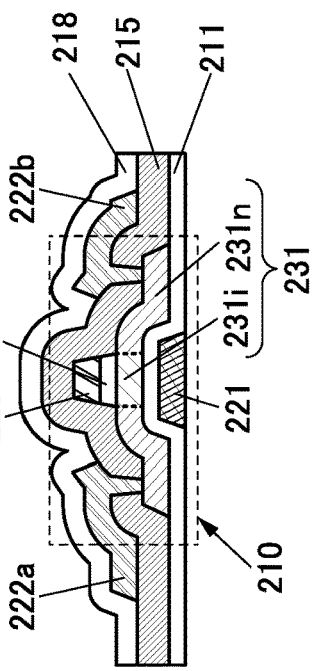
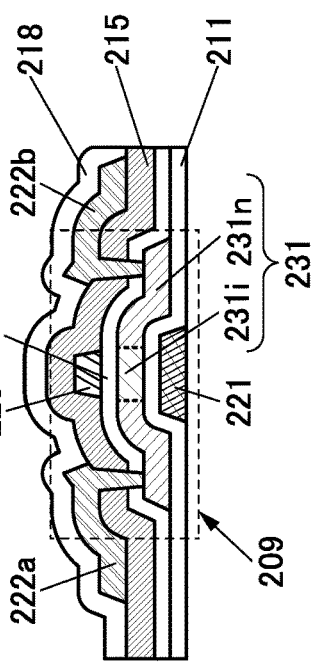

DISPLAY DEVICE AND ELECTRONIC DEVICE

BACKGROUND OF THE INVENTION

1. Field of the Invention

One embodiment of the present invention relates to a display device.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a method for driving any of them, and a method for manufacturing any of them.

2. Description of the Related Art

Recent display devices have been applied to a variety of uses. Usage examples of large-sized display devices include a television device for home use, digital signage, and a public information display (PID). In addition, many display devices have been used for, for example, smartphones and tablet terminals each including a touch panel.

Light-emitting apparatuses including light-emitting devices (also referred to as light-emitting elements) have been developed as display devices. Light-emitting devices utilizing electroluminescence (hereinafter referred to as EL; such devices are also referred to as EL devices or EL elements) have features such as ease of reduction in thickness and weight, high-speed response to input signals, and driving with a constant DC voltage power source.

Patent Document 1 discloses an example of a display device using an organic EL element.

REFERENCE

Patent Document

[Patent Document 1] Japanese Published Patent Application No. 2002-324673

SUMMARY OF THE INVENTION

A display device in which a pixel is provided with a light-receiving device can have an image capturing function. The display device having an image capturing function can obtain an image of a fingerprint, a palm print, or the like that can be used for personal authentication by taking an image of a finger or a palm that touches a surface of a panel. Moreover, the image capturing function of the light-receiving device can be used for a touch sensor.

Here, the display device includes a driver circuit for driving a pixel including a light-emitting device and a driver circuit for driving a pixel including the light-receiving device. The display device further includes a reading circuit for reading data from the pixel including the light-receiving device.

An IC chip is used for part or all of the driver circuits and the reading circuit. For example, on a bezel of a substrate over which a pixel circuit is formed, the IC chip is mounted with the use of a technique such as a chip on glass (COG), a chip on film (COF), or a tape carrier package (TCP).

An increase in the number of mounted IC chips increases the manufacturing cost of the display device and hinders a narrow bezel. In view of the above problems, it is desired that parts of the driver circuits and the reading circuit be monolithically formed over the substrate over which the pixel circuit is formed, whereby the number or size of the IC chips is reduced.

Therefore, an object of one embodiment of the present invention is to provide an inexpensive display device with a narrow bezel. Another object is to provide a display device in which part of a reading circuit is monolithically formed. Another object is to provide a novel display device with a narrow bezel. Another object is to provide a display device having an authentication function. Another object is to provide a highly reliable display device. Another object is to provide an electronic device including the above-described display device.

Note that the description of these objects does not preclude the existence of other objects. One embodiment of the present invention does not need to achieve all of these objects. Other objects can be derived from the description of the specification, the drawings, and the claims.

One embodiment of the present invention is a display device including a first pixel circuit and an A/D converter circuit. The A/D converter circuit includes a first circuit. The first pixel circuit and the first circuit are over the same substrate. The first circuit includes a resistive divider circuit. The resistive divider circuit includes a plurality of transistors each including a drain and a first gate electrically connected to each other. The transistor includes a metal oxide in a semiconductor layer. A channel formation region of the transistor is along a side surface of an insulating layer.

The plurality of transistors can be connected in series so that a source of one of adjacent two transistors is electrically connected to a drain and a first gate of the other transistor.

The plurality of transistors can each include a second gate. In a first transistor and a second transistor among the plurality of transistors, a source potential of the second transistor can be lower than a source potential of the first transistor and the second gate of the first transistor can be electrically connected to a source of the second transistor.

Over the substrate, the display device can further include a first conductive layer and a second conductive layer in addition to the insulating layer. An opening reaching the first conductive layer can be provided in the insulating layer and the second conductive layer.

The transistor whose channel formation region is along the side surface of the insulating layer can include a semiconductor layer including a metal oxide; a second insulating layer over the semiconductor layer including the metal oxide and the second conductive layer; and a third conductive layer over the second insulating layer. The semiconductor layer covers the opening, and the second insulating layer and the third conductive layer cover a depressed portion formed by the opening.

An offset region may be between a channel and a drain in the semiconductor layer of the transistor whose channel formation region is along the side surface of the insulating layer.

The A/D converter circuit can include a second circuit. The second circuit can be in an IC chip on the substrate. The second circuit can be electrically connected to the first circuit.

The first pixel circuit includes a light-receiving device. The display device further includes a second pixel circuit including a light-emitting device.

Another embodiment of the present invention is an electronic device including the display device in which an image of a fingerprint is obtained with use of the first pixel circuit so that fingerprint authentication is performed.

According to one embodiment of the present invention, an inexpensive display device with a narrow bezel can be provided. A display device in which part of a reading circuit is monolithically formed can be provided. A novel display device with a narrow bezel can be provided. A display device having an authentication function can be provided. A highly reliable display device can be provided. An electronic device including the above-described display device can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

In the accompanying drawings:

FIGS. 9A and 9B each illustrate a diode-connected structure of transistors and series connection between the transistors;
FIGS. 10A and 10B each illustrate a diode-connected structure of transistors and series connection between the transistors;
FIG. 19A is a cross-sectional view illustrating an example of a display device and FIGS. 19B and 19C are cross-sectional views illustrating examples of transistors.

DETAILED DESCRIPTION OF THE INVENTION

Figure 1:
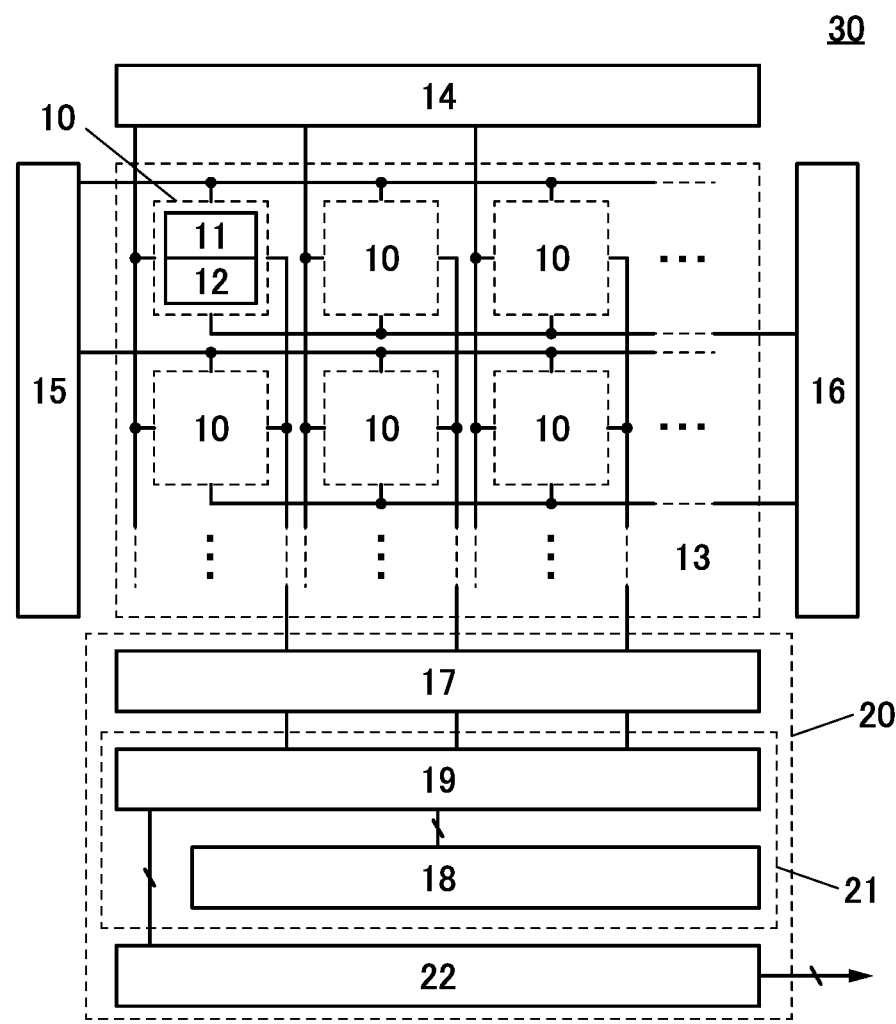
FIG. 1 is a block diagram illustrating a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one or more conductors. In this specification, even such a structure is included in direct connection.

Embodiment 1

In this embodiment, a display device of one embodiment of the present invention will be described with reference to drawings.

One embodiment of the present invention is a display device including a first pixel including a light-emitting device, a second pixel including a light-receiving device, and a reading circuit for reading data obtained by the second pixel. The reading circuit includes a first circuit included in a mounted IC chip and a second circuit monolithically formed over a substrate over which a pixel circuit is formed.

The pixel circuit and the second circuit each include a transistor including a metal oxide in a semiconductor layer. The transistor included in the second circuit can be downsized more easily than the transistor included in the pixel circuit. Therefore, the area occupied by the second circuit can be reduced and a narrow bezel of the display device is less likely to be hindered.

With this structure, a circuit corresponding to the second circuit can be omitted from the IC chip, so that the IC chip can be downsized. Thus, in the manufacturing process of IC chips, a larger number of IC chips can be obtained from one semiconductor wafer, so that the price of the IC chip can be reduced. In other words, the manufacturing cost of the display device can be reduced. Furthermore, the area where the IC chip is mounted can be small, so that the display device can have a narrow bezel.

FIG. 1 is a block diagram illustrating a display device of one embodiment of the present invention. A display device 30 includes a pixel array 13, a circuit 14, a circuit 15, a circuit 16, and a circuit 20. The pixel array 13 includes pixels 10 arranged in a column direction and a row direction.

The pixel 10 can include subpixels 11 and 12. For example, the subpixel 11 has a function of emitting light for display. The subpixel 12 has a function of detecting light delivered to the display device 30. Note that one pixel 10 may include a plurality of subpixels 11 and a plurality of subpixels 12.

Note that in this specification, although a minimum unit in which independent operation is performed in one "pixel" is defined as a "subpixel" in the description for convenience, a "pixel" may be replaced with a "region" and a "subpixel" may be replaced with a "pixel".

The subpixel 11 includes a light-emitting device emitting visible light. As the light-emitting device, an EL element such as an organic light-emitting diode (OLED) or a quantum-dot light-emitting diode (QLED) is preferably used. Examples of a light-emitting substance contained in the EL element include a substance exhibiting fluorescence (a fluorescent material), a substance exhibiting phosphorescence (a phosphorescent material), a substance exhibiting thermally activated delayed fluorescence (a thermally activated delayed fluorescent (TADF) material), and an inorganic compound (e.g., a quantum dot material). A light-emitting diode (LED) such as a micro-LED can also be used as the light-emitting device.

The subpixel 12 includes a light-receiving device that has sensitivity to visible light or infrared light. Near-infrared light can be used as infrared light, for example. A photoelectric conversion element that detects incident light and generates electric charge can be used as the light-receiving device. The amount of electric charge generated by the light-receiving device depends on the amount of light entering the light-receiving device. As the light-receiving device, a PN photodiode or a PIN photodiode can be used, for example.

It is preferable to use an organic photodiode containing an organic compound in a photoelectric conversion layer as the light-receiving device. An organic photodiode is easily made thin and lightweight and easily has a large area. In addition, an organic photodiode can be used in a variety of display devices because of its high flexibility in shape and design. Alternatively, a photodiode containing crystalline silicon (single crystal silicon, polycrystalline silicon, microcrystalline silicon, or the like) can be used as the light-receiving device.

In one embodiment of the present invention, an organic EL element is used as the light-emitting device, and an organic photodiode is used as the light-receiving device. The organic photodiode and the organic EL element can share a component. Accordingly, the light-receiving device can be incorporated in the display device 30 without a significant increase in the number of manufacturing steps. As another example, a photoelectric conversion layer of the light-receiving device and a light-emitting layer of the light-emitting device are separately formed, and the other layers may be shared by the light-emitting device and the light-receiving device.

The circuit 14 and the circuit 15 are driver circuits for driving the subpixel 11. The circuit 14 can have a function of a source driver and the circuit 15 can have a function of a gate driver. A shift register circuit or the like can be used as the circuit 14 and the circuit 15, for example.

The circuit 16 is a driver circuit for driving the subpixel 12. The circuit 16 can have a function of a row driver. A shift register circuit, a decoder circuit, or the like can be used as the circuit 16 and a circuit 22, which is described later, for example.

The circuits 14, 15, and 16 can be provided by mounting an IC chip on a substrate over which the pixel 10 is formed. One or more of the circuits 14, 15, and 16 or part of circuits included in the circuits 14, 15, and 16 can be monolithically formed over the substrate over which the pixel 10 is formed.

The circuit 20 is a read circuit for data output from the subpixel 12. The circuit 20 includes a correlated double sampling (CDS) circuit 17 that performs correlated double sampling processing on data output from the subpixel 12; an analog/digital (A/D) converter circuit 21 that converts analog data output from the CDS circuit 17 into digital data; the circuit 22 functioning as a column driver that outputs the generated digital data to the outside column by column; and the like.

In the circuit 20, a circuit included in the IC chip mounted on the substrate over which the pixel 10 is formed and a circuit monolithically formed on the substrate over which the pixel 10 is formed can be combined. Next, one embodiment of the present invention in which part of the A/D converter circuit 21 is monolithically formed will be described.

Figure 2:
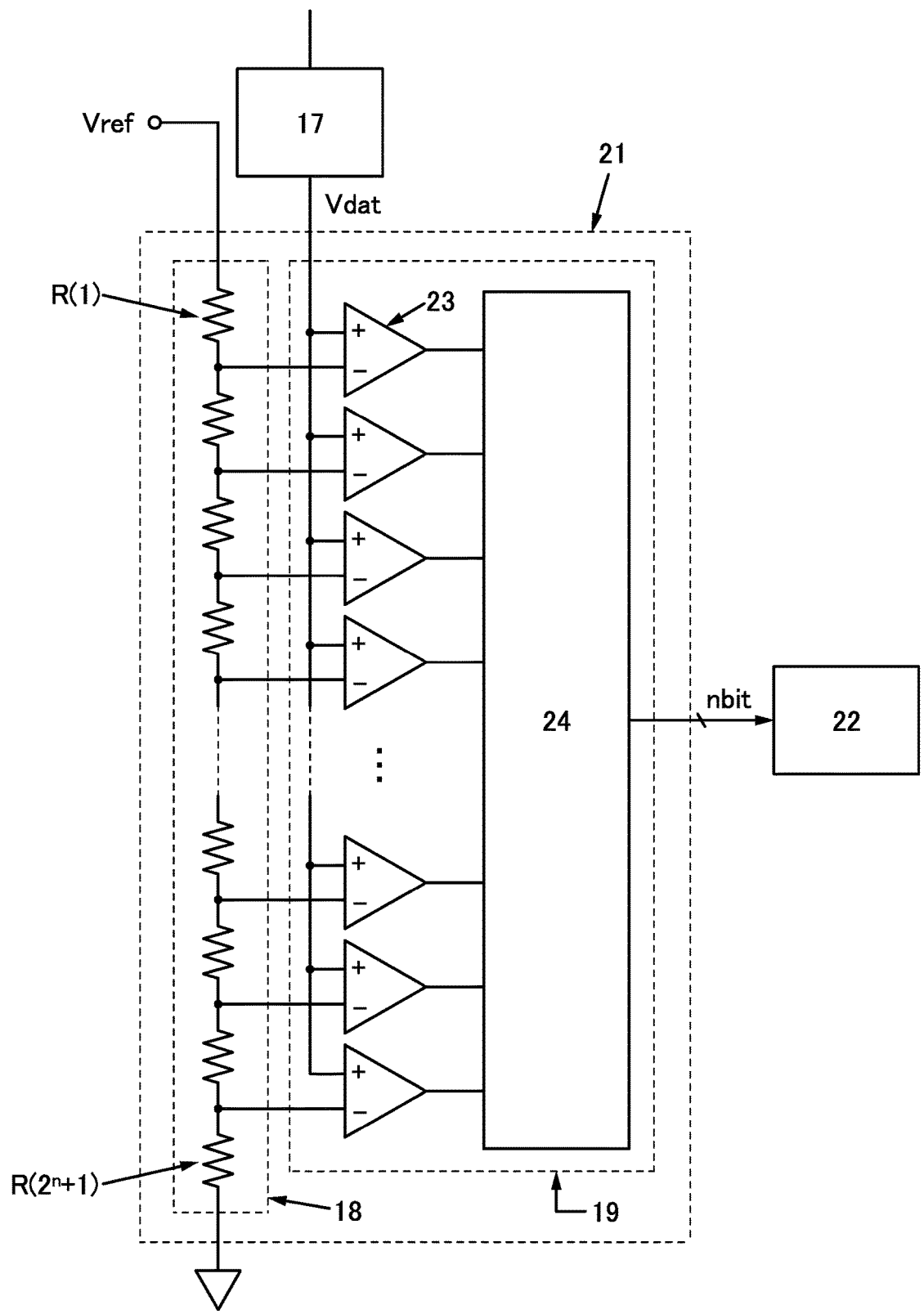
FIG. 2 illustrates an A/D converter circuit.

FIG. 2 illustrates a conventional example of a flash-type A/D converter circuit that can be used as the A/D converter circuit 21.

The A/D converter circuit 21 includes a circuit 18 that corresponds to a voltage generation circuit and a circuit 19 that includes a comparator 23 and an encoder 24 and outputs 2-bit data in parallel. The circuit 19 can compare, with use of the comparator 23, data output from the CDS circuit 17 ($V_{dat}$) and a voltage obtained by dividing a reference voltage ($V_{ref}$) in the circuit 18 and output nbit (n corresponds to the number of gray levels) digital data to the circuit 22 in accordance with the output of the comparator.

Here, the circuit 18 illustrated in FIG. 2 is a resistor string (a resistive divider circuit) including resistor elements, a resistor R(1) to a resistor R($2^n$+1), connected in series. The number of included resistor elements corresponds to gray levels. Here, the number of resistor elements is 257 and 1025 in the cases of an 8-bit gray level and a 10-bit gray level, respectively.

In consideration of high-speed operation, the number of the A/D converter circuits 21 each including the circuit 18 needs to be the number of columns of the pixel array 13 at the maximum. That is, when the circuits 18 are provided in the IC chip, the area occupied by the circuits 18 is extremely large. Meanwhile, when the circuits 18 can be provided outside the IC chip, the area of the IC chip can be reduced, leading to a reduction in the price of the IC chip. In other words, the manufacturing cost of the display device can be reduced.

In view of this, in one embodiment of the present invention, the circuit 18 is monolithically formed over the substrate over which the pixel circuit is formed. Note that the CDS circuit 17 can also be monolithically formed.

Figure 3:
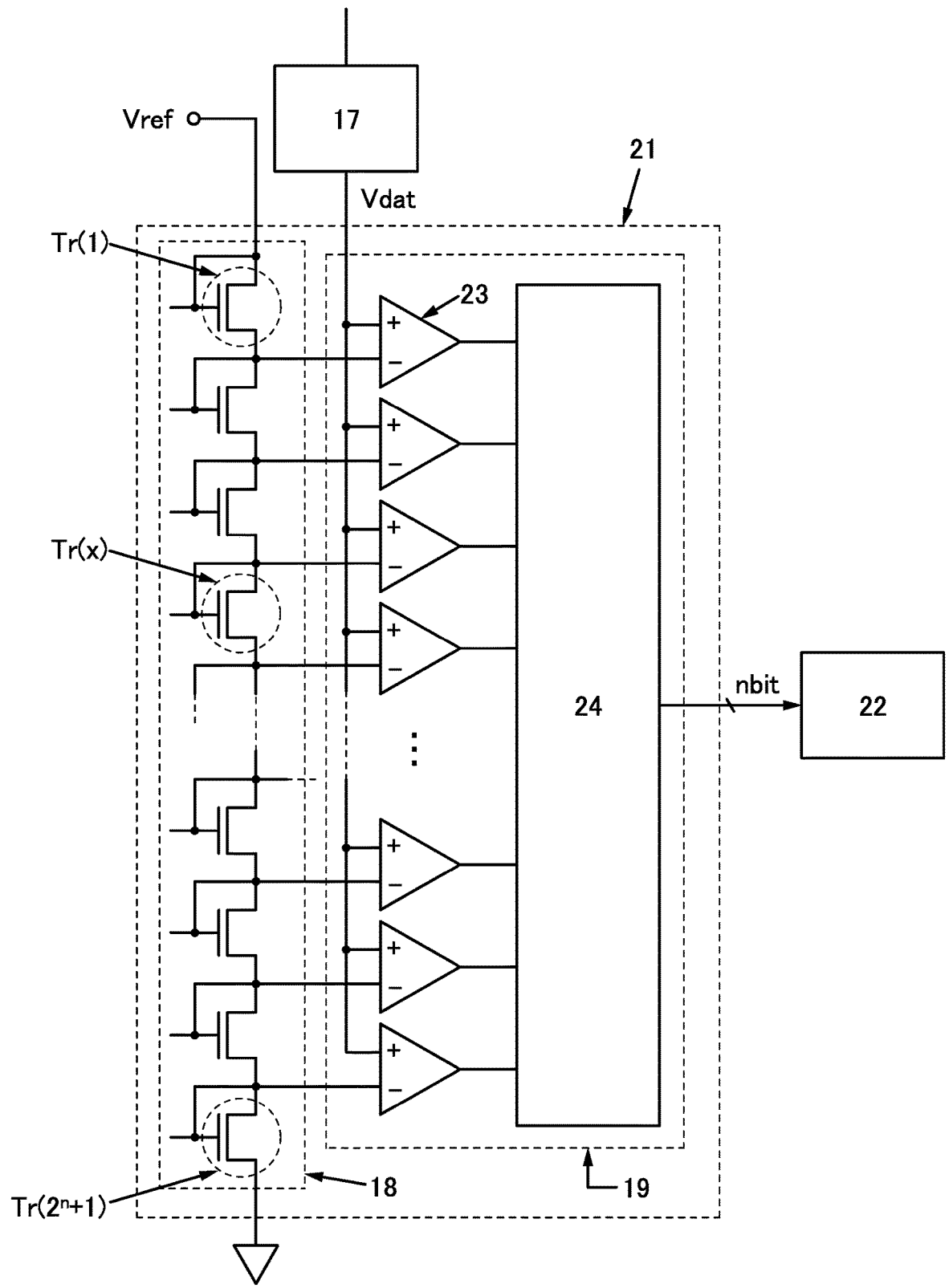
FIG. 3 illustrates an A/D converter circuit.

FIG. 3 illustrates the A/D converter circuit 21 of one embodiment of the present invention. The circuit 18 can be monolithically formed using a thin-film semiconductor or the like as a resistor element; however, it is difficult to form an extremely large number of resistor elements with a uniform resistance value. Moreover, in the case where the resistance of a thin-film semiconductor cannot be sufficiently reduced, the circuit 18 occupies a large area.

Thus, in one embodiment of the present invention, a diode-connected transistor whose drain and gate are electrically connected to each other is used instead of a resistor element. As such a transistor, a vertical n-type transistor is used.

A vertical transistor refers to a transistor where a channel formation region is provided in a semiconductor layer formed along a side surface of an insulating layer and the channel length can be determined depending on the thickness of the insulating layer. The size of a vertical transistor can be small because one of a source electrode and a drain electrode can overlap with a gate electrode, leading to a reduction in the area of the resistor string.

For a semiconductor layer of a vertical transistor, polycrystalline silicon, amorphous silicon, a metal oxide, or the like can be used. A metal oxide that requires no crystallization step or the like is particularly preferable. In this embodiment, a vertical transistor including a metal oxide in a semiconductor layer is used.

There is no particular limitation on the structure of a transistor that can be used for the circuit 18. For example, a planar transistor, a fin-type transistor, a staggered transistor, or an inverted staggered transistor can be used. Either a top-gate transistor or a bottom-gate transistor can be used.

In a diode-connected n-type transistor, when a voltage higher than or equal to the threshold voltage ($V_{th}$) is applied to a gate, a current proportional to voltages (a drain voltage and a gate voltage) flows. Thus, the transistor can be used as a resistor.

In order to operate transistors (Tr(1) to Tr($2^n$+1)) as desired resistors in the structure of the circuit 18 illustrated in FIG. 3, the structures, constituent materials, and the like of the transistors are selected as appropriate so that the transistors have appropriate mobilities, threshold voltages, on-state currents, and the like.

Figure 4:
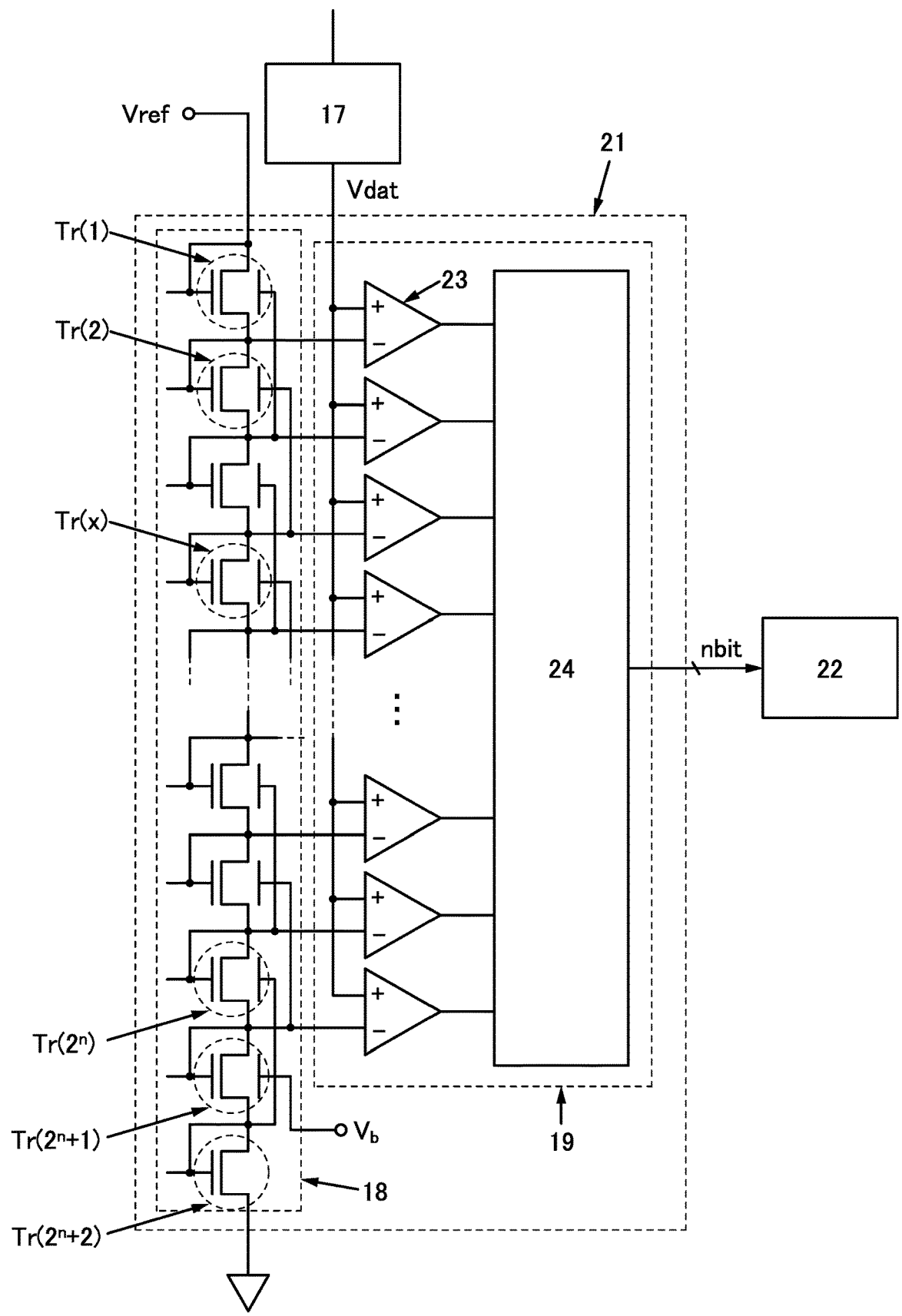
FIG. 4 illustrates an A/D converter circuit.

To have desired resistance values, the transistors (Tr(1) to Tr($2^n$+1)) may have back gates as illustrated in FIG. 4. On the assumption that the source potential of each transistor is 0 V, a potential lower than the source potential, i.e., a negative potential is applied to the back gate of the transistor.

The term "back gate" refers to one of gates in a transistor including two gates whereas the term "front gate" refers to the other gate. Moreover, the term "front gate" and the term "back gate" may be reversibly used between two gates. Furthermore, one of a front gate and a back gate may be referred to as a "first gate" and the other of the front gate and the back gate may be referred to as a "second gate".

In order to apply a negative potential to the back gate, a source of the transistor Tr(2) is electrically connected to the back gate of the transistor Tr(1) as illustrated in FIG. 4, for example. In the case of employing such a structure, a negative potential generation circuit can be omitted.

Figure 5A:
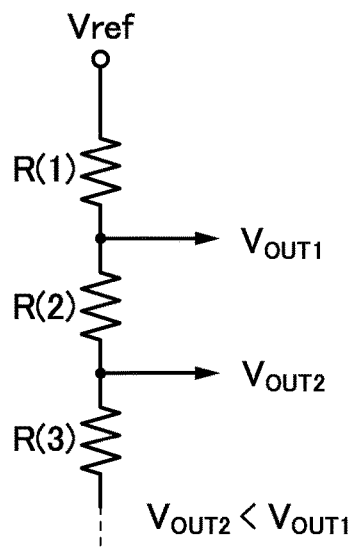
FIG. 5A illustrates a resistive divider circuit.

As illustrated in FIG. 5A, in the resistive divider circuit, a voltage between the resistor R(2) and the resistor R(3) ($V_{OUT2}$) is lower than a voltage between the resistor R(1) and the resistor R(2) ($V_{OUT1}$).

Figure 5B:
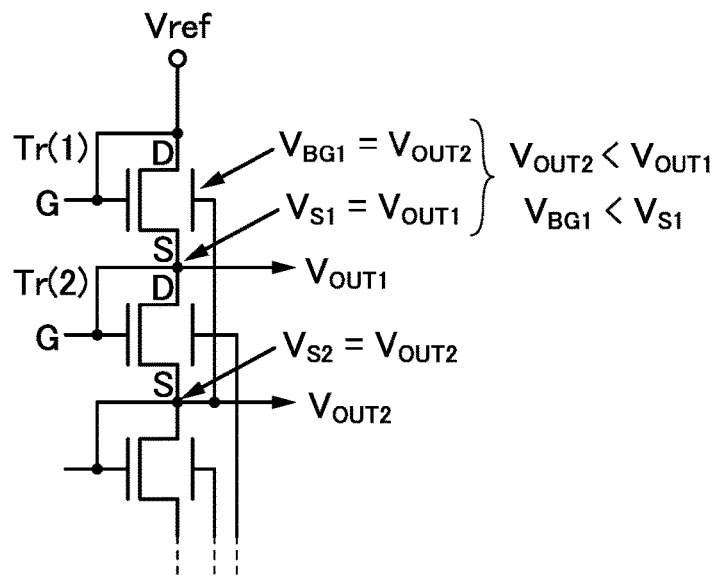
FIG. 5B illustrates a potential supplied to a back gate of a transistor.

Here, when the resistors are replaced with the transistors as illustrated in FIG. 5B, $V_{OUT1}$ and $V_{OUT2}$ correspond to the source potential of the transistor Tr(1) ($V_{S1}$) and the source potential of the transistor Tr(2) ($V_{S2}$), respectively.

According to FIGS. 5A and 5B, $V_{OUT2}<V_{OUT1}$ and the source potential of the transistor Tr(2) ($V_{OUT2}$)=the back gate potential of the transistor Tr(1) ($V_{BG1}$); thus, $V_{BG1}<V_{S1}$. In other words, the back gate potential of the transistor Tr(1) ($V_{BG1}$) is negative with respect to the source potential ($V_{S1}$).

Figure 5C:
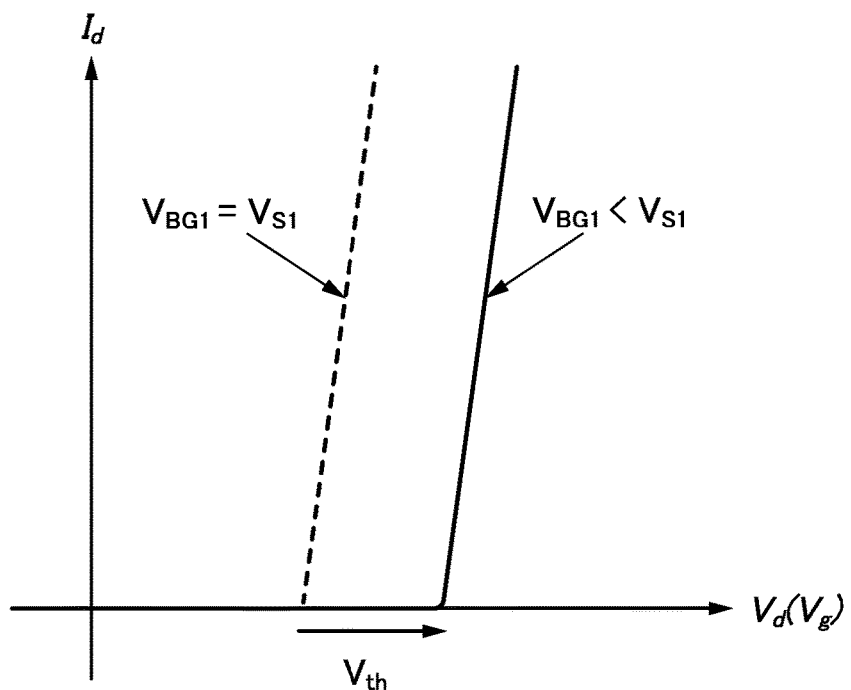
FIG. 5C illustrates a shift of the threshold voltage of the transistor.

When a negative potential is applied to a back gate of a diode-connected n-type transistor, application of a high voltage to a gate is necessary for generation of a channel. In other words, the threshold voltage ($V_{th}$) shifts in the positive direction. Accordingly, as shown in the $I_d$-$V_d$ ($V_g$) characteristics in FIG. 5C, $V_{th}$ of the transistor Tr(1) is higher in the case where $V_{BG1}<V_{S1}$ than the case where $V_{BG1}=V_{S1}$. An increase in $V_{th}$ means an increase in a resistance value.

In a manner similar to the back gate of the transistor Tr(1) connected to the source of the transistor Tr(2), the back gate of the transistor Tr($2^n$) is connected to a source of the transistor Tr($2^n$+1).

Here, in order to make the resistance of the transistor Tr($2^n$+1) equal to those of the other transistors, it is necessary to provide a transistor in a next stage for generating a potential to be applied to the back gate of the transistor Tr($2^n$+1). However, it is not appropriate to provide a larger number of transistors than necessary for gray level control. Therefore, an appropriate potential $V_b$ is preferably input from the outside to the back gate of the transistor Tr($2^n$+1).

Note that a transistor Tr($2^n$+2) in FIG. 4 is a resistor not contributing to a gray level and thus does not require a back gate, but may have a back gate. In this case, as in the transistor Tr($2^n$+1), an appropriate potential is input from the outside to the back gate of the transistor Tr($2^n$+2).

Figure 6A:
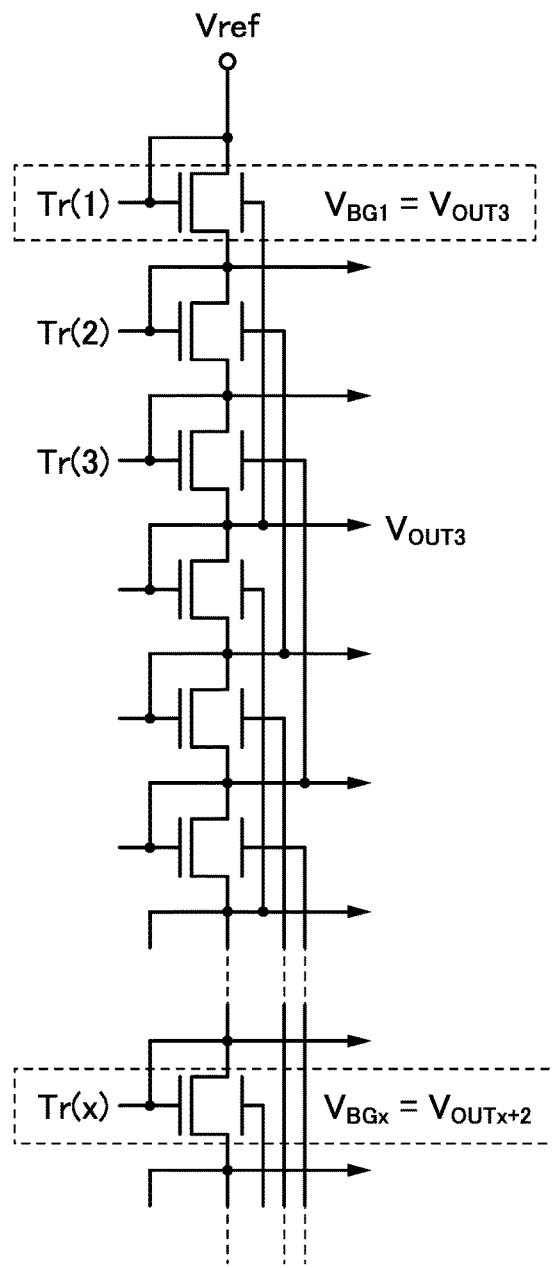
FIGS. 6A and 6B each illustrate a resistive divider circuit.

Although FIG. 4 illustrates the circuit 18 in which the back gate of the transistor Tr(1) is connected to the source of the transistor Tr(2), the present invention is not limited thereto. For example, as illustrated in FIG. 6A, the back gate of the transistor Tr(1) may be connected to a source of the transistor Tr(3). At this time, the back gate potential of the transistor Tr(1) ($V_{BG1}$) is equal to $V_{OUT3}$, which is the source potential of the transistor Tr(3).

Note that in FIG. 6A, when the source potential and the back gate potential of an x-th transistor Tr(x) connected in series to the transistors are $V_{OUTx}$ and $V_{BGx}$, respectively, $V_{BGx}=V_{OUTx+2}$. Alternatively, when $V_{BGx}=V_{OUTx+y}$, y may be greater than or equal to 3. The value of y can be appropriately set to a value less than one to fourth, preferably one to eighth, further preferably one to sixteenth, still further preferably one to thirty-second of the number of gray levels so that the transistor functions as an appropriate resistor.

Figure 6B:
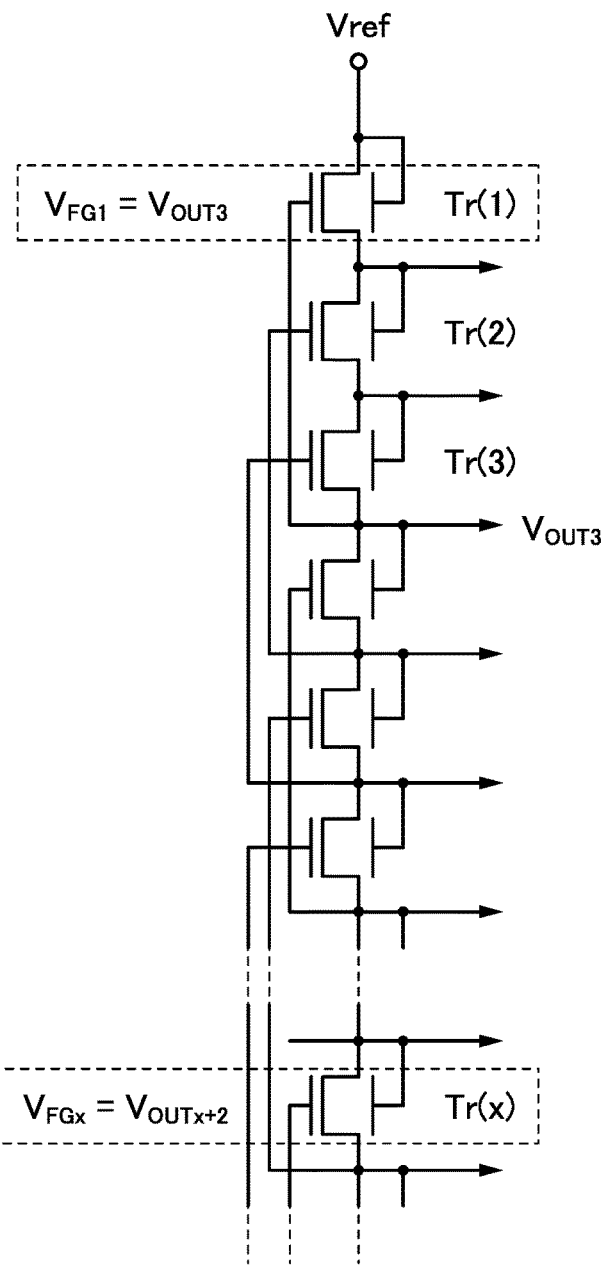

Although a diode-connected transistor whose front gate and drain are electrically connected to each other is exemplified in the above, a diode-connected transistor whose back gate and drain are electrically connected to each other may also be used. FIG. 6B illustrates an example where the back gate and drain of the transistor are electrically connected to each other.

Note that in FIG. 6B illustrating a structure similar to that in FIG. 6A, when the source potential and the front gate potential of the x-th transistor Tr(x) connected in series to the transistors are $V_{OUTx}$ and $V_{FGx}$, respectively, $V_{FGx}=V_{OUTx+2}$.

In the display device manufactured with use of one embodiment of the present invention described above, a circuit corresponding to the second circuit can be omitted from the IC chip, so that the IC chip can be downsized. Thus, the price of the IC chip can be reduced and the manufacturing cost can be reduced. Furthermore, the area where the IC chip is mounted can be small, so that the display device can have a narrow bezel.

At least part of this embodiment can be implemented in combination with any of the other embodiments described in this specification, as appropriate.

Embodiment 2

In this embodiment, a vertical transistor that can be used for the circuit 18 shown in Embodiment 1 is described. Note that a basic structure and the like of the vertical transistor will be described in this embodiment and structures of diode connection and electrical connection between transistors will be described in Embodiment 3.

Figure 7A:
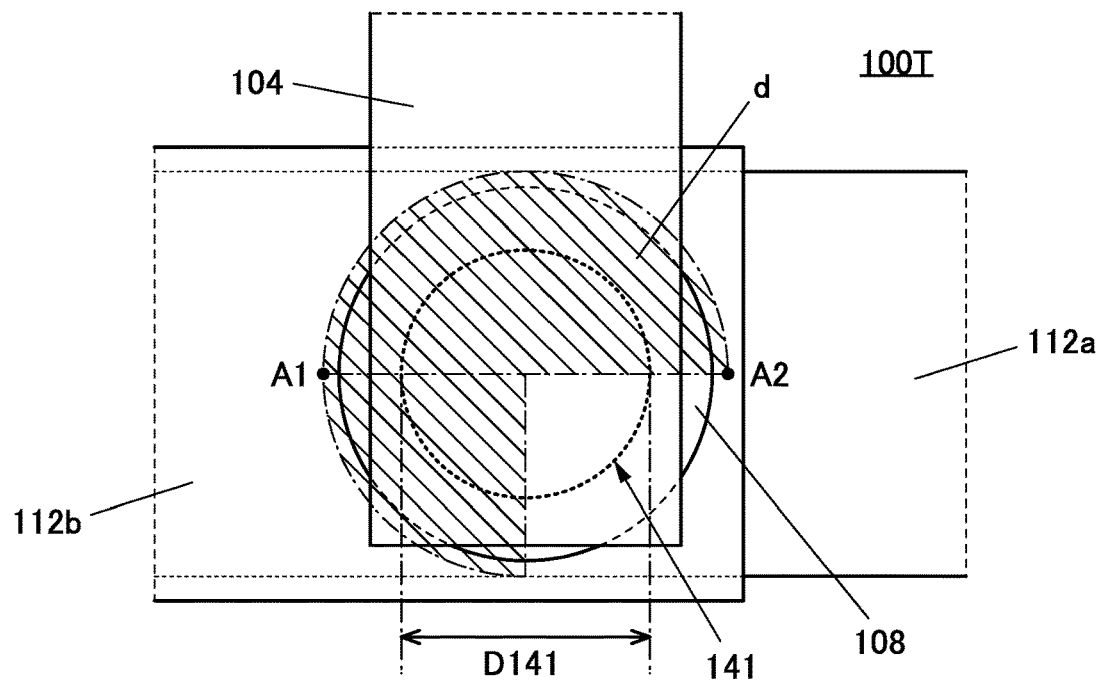
FIGS. 7A and 7B illustrate a vertical transistor.
Figure 7B:
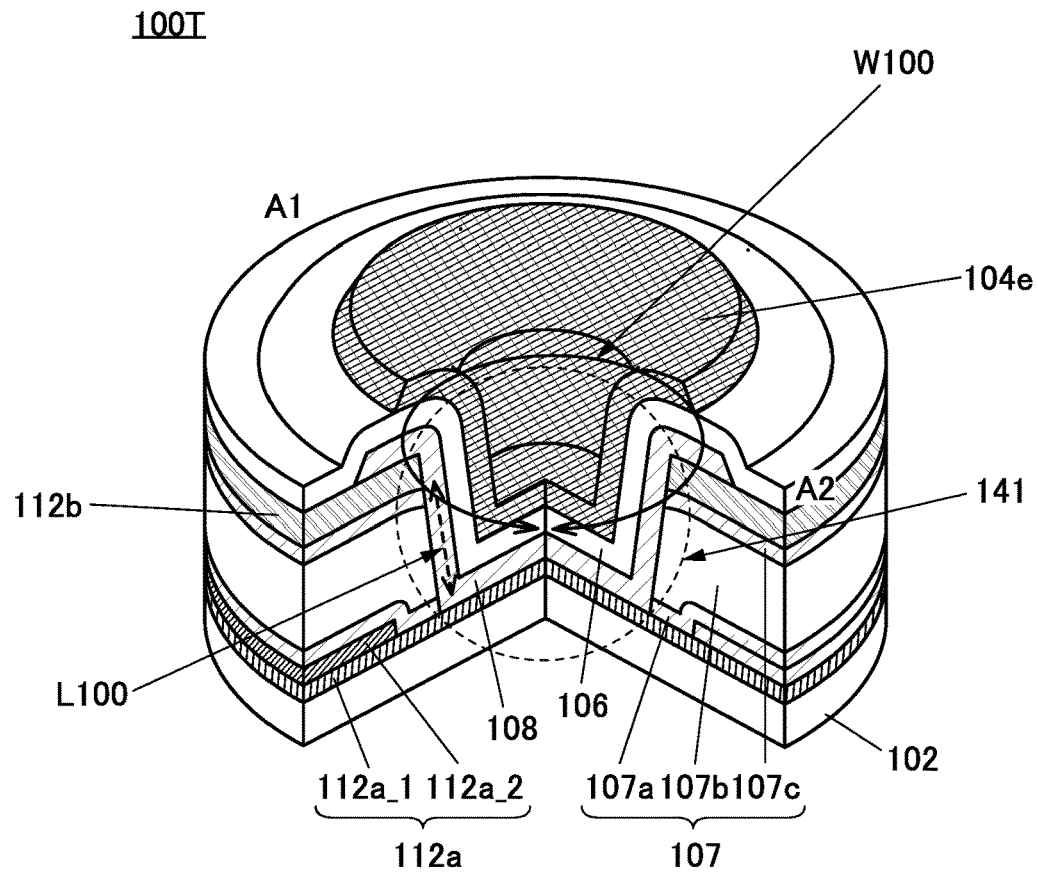

FIGS. 7A and 7B illustrate a vertical transistor. FIG. 7A is a top view. FIG. 7B is a cross-sectional perspective view in the depth direction of a region d hatched in FIG. 7A. Note that for simplification, some components are not illustrated in FIGS. 7A and 7B.

A vertical transistor 100T can be provided over a substrate 102. The transistor 100T includes a conductive layer 104, a conductive layer 104e, an insulating layer 106, a semiconductor layer 108, a conductive layer 112a, and a conductive layer 112b. The conductive layer 104 is a gate wiring electrically connected to the conductive layer 104e functioning as a gate electrode. Part of the insulating layer 106 functions as a gate insulating layer. The conductive layer 112a functions as one of a source electrode and a drain electrode. The conductive layer 112b functions as the other of the source electrode and the drain electrode.

In the semiconductor layer 108, the whole region that is between the source electrode and the drain electrode and overlaps with the gate electrode with the gate insulating layer therebetween functions as a channel formation region. In the semiconductor layer 108, a region in contact with the source electrode functions as a source region and a region in contact with the drain electrode functions as a drain region.

The conductive layer 112a is provided over the substrate 102, an insulating layer 107 is provided over the conductive layer 112a, and the conductive layer 112b is provided over the insulating layer 107. The insulating layer 107 can include, for example, an insulating layer 107a, an insulating layer 107b, and an insulating layer 107c and includes a region interposed between the conductive layer 112a and the conductive layer 112b. The conductive layer 112a has a region overlapping with the conductive layer 112b with the insulating layer 107 therebetween. An opening 141 reaching the conductive layer 112a is provided in the insulating layer 107 and the conductive layer 112b.

The conductive layers 112a and 112b may each have a stacked-layer structure. FIG. 7B and the like illustrate an example where the conductive layer 112a has a stacked-layer structure of a conductive layer 112a_1 and a conductive layer 112a_2. Although FIG. 7B illustrates an example where the conductive layer 112a_1 includes a region over which the conductive layer 112a_2 is not provided and the region is in contact with the semiconductor layer 108, the conductive layer 112a_2 may be in contact with the semiconductor layer 108. Alternatively, the conductive layer 112a_2 may be omitted.

The top surface shape of the opening 141 can be circular or elliptic, for example. High processing accuracy to form the opening 141 in a minute size is possible when the top surface of the opening 141 has a circular shape. Examples of the top surface shape of the opening 141 include polygons such as a triangle, a tetragon (including a rectangle, a rhombus, and a square), and a pentagon; and polygons with rounded corners. The opening 141 can be formed using a resist mask, for example.

The semiconductor layer 108 is provided to cover an inner wall and a bottom portion of the opening 141. The semiconductor layer 108 includes a region in contact with top and side surfaces of the conductive layer 112b, a side surface of the insulating layer 107, and a top surface of the conductive layer 112a. The semiconductor layer 108 is electrically connected to the conductive layer 112a through the opening 141. The semiconductor layer 108 has a shape along the shapes of the top and side surfaces of the conductive layer 112b, the side surface of the insulating layer 107, and the top surface of the conductive layer 112a.

Although the semiconductor layer 108 has a single-layer structure in FIG. 7B and the like, one embodiment of the present invention is not limited thereto. The semiconductor layer 108 may have a stacked-layer structure of two or more layers.

The insulating layer 106 functioning as the gate insulating layer of the transistor 100T is provided over the semiconductor layer 108, the conductive layer 112b, and the insulating layer 107 to cover a depressed portion formed by the opening 141.

The conductive layer 104e of the transistor 100T is provided over the insulating layer 106 to cover the depressed portion formed by the opening 141. Here, an insulating layer (not illustrated) is preferably provided over the conductive layer 104e and the insulating layer 106. An opening reaching the conductive layer 104e is formed in the insulating layer and the conductive layer 104 functioning as a gate wiring is electrically connected to the conductive layer 104e in the opening.

In the opening 141, the conductive layer 104e includes a region overlapping with the semiconductor layer 108 with the insulating layer 106 therebetween. The conductive layer 104e also includes a region overlapping with the conductive layers 112a and 112b with the insulating layer 106 and the semiconductor layer 108 therebetween. The conductive layer 104e preferably covers an end portion of the conductive layer 112b on the opening 141 side. With such a structure, in the semiconductor layer 108, the whole region that is between the source electrode and the drain electrode and overlaps with the gate electrode with the gate insulating layer therebetween can function as a channel formation region.

The transistor 100T is a so-called top-gate transistor, in which the gate electrode is provided above the semiconductor layer 108. Furthermore, since a bottom surface of the semiconductor layer 108 is in contact with the source electrode or the drain electrode, the transistor 100T can be referred to as a top-gate bottom-contact (TGBC) transistor.

The conductive layers 112a, 112b, and 104 can function as wirings and the transistor 100T can be provided in a region where these wirings overlap with each other. That is, the areas occupied by the transistor 100T and the wirings can be reduced in the circuit including the transistor 100T and the wirings. Therefore, the area occupied by the circuit can be reduced.

In the transistor of one embodiment of the present invention, the conductive layers 112a, 112b, and 104 functioning as wirings can be provided by processing different conductive films. Thus, any one of the conductive layers can be arranged to overlap with at least one of the other conductive layers, leading to high layout flexibility and a reduction in the area occupied by the circuit.

Next, the channel length and the channel width of the transistor 100T will be described. In the semiconductor layer 108, a region in contact with the conductive layer 112a functions as one of a source region and a drain region, a region in contact with the conductive layer 112b functions as the other of the source region and the drain region, and a region between the source region and the drain region functions as a channel formation region.

The channel length of the transistor 100T is a distance between the source region and the drain region. In FIG. 7B, a channel length L100 of the transistor 100T is indicated by a dashed double-headed arrow. In a cross-sectional view, the channel length L100 is a distance between an end portion of the region where the semiconductor layer 108 is in contact with the conductive layer 112a and an end portion of the region where the semiconductor layer 108 is in contact with the conductive layer 112b.

That is, the channel length L100 is determined depending on the thickness of the insulating layer 107 and an angle formed between a side surface of the insulating layer 107 on the opening 141 side and the top surface of the conductive layer 112a, and is not affected by the performance of a light-exposure apparatus used for manufacturing the transistor. Thus, the channel length L100 can be a smaller value than the resolution limit of the light-exposure apparatus and thus the transistor can be miniaturized.

The transistor 100T with a short channel length L100 can have a high on-state current. With use of the transistor 100T, a circuit capable of high-speed operation can be manufactured. Furthermore, the transistor can be downsized, which enables a reduction in the area occupied by the circuit.

Although FIG. 7B and the like illustrate a structure in which the side surface of the insulating layer 107 on the opening 141 side is linear in a cross-sectional view, one embodiment of the present invention is not limited thereto. In a cross-sectional view, the side surface of the insulating layer 107 on the opening 141 side may be curved or include both a linear region and a curved region.

The channel width of the transistor 100T is the width of the source region or the drain region in a direction perpendicular to the channel length direction. In other words, the channel width is the width of the region where the semiconductor layer 108 is in contact with the conductive layer 112a or the width of the region where the semiconductor layer 108 is in contact with the conductive layer 112b in the direction perpendicular to the channel length direction. Here, the channel width of the transistor 100T is described as the width of the region where the semiconductor layer 108 is in contact with the conductive layer 112b in the direction perpendicular to the channel length direction. In FIG. 7B, a channel width W100 of the transistor 100T is indicated by a solid double-headed arrow. In a top view, the channel width W100 is the length of an end portion of a bottom surface of the conductive layer 112b on the opening 141 side.

The channel width W100 is determined depending on the top surface shape of the opening 141. Assuming that the top surface shape of the opening 141 is circular, the diameter of the opening 141 is D141, and the thickness of the conductive layer 112b is negligible, the channel width W100 can be calculated to be "D141×π".

In other words, it can be said that the transistor 100T has a large channel width with respect to its occupation area. The transistor 100T with a large channel width W100 can have a high on-state current and thus a circuit capable of high-speed operation can be manufactured.

Figure 8A:
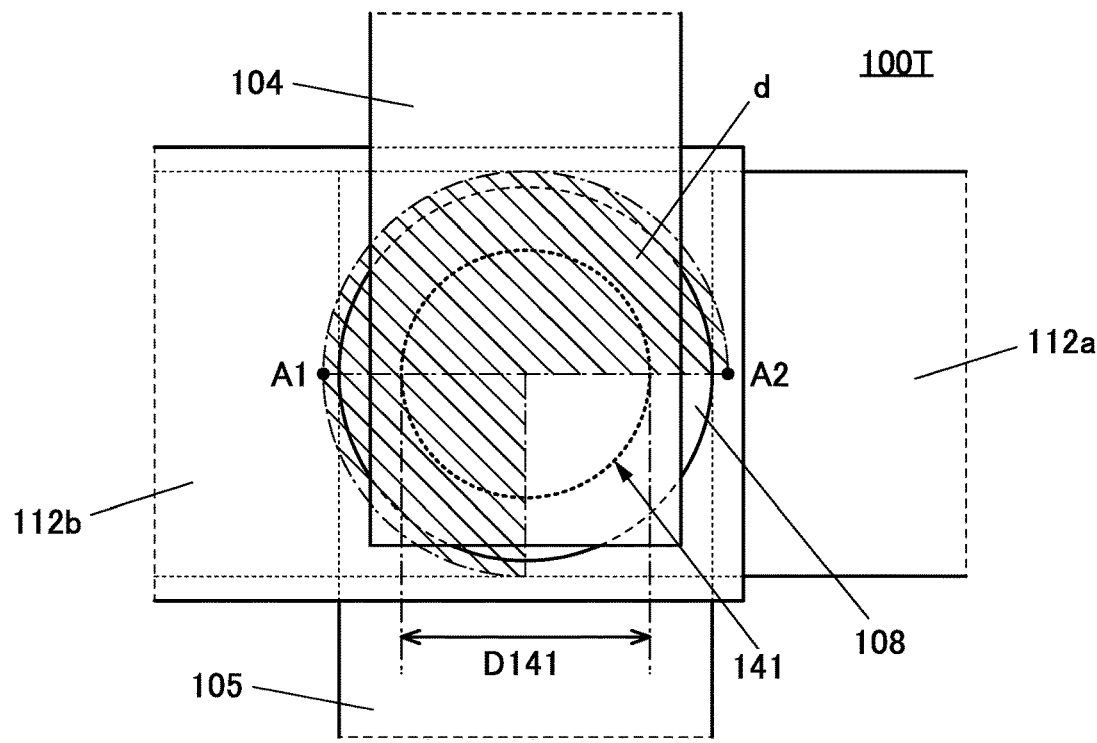
FIGS. 8A and 8B illustrate a vertical transistor.
Figure 8B:
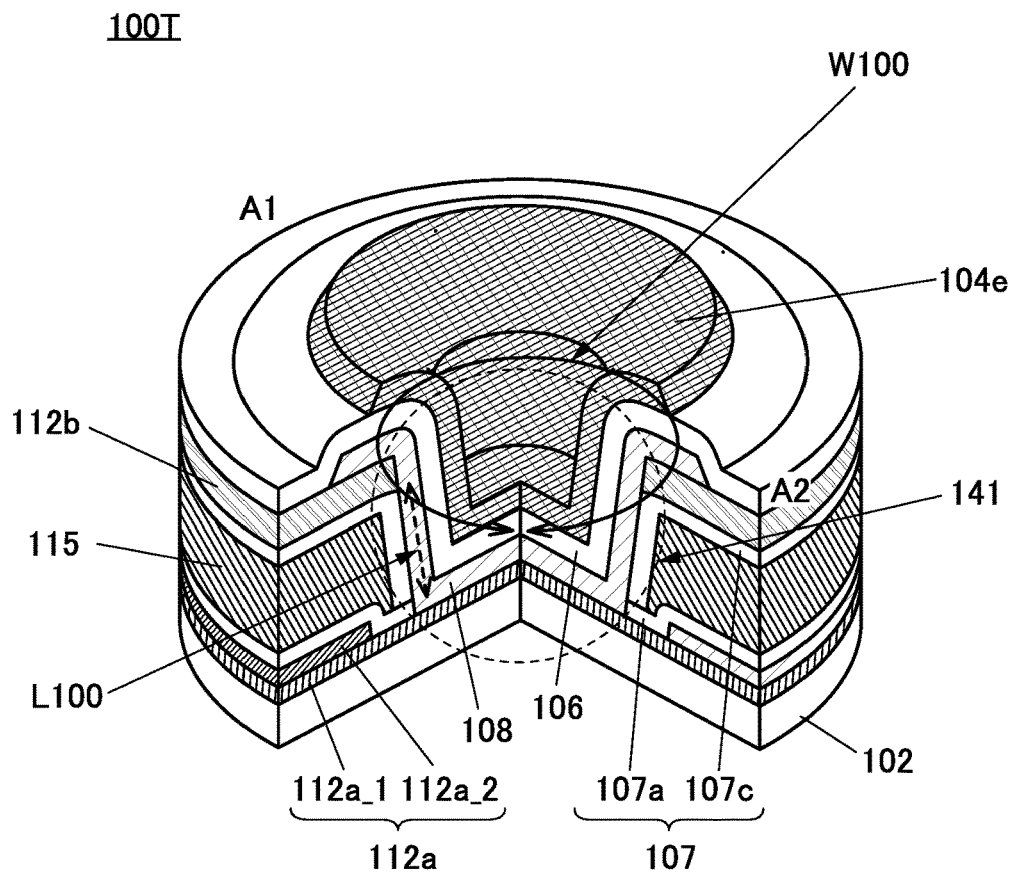

FIGS. 8A and 8B illustrate an example where a back gate is added to the structure in FIGS. 7A and 7B. A conductive layer 115 functioning as a back gate electrode is provided to be embedded in the insulating layer 107 (the insulating layers 107a and 107c) and part of the insulating layer 107c provided between the semiconductor layer 108 and the conductive layer 115 functions as a gate insulating layer. Note that an insulating layer different from the insulating layer 107c may be used as a gate insulating layer.

Hereinafter, the components included in the transistor 100T of this embodiment are described.
<Components of Transistor>
[Semiconductor Layer 108]

The semiconductor material that can be used for the semiconductor layer 108 is not particularly limited. For example, a single-element semiconductor or a compound semiconductor can be used. As the single-element semiconductor, silicon or germanium can be used, for example. Examples of the compound semiconductor include gallium arsenide and silicon germanium. As the compound semiconductor, an organic substance having semiconductor characteristics or a metal oxide having semiconductor characteristics (also referred to as an oxide semiconductor) can be used. These semiconductor materials may contain impurities as dopants.

There is no particular limitation on the crystallinity of a semiconductor material used for the semiconductor layer 108, and an amorphous semiconductor or a semiconductor having crystallinity (a single-crystal semiconductor, a polycrystalline semiconductor, a microcrystalline semiconductor, or a semiconductor partly including crystal regions) may be used. It is preferable that a semiconductor having crystallinity be used, in which case deterioration of the transistor characteristics can be inhibited.

The semiconductor layer 108 preferably includes a metal oxide (an oxide semiconductor). Examples of the metal oxide that can be used for the semiconductor layer 108 include indium oxide, gallium oxide, and zinc oxide. The metal oxide preferably contains at least indium (In) or zinc (Zn). The metal oxide preferably contains two or three kinds selected from indium, an element M, and zinc. The element M is one or more kinds selected from gallium, aluminum, silicon, boron, yttrium, tin, antimony, copper, vanadium, beryllium, titanium, iron, nickel, germanium, zirconium, molybdenum, lanthanum, cerium, neodymium, hafnium, tantalum, tungsten, cobalt, and magnesium. Specifically, the element M is preferably one or more kinds selected from aluminum, gallium, yttrium, and tin. The element M is further preferably gallium.

For the semiconductor layer 108, indium oxide, indium gallium oxide (In—Ga oxide), indium zinc oxide (In—Zn oxide), indium tin oxide (In—Sn oxide), indium titanium oxide (In—Ti oxide), gallium zinc oxide (Ga—Zn oxide), indium aluminum zinc oxide (In—Al—Zn oxide, also referred to as IAZO), indium tin zinc oxide (In—Sn—Zn oxide), indium titanium zinc oxide (In—Ti—Zn oxide), indium gallium zinc oxide (In—Ga—Zn oxide, also referred to as IGZO), indium gallium tin zinc oxide (In—Ga—Sn—Zn oxide, also referred to as IGZTO), or indium gallium aluminum zinc oxide (In—Ga—Al—Zn oxide, also referred to as IGAZO or IAGZO) can be used, for example. Alternatively, indium tin oxide containing silicon can be used, for example.

Here, the composition of the metal oxide included in the semiconductor layer 108 greatly affects the electrical characteristics and reliability of the transistor 100T. By increasing the proportion of the number of indium atoms to the sum of the number of atoms of all metal elements in the metal oxide, a transistor having a high on-state current can be provided.

In the case where In—Zn oxide is used for the semiconductor layer 108, it is preferable to use a metal oxide in which the proportion of indium atoms is higher than or equal to that of zinc atoms. For example, it is possible to use a metal oxide film in which the atomic ratio of metal elements is In:Zn=1:1, In:Zn=2:1, In:Zn=3:1, In:Zn=4:1, In:Zn=5:1, In:Zn=7:1, or In:Zn=10:1, or in the neighborhood thereof.

In the case where In—Sn oxide is used for the semiconductor layer 108, it is preferable to use a metal oxide in which the proportion of indium atoms is higher than or equal to that of Sn atoms. For example, it is possible to use a metal oxide in which the atomic ratio of metal elements is In:Sn=1:1, In:Sn=2:1, In:Sn=3:1, In:Sn=4:1, In:Sn=5:1, In:Sn=7:1, or In:Sn=10:1, or in the neighborhood thereof.

In the case where In—Sn—Zn oxide is used for the semiconductor layer 108, it is possible to use a metal oxide in which the proportion of indium atoms is higher than that of Sn atoms. Moreover, it is preferable to use a metal oxide in which the proportion of zinc atoms is higher than that of Sn atoms. For example, it is possible to use a metal oxide in which the atomic ratio of metal elements is In:Sn:Zn=2:1:3, In:Sn:Zn=3:1:2, In:Sn:Zn=4:2:3, In:Sn:Zn=4:2:4.1, In:Sn:Zn=5:1:3, In:Sn:Zn=5:1:6, In:Sn:Zn=5:1:7, In:Sn:Zn=5:1:8, In:Sn:Zn=6:1:6, In:Sn:Zn=10:1:3, In:Sn:Zn=10:1:6, In:Sn:Zn=10:1:7, In:Sn:Zn=10:1:8, In:Sn:Zn=5:2:5, In:Sn:Zn=10:1:10, In:Sn:Zn=20:1:10, or In:Sn:Zn=40:1:10, or in the neighborhood thereof.

In the case where In—Al—Zn oxide is used for the semiconductor layer 108, it is possible to use a metal oxide in which the proportion of indium atoms is higher than that of Al atoms. Moreover, it is preferable to use a metal oxide in which the proportion of zinc atoms is higher than that of Al atoms. For example, it is possible to use a metal oxide in which the atomic ratio of metal elements is In:Al:Zn=2:1:3, In:Al:Zn=3:1:2, In:Al:Zn=4:2:3, In:Al:Zn=4:2:4.1, In:Al:Zn=5:1:3, In:Al:Zn=5:1:6, In:Al:Zn=5:1:7, In:Al:Zn=5:1:8, In:Al:Zn=6:1:6, In:Al:Zn=10:1:3, In:Al:Zn=10:1:6, In:Al:Zn=10:1:7, In:Al:Zn=10:1:8, In:Al:Zn=5:2:5, In:Al:Zn=10:1:10, In:Al:Zn=20:1:10, or In:Al:Zn=40:1:10, or in the neighborhood thereof.

In the case where In—Ga—Zn oxide is used for the semiconductor layer 108, it is possible to use a metal oxide film in which the proportion of indium atoms to the sum of the number of atoms of all metal elements contained in the In—Ga—Zn oxide is higher than that of gallium atoms. It is further preferable to use a metal oxide in which the proportion of zinc atoms is higher than that of gallium atoms. For example, for the semiconductor layer 108, it is possible to use a metal oxide in which the atomic ratio of metal elements is In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, or In:Ga:Zn=40:1:10, or in the neighborhood thereof.

In the case where In-M-Zn oxide is used for the semiconductor layer 108, it is possible to use a metal oxide film in which the proportion of indium atoms to the sum of the number of atoms of all metal elements contained in the In-M-Zn oxide is higher than that of atoms of the element M. It is further preferable to use a metal oxide in which the proportion of zinc atoms is higher than that of atoms of the element M. For example, for the semiconductor layer 108, it is possible to use a metal oxide in which the atomic ratio of metal elements is In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=10:1:3, In:M:Zn=10:1:6, In:M:Zn=10:1:7, In:M:Zn=10:1:8, In:M:Zn=5:2:5, In:M:Zn=10:1:10, In:M:Zn=20:1:10, or In:M:Zn=40:1:10, or in the neighborhood thereof.

A transistor including a metal oxide with a higher content of indium can have a high on-state current. By using such a transistor as a transistor required to have a high on-state current, a circuit having excellent electrical characteristics can be formed.

Analysis of the composition of a metal oxide can be performed by energy dispersive X-ray spectrometry (EDX), X-ray photoelectron spectrometry (XPS), inductively coupled plasma-mass spectrometry (ICP-MS), inductively coupled plasma-atomic emission spectrometry (ICP-AES), or the like. Alternatively, these methods may be combined as appropriate to be employed for analysis. Note that as for an element whose content is low, the actual content may be different from the content obtained by analysis because of the influence of the analysis accuracy. In the case where the content of the element M is low, for example, the content of the element M obtained by analysis may be lower than the actual content.

In this specification and the like, a composition in the neighborhood includes±30% of an intended atomic ratio. For example, in the case of describing an atomic ratio of In:M:Zn=4:2:3 or a composition in the neighborhood thereof, the case is included in which with the atomic proportion of In being 4, the atomic proportion of M is greater than or equal to 1 and less than or equal to 3 and the atomic proportion of Zn is greater than or equal to 2 and less than or equal to 4. In the case of describing an atomic ratio of In:M:Zn=5:1:6 or a composition in the neighborhood thereof, the case is included in which with the atomic proportion of In being 5, the atomic proportion of M is greater than 0.1 and less than or equal to 2 and the atomic proportion of Zn is greater than or equal to 5 and less than or equal to 7. In the case of describing an atomic ratio of In:M:Zn=1:1:1 or a composition in the neighborhood thereof, the case is included in which with the atomic proportion of In being 1, the atomic proportion of M is greater than 0.1 and less than or equal to 2 and the atomic proportion of Zn is greater than 0.1 and less than or equal to 2.

For forming a metal oxide, a sputtering method or an atomic layer deposition (ALD) method can be suitably employed. Note that in the case where the metal oxide is formed by a sputtering method, the atomic ratio in a target may be different from the atomic ratio in the metal oxide. In particular, the atomic ratio of zinc in the metal oxide may be smaller than the atomic ratio of zinc in the target. Specifically, the metal oxide may have an atomic ratio of zinc of 40% to 90% of the atomic ratio of zinc in the target.

The semiconductor layer 108 may have a stacked-layer structure of two or more metal oxide layers. The two or more metal oxide layers included in the semiconductor layer 108 may have the same or substantially the same composition. The same sputtering target can be used for forming the metal oxide layers that have the same composition and are stacked, for example, so that the manufacturing cost can be reduced.

The two or more metal oxide layers included in the semiconductor layer 108 may have different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being formed over the first metal oxide layer can be favorably employed. In particular, gallium or aluminum is preferably used as the element M. Alternatively, a stacked-layer structure of one selected from indium oxide, indium gallium oxide, and IGZO, and one selected from IAZO, IAGZO, and ITZO (registered trademark) may be employed, for example.

It is preferable to use a metal oxide layer having crystallinity as the semiconductor layer 108. For example, a metal oxide layer having a c-axis aligned crystal (CAAC) structure, a polycrystalline structure, a nano-crystal (nc) structure, or the like can be used. By using a metal oxide layer having crystallinity as the semiconductor layer 108, the density of defect states in the semiconductor layer 108 can be reduced, which enables the transistor to have high reliability.

The higher the crystallinity of a metal oxide layer used for the semiconductor layer 108 is, the lower the density of defect states in the semiconductor layer 108 can be. In contrast, the use of a metal oxide layer having low crystallinity enables a transistor to flow a large amount of current.

The semiconductor layer 108 may have a stacked-layer structure of two or more metal oxide layers having different crystallinities. For example, a stacked-layer structure of a first metal oxide layer and a second metal oxide layer over the first metal oxide layer can be employed; the second metal oxide layer can include a region having higher crystallinity than the first metal oxide layer. Alternatively, the second metal oxide layer can include a region having lower crystallinity than the first metal oxide layer. The two or more metal oxide layers included in the semiconductor layer 108 may have the same or substantially the same composition. The same sputtering target can be used for forming the metal oxide layers that have the same composition and are stacked, for example, so that the manufacturing cost can be reduced. For example, with use of the same sputtering target and different oxygen flow rate ratios, a stacked-layer structure of two or more metal oxide layers having different crystallinities can be formed. The two or more metal oxide layers included in the semiconductor layer 108 may have different compositions.

When an oxide semiconductor is used for the semiconductor layer 108, the carrier density of the oxide semiconductor at a channel formation region is preferably lower than or equal to $1\times10^{18}$ cm$^{-3}$, further preferably lower than $1\times10^{17}$ cm$^{-3}$, further preferably lower than $1\times10^{16}$ cm$^{-3}$, further preferably lower than $1\times10^{13}$ cm$^{-3}$, further preferably lower than $1\times10^{12}$ cm$^{-3}$. The minimum carrier density of an oxide semiconductor at a channel formation region is not limited and can be $1\times10^{-9}$ cm$^{-3}$, for example.

A transistor including an oxide semiconductor (hereinafter, an OS transistor) has much higher field-effect mobility than a transistor containing amorphous silicon. In addition, the OS transistor has an extremely low leakage current between a source and a drain in an off state (hereinafter also referred to as off-state current), and electric charge accumulated in a capacitor that is connected in series to the transistor can be held for a long period. Furthermore, the power consumption of the semiconductor device can be reduced with the OS transistor.

[Insulating Layer 107]

In the case where an oxide semiconductor is used for the semiconductor layer 108, an inorganic insulating material can be suitably used for the insulating layer 107 (the insulating layer 107a, the insulating layer 107b, and the insulating layer 107c). Note that the insulating layer 107 may have a stacked-layer structure of an inorganic insulating material and an organic insulating material.

As the inorganic insulating material, one or more of an oxide, an oxynitride, a nitride oxide, and a nitride can be used. For the insulating layer 107, for example, one or more of silicon oxide, silicon oxynitride, aluminum oxide, hafnium oxide, yttrium oxide, zirconium oxide, gallium oxide, tantalum oxide, magnesium oxide, lanthanum oxide, cerium oxide, neodymium oxide, silicon nitride, silicon nitride oxide, and aluminum nitride can be used.

Note that in this specification and the like, oxynitride refers to a material that contains more oxygen than nitrogen. Nitride oxide refers to a material that contains more nitrogen than oxygen. For example, silicon oxynitride refers to a material that contains more oxygen than nitrogen, and silicon nitride oxide refers to a material that contains more nitrogen than oxygen.

It is particularly preferable to use an oxide or an oxynitride for the insulating layer 107b. The insulating layer 107b is preferably formed using a film from which oxygen is released by heating. For example, silicon oxide or silicon oxynitride can be suitably used for the insulating layer 107b.

Oxygen released from the insulating layer 107b can be supplied to the semiconductor layer 108. Supplying oxygen from the insulating layer 107b to the semiconductor layer 108, particularly to the channel formation region of the semiconductor layer 108, can allow the amount of oxygen vacancy ($V_O$) and a defect in which hydrogen enters oxygen vacancy ($V_OH$) to be reduced in the semiconductor layer 108, so that a highly reliable transistor having favorable electrical characteristics can be obtained. The insulating layer 107b preferably has a high oxygen diffusion coefficient. Oxygen is easily diffused in the insulating layer 107b having a high oxygen diffusion coefficient, so that oxygen can be efficiently supplied from the insulating layer 107b to the semiconductor layer 108. Examples of treatment for supplying oxygen to the semiconductor layer 108 include heat treatment in an oxygen-containing atmosphere and plasma treatment in an oxygen-containing atmosphere.

It is preferable that the amount of oxygen vacancy ($V_O$) and $V_OH$ be reduced in the channel formation region of the transistor 100T. Particularly in the case where the channel length L100 is short, oxygen vacancy ($V_O$) and $V_OH$ in the channel formation region greatly affect electrical characteristics and reliability. For example, diffusion of $V_OH$ from the source region or the drain region into the channel formation region increases the carrier concentration in the channel formation region, which might cause a change in the threshold voltage or a reduction in the reliability in the transistor 100T. As the channel length L100 of the transistor 100T is shorter, such diffusion of $V_OH$ greatly affects electrical characteristics and reliability. Supplying oxygen from the insulating layer 107b to the semiconductor layer 108, particularly to the channel formation region of the semiconductor layer 108, can allow the amount of oxygen vacancy ($V_O$) and $V_OH$ to be reduced. Thus, the transistor with a short channel length can have favorable electrical characteristics and high reliability.

The insulating layers 107a and 107c are preferably less likely to transmit oxygen. The insulating layers 107a and 107c function as blocking films that inhibit release of oxygen from the insulating layer 107b. Moreover, the insulating layers 107a and 107c are preferably less likely to transmit hydrogen. The insulating layers 107a and 107c function as blocking films that inhibit diffusion of hydrogen into the semiconductor layer 108 from the outside of the transistor through the insulating layer 107. The insulating layers 107a and 107c preferably have high film densities. The insulating layers 107a and 107c having high film densities can have a high blocking property against oxygen and hydrogen. The film densities of the insulating layers 107a and 107c are preferably higher than that of the insulating layer 107b. In the case where silicon oxide or silicon oxynitride is used for the insulating layer 107b, silicon nitride, silicon nitride oxide, or aluminum oxide can be suitably used for the insulating layers 107a and 107c, for example. The insulating layers 107a and 107c each preferably include a region containing more nitrogen than the insulating layer 107b. A material containing more nitrogen than the insulating layer 107b can be used for the insulating layers 107a and 107c. A nitride or a nitride oxide is preferably used for the insulating layers 107a and 107c. For example, silicon nitride or silicon nitride oxide can be suitably used for the insulating layers 107a and 107c.

When oxygen contained in the insulating layer 107b is diffused upward from a region of the insulating layer 107b that is not in contact with the semiconductor layer 108 (e.g., a top surface of the insulating layer 107b), the amount of oxygen supplied from the insulating layer 107b to the semiconductor layer 108 might be reduced. Provision of the insulating layer 107c over the insulating layer 107b can inhibit diffusion of oxygen contained in the insulating layer 107b from the region of the insulating layer 107 that is not in contact with the semiconductor layer 108. Similarly, provision of the insulating layer 107a under the insulating layer 107b can inhibit downward diffusion of oxygen contained in the insulating layer 107b from the region of the insulating layer 107 that is not in contact with the semiconductor layer 108. Accordingly, the amount of oxygen supplied from the insulating layer 107b to the semiconductor layer 108 is increased, whereby the amount of oxygen vacancy ($V_O$) and $V_OH$ in the semiconductor layer 108 can be reduced. Consequently, the transistor can have favorable electrical characteristics and high reliability.

The conductive layers 112a and 112b are oxidized by oxygen contained in the insulating layer 107b and have high resistance in some cases. Moreover, when the conductive layers 112a and 112b are oxidized by oxygen contained in the insulating layer 107b, the amount of oxygen supplied from the insulating layer 107b to the semiconductor layer 108 might be reduced. Provision of the insulating layer 107a between the insulating layer 107b and the conductive layer 112a can inhibit the conductive layer 112a from being oxidized and having high resistance. Similarly, provision of the insulating layer 107c between the insulating layer 107b and the conductive layer 112b can inhibit the conductive layer 112b from being oxidized and having high resistance. In addition, the amount of oxygen supplied from the insulating layer 107b to the semiconductor layer 108 is increased and the amount of oxygen vacancy ($V_O$) and $V_OH$ in the semiconductor layer 108 can be reduced, whereby the transistor can have favorable electric characteristics and high reliability.

Hydrogen diffused in the semiconductor layer 108 reacts with an oxygen atom contained in an oxide semiconductor to be water, and thus sometimes forms oxygen vacancy ($V_O$). Furthermore, $V_OH$ is formed and the carrier density is increased in some cases. Provision of the insulating layers 107a and 107c can allow the amount of oxygen vacancy ($V_O$) and $V_OH$ to be reduced in the semiconductor layer 108, whereby the transistor can have favorable electric characteristics and high reliability.

The insulating layers 107a and 107c preferably have thicknesses with which the insulating layers can function as blocking films against oxygen and hydrogen. When the insulating layers 107a and 107c are thin, the function of a blocking film might deteriorate. Meanwhile, when the insulating layers 107a and 107c are thick, a region where the semiconductor layer 108 is in contact with the insulating layer 107b is narrowed and the amount of oxygen supplied from the insulating layer 107b to the semiconductor layer 108 might be reduced. The insulating layers 107a and 107c may each be thinner than the insulating layer 107b.

In the transistor 100T, oxygen is supplied from the insulating layer 107 to the semiconductor layer 108, whereby the amount of oxygen vacancy ($V_O$) and $V_OH$ in the channel formation region are reduced. Consequently, the transistor can have favorable electrical characteristics and high reliability.

Note that one or both of the insulating layers 107a and 107c are not necessarily provided.

[Conductive Layers 112a, 112b, 104e, and 115]

The conductive layers 112a, 112b, 104e, and 115 functioning as a source electrode, a drain electrode, and gate electrodes can each be formed using one or more of chromium, copper, aluminum, gold, silver, zinc, tantalum, titanium, tungsten, manganese, nickel, iron, cobalt, molybdenum, and niobium; or an alloy including one or more of these metals as its components. For the conductive layers 112a, 112b, 104e, and 115, a conductive material with low resistance that contains one or more of copper, silver, gold, and aluminum can be suitably used. Copper or aluminum is particularly preferable because of its high mass-productivity.

As the conductive layers 112a, 112b, 104e, and 115, metal oxide films (also referred to as oxide conductors (OCs)) can be used. Examples of the oxide conductor include In—Sn oxide (ITO), In—W oxide, In—W—Zn oxide, In—Ti oxide, In—Ti—Sn oxide, In—Zn oxide, In—Sn—Si oxide (ITSO), and In—Ga—Zn oxide.

Here, an oxide conductor is described. For example, when oxygen vacancy is formed in a metal oxide having semiconductor characteristics and hydrogen is added to the oxygen vacancy, a donor level is formed in the vicinity of the conduction band. As a result, the conductivity of the metal oxide is increased, and thus, the metal oxide becomes a conductor. The metal oxide having become a conductor can be referred to as an oxide conductor.

The conductive layers 112a, 112b, 104e, and 115 may each have a stacked-layer structure of a conductive film containing the above-described oxide conductor (metal oxide) and a conductive film containing a metal or an alloy. The use of the conductive film containing a metal or an alloy can reduce the wiring resistance.

A Cu—X alloy film (X is Mn, Ni, Cr, Fe, Co, Mo, Ta, or Ti) may be used as the conductive layers 112a, 112b, 104e, and 115. The use of a Cu—X alloy film results in lower fabrication cost because the film can be processed by wet etching.

Note that the conductive layers 112a, 112b, 104e, and 115 may be formed using the same material or different materials.

Here, the conductive layers 112a and 112b will be described in detail with use of a structure in which a metal oxide is used for the semiconductor layer 108 as an example.

When an oxide semiconductor is used for the semiconductor layer 108, the conductive layers 112a and 112b are oxidized by oxygen contained in the semiconductor layer 108 and have high resistance in some cases. The conductive layers 112a and 112b are oxidized by oxygen contained in the insulating layer 107b and have high resistance in some cases. Moreover, when the conductive layers 112a and 112b are oxidized by oxygen contained in the semiconductor layer 108, the amount of oxygen vacancy ($V_O$) in the semiconductor layer 108 is increased in some cases. When the conductive layers 112a and 112b are oxidized by oxygen contained in the insulating layer 107b, the amount of oxygen supplied from the insulating layer 107b to the semiconductor layer 108 might be reduced.

A material that is less likely to be oxidized is preferably used for the conductive layers 112a and 112b. An oxide conductor is preferably used for the conductive layers 112a and 112b. For example, In—Sn oxide (ITO) or In—Sn—Si oxide (ITSO) can be suitably used. A nitride conductor may be used for the conductive layer 112a. Examples of the nitride conductor include tantalum nitride and titanium nitride. The conductive layer 112a may have a stacked-layer structure of the above-described materials.

The conductive layers 112a and 112b including a material that is less likely to be oxidized can be inhibited from being oxidized by oxygen contained in the semiconductor layer 108 or oxygen contained in the insulating layer 107b and having high resistance. Furthermore, it is possible to increase the amount of oxygen supplied from the insulating layer 107b to the semiconductor layer 108 while an increase in the amount of oxygen vacancy ($V_O$) in the semiconductor layer 108 is inhibited. Accordingly, the amount of oxygen vacancy ($V_O$) and $V_OH$ in the semiconductor layer 108 can be reduced, whereby the transistor can have favorable electric characteristics and high reliability.

Note that the conductive layers 112a and 112b may be formed using the same material or different materials.

The conductive layer 112b has a region in contact with the transistor 100T. When a material that is less likely to be oxidized is used for the conductive layer 112b, the amount of oxygen vacancy ($V_O$) and $V_OH$ in the semiconductor layer 108 can be reduced.

As described above, a material that is less likely to be oxidized is preferably used for the conductive layers 112a and 112b in contact with the semiconductor layer 108. However, the use of a material that is less likely to be oxidized might increase the resistance of the conductive layers 112a and 112b. The conductive layers 112a and 112b function as wirings and thus preferably have low resistance. In view of this, a material that is less likely to be oxidized is used for the conductive layer 112a_1 including a region in contact with the semiconductor layer 108 and a material with low resistance is used for the conductive layer 112a_2 not including a region in contact with the semiconductor layer 108, whereby the resistance of the conductive layer 112a can be reduced. Furthermore, the amount of oxygen vacancy ($V_O$) and $V_OH$ in the semiconductor layer 108 can be reduced, whereby the transistor can have favorable electric characteristics and high reliability.

In particular, in the case where the channel length L100 is short, oxygen vacancy ($V_O$) and $V_OH$ in the channel formation region greatly affect electrical characteristics and reliability, as described above. When a material that is less likely to be oxidized is used for the conductive layer 112a_1, an increase in the amount of oxygen vacancy ($V_O$) and $V_OH$ in the semiconductor layer 108 can be inhibited. Thus, the transistor with a short channel length can have favorable electrical characteristics and high reliability.

One or more of an oxide conductor and a nitride conductor can be suitably used for the conductive layer 112a_1. For the conductive layer 112a_2, a material having lower resistance than the conductive layer 112a_1 can be used. For the conductive layer 112a_2, one or more of copper, aluminum, titanium, tungsten, and molybdenum or an alloy containing one or more of these metals as its components can be suitably used. Specifically, In—Sn—Si oxide (ITSO) and tungsten can be suitably used for the conductive layer 112a_1 and the conductive layer 112a_2, respectively.

Note that the structure of the conductive layer 112a is determined in accordance with wiring resistance required for the conductive layer 112a. For example, when the wiring (the conductive layer 112a) is short and requires relatively high wiring resistance, the conductive layer 112a may have a single-layer structure using a material that is less likely to be oxidized. Meanwhile, when the wiring (the conductive layer 112a) is long and requires relatively low wiring resistance, the conductive layer 112a may have a stacked-layer structure using a material that is less likely to be oxidized and a material with low resistance.

The structure of the conductive layer 112a can be employed for another conductive layer.

[Insulating Layer 106]

The insulating layer 106 functioning as a gate insulating layer preferably has low defect density. With the insulating layer 106 having low defect density, the transistor can have favorable electrical characteristics. In addition, the insulating layer 106 preferably has high withstand voltage. With the insulating layer 106 having high withstand voltage, the transistor can have high reliability.

For the insulating layer 106, one or more of an insulating oxide, an insulating oxynitride, an insulating nitride oxide, and an insulating nitride can be used, for example. For the insulating layer 106, one or more of silicon oxide, silicon oxynitride, silicon nitride oxide, silicon nitride, aluminum oxide, aluminum oxynitride, aluminum nitride oxide, aluminum nitride, hafnium oxide, hafnium oxynitride, gallium oxide, gallium oxynitride, yttrium oxide, yttrium oxynitride, and Ga—Zn oxide can be used. The insulating layer 106 may be either a single layer or a stacked layer. The insulating layer 106 may have a stacked-layer structure of an oxide and a nitride.

A miniaturized transistor including a thin gate insulating layer may have a large leakage current. When a high dielectric constant material (also referred to as a high-k material) is used for the gate insulating layer, the voltage at the time of operation of the transistor can be reduced while the physical thickness is maintained. Examples of the high-k material include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

The amount of impurities (e.g., as water and hydrogen) released from the insulating layer 106 itself is preferably small. With the insulating layer 106 from which a small amount of impurities is released, diffusion of impurities into the semiconductor layer 108 is inhibited, and the transistor can have favorable electrical characteristics and high reliability.

Here, the insulating layer 106 will be described in detail with use of a structure in which a metal oxide is used for the semiconductor layer 108 as an example.

To improve the properties of the interface with the semiconductor layer 108, at least the side of a region in the insulating layer 106, which is in contact with the semiconductor layer 108, is preferably include an oxide. For example, one or more of silicon oxide and silicon oxynitride can be suitably used for the insulating layer 106. A film from which oxygen is released by heating is further preferably used for the insulating layer 106.

Note that the insulating layer 106 may have a stacked-layer structure. The insulating layer 106 can have a stacked-layer structure of an oxide film on the side in contact with the semiconductor layer 108 and a nitride film on the side in contact with the conductive layer 104e. For example, one or more of silicon oxide and silicon oxynitride can be suitably used for the oxide film. Silicon nitride can be suitably used for the nitride film.

[Substrate 102]

There is no particular limitation on the properties of a material and the like of the substrate 102 as long as the material has heat resistance enough to withstand at least heat treatment to be performed later. For example, a single crystal semiconductor substrate or a polycrystalline semiconductor substrate of silicon or silicon carbide, a compound semiconductor substrate of silicon germanium or the like, an SOI substrate, a glass substrate, a ceramic substrate, a quartz substrate, a sapphire substrate, a ceramic substrate, or an organic resin substrate may be used as the substrate 102. Alternatively, any of these substrates provided with a semiconductor element may be used as the substrate 102. Note that the shape of the semiconductor substrate and an insulating substrate may be circular or square.

A flexible substrate may be used as the substrate 102, and the transistor 100T and the like may be formed directly on the flexible substrate. Alternatively, a separation layer may be provided between the substrate 102 and the transistor 100T and the like. The separation layer can be used when part or the whole of a semiconductor device completed thereover is separated from the substrate 102 and transferred onto another substrate. In such a case, the transistor 100T and the like can be transferred to a substrate having low heat resistance or a flexible substrate as well.

The above is the description of the components of the transistor 100T.

At least part of this embodiment can be implemented in combination with any of the other embodiments described in this specification, as appropriate.

Embodiment 3

This embodiment will describe a structure in which the vertical transistors described in Embodiment 2 are diode-connected and used for the circuit 18 described in Embodiment 1. Note that the basic structure of each transistor is the same as that of the transistor 100T illustrated in FIGS. 7A and 7B or FIGS. 8A and 8B, and description thereof is omitted. The drawings described in this embodiment use the same reference numerals as those of the transistors 100T illustrated in FIGS. 7A and 7B and FIGS. 8A and 8B.

FIG. 9A is a cross-sectional view illustrating a connection structure of the (x−1)-th transistor Tr(x−1), the x-th transistor Tr(x), and the (x+1)-th transistor Tr(x+1) among the transistors connected in series in the circuit 18 illustrated in FIG. 3.

In the structure illustrated in FIG. 9A, the conductive layer 112b and the conductive layer 112a of each transistor always function as a drain (D) and a source (S), respectively. Although electrical connection between electrodes of the transistor Tr(x) is described below as a typical example, such electrical connection can also be applied to electrodes of the other transistors.

In the transistor Tr(x), the conductive layer 112b extends to an opening 142 provided in the insulating layer 106 and is electrically connected to the conductive layer 104e functioning as a gate (G) electrode. With this structure, the transistor Tr(x) is a diode-connected transistor in which a drain electrode and a gate electrode are electrically connected to each other.

The conductive layer 112b extends to an opening 141a provided in the insulating layer 107 and is electrically connected to the conductive layer 112a included in the transistor Tr(x−1). With this structure, the drain and the gate of the transistor Tr(x) are electrically connected to a source of the transistor Tr(x−1).

In the transistor Tr(x), the conductive layer 112a extends to an opening 141b provided in the insulating layer 107 and is electrically connected to the conductive layer 112b and the conductive layer 104e that are included in the transistor Tr(x+1). With this structure, a source of the transistor Tr(x) is electrically connected to a drain and a gate of the transistor Tr(x+1).

The above is the description of a diode-connected structure of the transistors Tr(x−1) to Tr(x+1) and series connection between the transistors.

Although FIG. 9A illustrates an example where the opening 141a and the opening 142 are apart from each other, the opening 142 may be provided in a region overlapping with the opening 141a as illustrated in FIG. 9B. With the structure illustrated in FIG. 9B, the area of a contact portion (an opening) can be reduced, so that the integration degree of the circuit can be increased.

FIG. 10A illustrates a mode different from those in FIGS. 9A and 9B. FIG. 10A is a cross-sectional view illustrating a connection structure of the (x−1)-th transistor Tr(x−1), the x-th transistor Tr(x), the (x+1)-th transistor Tr(x+1), and the (x+2)-th transistor Tr(x+2) among the transistors connected in series in the circuit 18 illustrated in FIG. 3.

In the structure illustrated in FIG. 10A, first transistors and second transistors are alternately connected in series. In the first transistor, the conductive layer 112b and the conductive layer 112a function as a drain and a source, respectively, and in the second transistor, the conductive layer 112b and the conductive layer 112a function as a source and a drain, respectively. FIG. 10A illustrates an example where the transistors Tr(x) and Tr(x+2) are the first transistors and the transistors Tr(x−1) and Tr(x+1) are the second transistors.

Electrical connection between the transistors Tr(x−1) to Tr(x+2) will be described with reference to FIG. 10B denoting the sources (S), gates (G), and drains (D) of the transistors.

In the transistor Tr(x), the conductive layer 104e functioning as a gate (G) electrode extends to an opening 144a provided in the insulating layer 106 and is electrically connected to the conductive layer 112b functioning as a drain (D) electrode. With this structure, the transistor Tr(x) is a diode-connected transistor in which a drain electrode and a gate electrode are electrically connected to each other.

The transistor Tr(x) shares its conductive layer 112b with the transistor Tr(x−1). In the transistor Tr(x−1), the conductive layer 112b functions as a source electrode (S). That is, with this structure, the drain and the gate of the transistor Tr(x) are electrically connected to the source of the transistor Tr(x−1).

The transistor Tr(x) shares its conductive layer 112a functioning as a source electrode (S) with the transistor Tr(x+1). In the transistor Tr(x+1), the conductive layer 112a functions as a drain electrode (D). The conductive layer 112a is electrically connected to the conductive layer 104e functioning as a gate electrode (G) of the transistor Tr(x+1) in an opening 144b provided in the insulating layers 107 and 106. The source of the transistor Tr(x) having this structure is electrically connected to the drain and the gate of the transistor Tr(x+1).

The above is the description of a diode-connected structure of the transistors Tr(x−1) to Tr(x+2) and series connection between the transistors.

Note that the transistor Tr(x+2) functioning as the first transistor like the transistor Tr(x) is connected to the transistors positioned in front of and behind the transistor Tr(x) in a manner similar to that in the above description. Each of the transistors Tr(x−1) and Tr(x+1) functioning as the second transistor has a connection with the transistors positioned in front of and behind the transistor Tr(x−1) or the transistor Tr(x+1) in a manner such that the source and the drain are switched from the above described case.

Figure 11A:
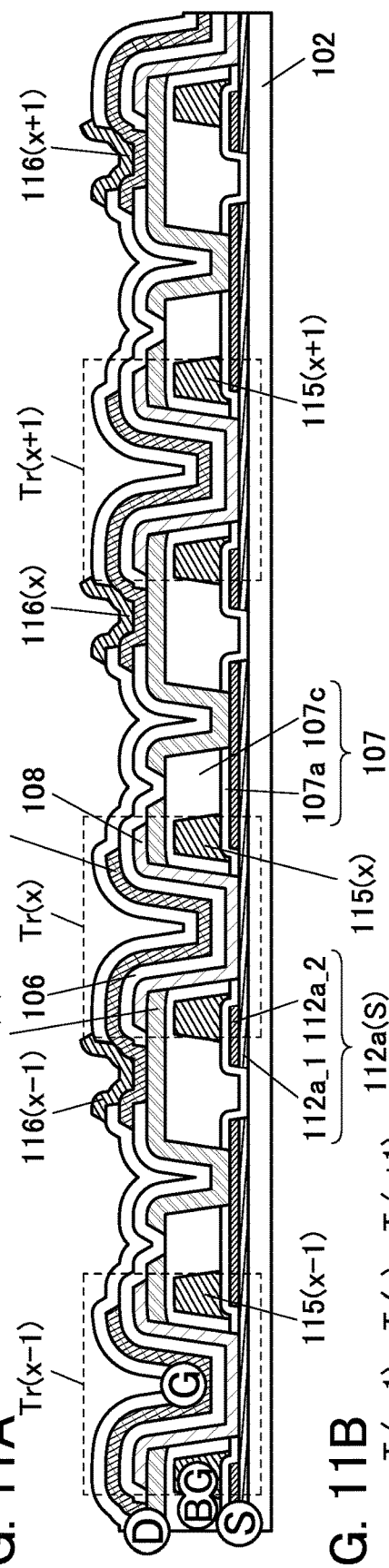
FIGS. 11A and 11C each illustrate a diode-connected structure of transistors and series connection between the transistors and FIG. 11B illustrates wirings connected to back gates of the transistors.

FIG. 11A is a cross-sectional view illustrating a connection structure of the (x−1)-th transistor Tr(x−1), the x-th transistor Tr(x), and the (x+1)-th transistor Tr(x+1) among the transistors connected in series in the circuit 18 illustrated in FIG. 4.

In the structure illustrated in FIG. 11A, the conductive layer 112b and the conductive layer 112a of each transistor always function as a drain (D) and a source (S), respectively. The transistors Tr(x−1) to Tr(x+1) are the same as those in FIG. 9A in a connection structure of the gate, source, and drain of each transistor, and different from those in FIG. 9A in including back gates and wirings for supplying potentials to the back gates.

The transistor Tr(x−1) includes a conductive layer 115(x−1) functioning as a back gate. Like the transistor Tr(x−1), the transistor Tr(x) includes a conductive layer 115(x) and the transistor Tr(x+1) includes a conductive layer 115(x+1).

A conductive layer 116(x−1) is electrically connected to the source electrode (the conductive layer 112a) of the transistor Tr(x−1). Although FIG. 11A illustrates an example where the conductive layer 116(x−1) is electrically connected to the conductive layer 112a through the conductive layers 112b and 104e, the conductive layer 116(x−1) may be connected to the conductive layer 112b without the conductive layer 104e provided therebetween. Alternatively, the conductive layer 116(x−1) may be connected to the conductive layer 112a without the conductive layers 112b and 104e provided therebetween.

As in the transistor Tr(x−1), a conductive layer 116(x) is electrically connected to the source electrode (the conductive layer 112a) of the transistor Tr(x). A conductive layer 116(x+1) is electrically connected to the source electrode (the conductive layer 112a) of the transistor Tr(x+1). Like the conductive layer 116(x−1), each of the conductive layer 116(x) and the conductive layer 116(x+1) may be connected to the conductive layer 112b without the conductive layer 104e provided therebetween or may be connected to the conductive layer 112a without the conductive layers 112b and 104e provided therebetween.

Figure 11B:
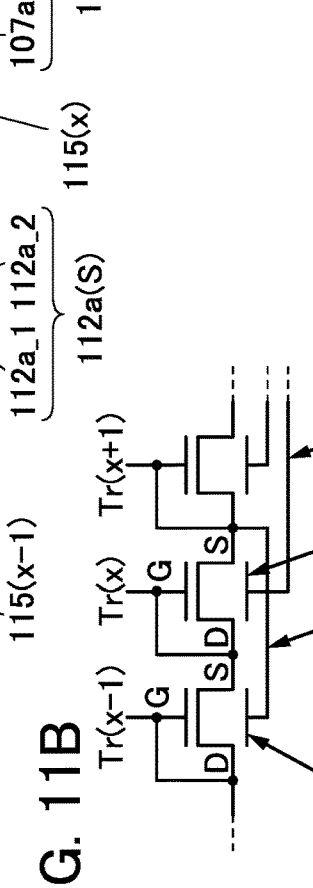

Here, as illustrated in a circuit diagram in FIG. 11B, the conductive layer 116(x) corresponds to a wiring connecting the back gate of the transistor Tr(x−1) to the source of the transistor Tr(x). In other words, the conductive layer 115(x−1) functioning as the back gate of the transistor Tr(x−1) is electrically connected to the conductive layer 116(x) electrically connected to the source of the transistor Tr(x).

Similarly, the conductive layer 116(x−1) is electrically connected to a conductive layer functioning as a back gate of a transistor Tr(x−2) (not illustrated). The conductive layer 116(x+1) is electrically connected to the conductive layer 115(x) functioning as the back gate of the transistor Tr(x).

Figure 11C:
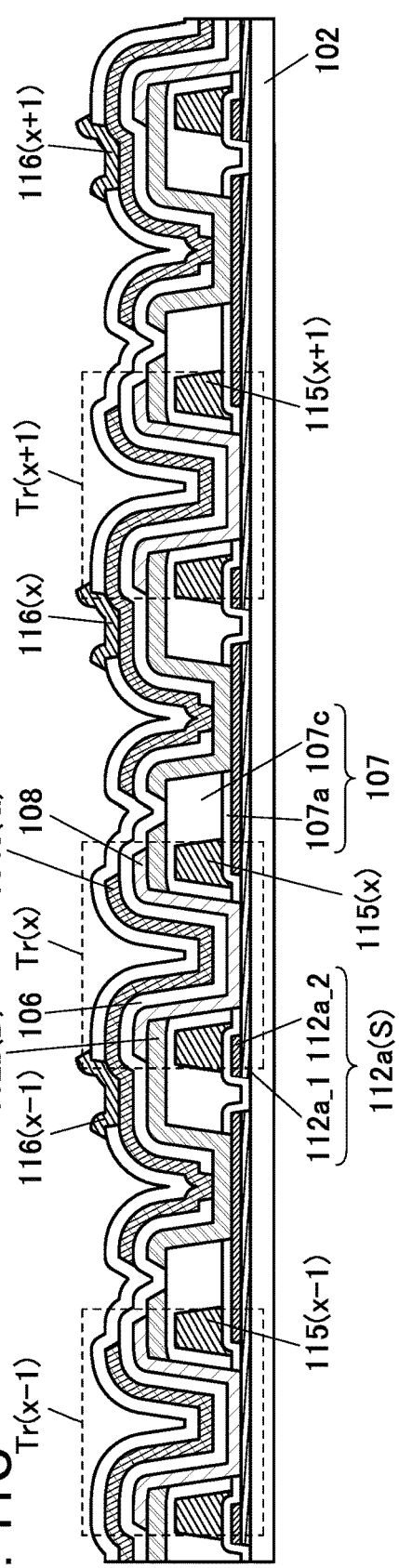

Note that as illustrated in FIG. 11C, a connection structure of the gate, source, and drain of each transistor can be similar to that in FIG. 9B.

Figure 12A:
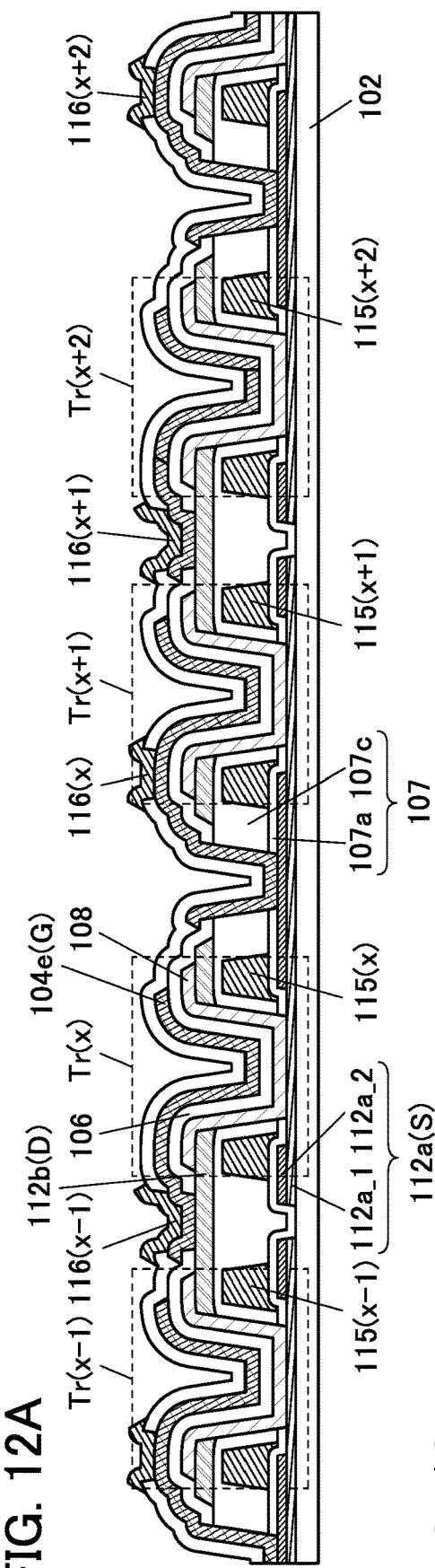
FIGS. 12A and 12C each illustrate a diode-connected structure of transistors and series connection between the transistors and FIG. 12B illustrates wirings connected to back gates of the transistors.

FIG. 12A illustrates a mode different from those in FIGS. 11A and 11B. FIG. 12A is a cross-sectional view illustrating a connection structure of the (x−1)-th transistor Tr(x−1), the x-th transistor Tr(x), the (x+1)-th transistor Tr(x+1), and the (x+2)-th transistor Tr(x+2) among the transistors connected in series in the circuit 18 illustrated in FIG. 3.

In the structure illustrated in FIG. 12A, first transistors and second transistors are alternately connected in series. In the first transistor, the conductive layer 112b and the conductive layer 112a function as a drain and a source, respectively, and in the second transistor, the conductive layer 112b and the conductive layer 112a function as a source and a drain, respectively. FIG. 12A illustrates an example where the transistors Tr(x) and Tr(x+2) are the first transistors and the transistors Tr(x−1) and Tr(x+1) are the second transistors.

Electrical connection between the transistors Tr(x−1) to Tr(x+2) will be described with reference to FIG. 12C denoting the sources (S), gates (G), drains (D), and back gates (BG) of the transistors.

The transistors Tr(x−1) to Tr(x+2) are the same as those in FIG. 10A in a connection structure of the gate, source, and drain of each transistor, and different from those in FIG. 10A in including back gates and wirings for supplying potentials to the back gates.

The transistor Tr(x−1) includes a conductive layer 115(x−1) functioning as a back gate. Like the transistor Tr(x−1), the transistor Tr(x) includes a conductive layer 115(x), the transistor Tr(x+1) includes a conductive layer 115(x+1), and the transistor Tr(x+2) includes a conductive layer 115(x+2).

The conductive layer 116(x−1) is electrically connected to the source electrode (the conductive layer 112b) of the transistor Tr(x−1). Although FIG. 12A illustrates an example where the conductive layer 116(x−1) is electrically connected to the conductive layer 112b through the conductive layer 104e, the conductive layer 116(x−1) may be connected to the conductive layer 112b without the conductive layer 104e provided therebetween.

As in the transistor Tr(x−1), the conductive layer 116(x+1) is electrically connected to the source electrode (the conductive layer 112b) of the transistor Tr(x+1) through the conductive layer 104e. Like the conductive layer 116(x−1), the conductive layer 116(x+1) may be connected to the conductive layer 112b without the conductive layer 104e provided therebetween.

The conductive layer 116(x) is electrically connected to the source electrode (the conductive layer 112a) of the transistor Tr(x) through the conductive layer 104e. As in the transistor Tr(x), a conductive layer 116(x+2) is electrically connected to the source electrode (the conductive layer 112a) of the transistor Tr(x+2) through the conductive layer 104e. Each of the conductive layer 116(x) and the conductive layer 116(x+2) may be connected to the conductive layer 112a without the conductive layer 104e provided therebetween.

Figure 12B:
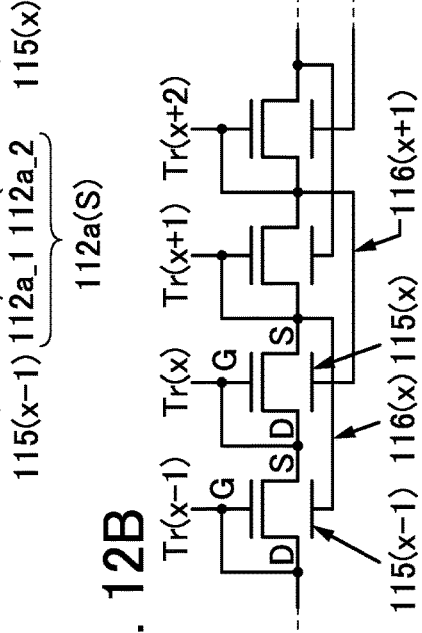
Figure 12C:
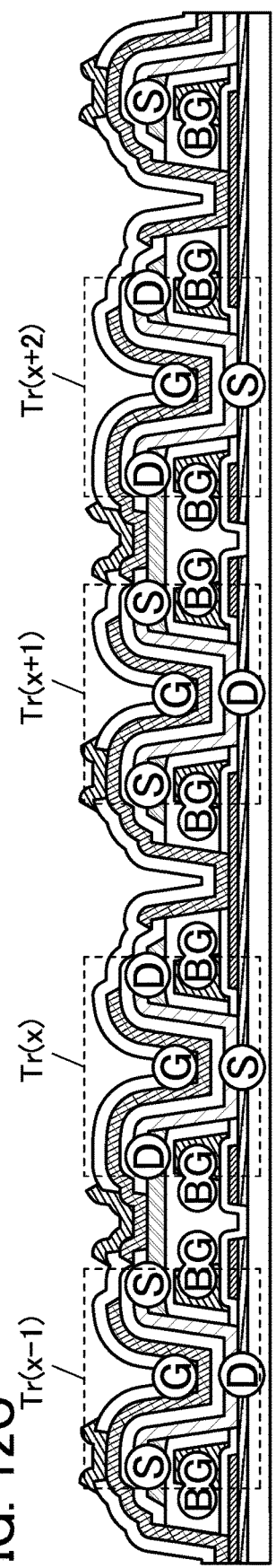

Here, as illustrated in a circuit diagram in FIG. 12B, the conductive layer 116(x) corresponds to a wiring connecting the back gate of the transistor Tr(x−1) to the source of the transistor Tr(x). In other words, the conductive layer 115(x−1) functioning as the back gate of the transistor Tr(x−1) is electrically connected to the conductive layer 116(x) electrically connected to the source of the transistor Tr(x).

Similarly, the conductive layer 116(x−1) is electrically connected to a conductive layer functioning as a back gate of a transistor Tr(x−2) (not illustrated). The conductive layer 116(x+1) is electrically connected to the conductive layer 115(x) functioning as the back gate of the transistor Tr(x). The conductive layer 116(x+2) is electrically connected to the conductive layer 115(x+1) functioning as the back gate of the transistor Tr(x+1).

In the transistor that can be used for the circuit 18, the semiconductor layer may be provided with an offset region to which a gate electric field is less likely to be applied, between a region to be a channel and a region to be a source or a drain.

Figure 13A:
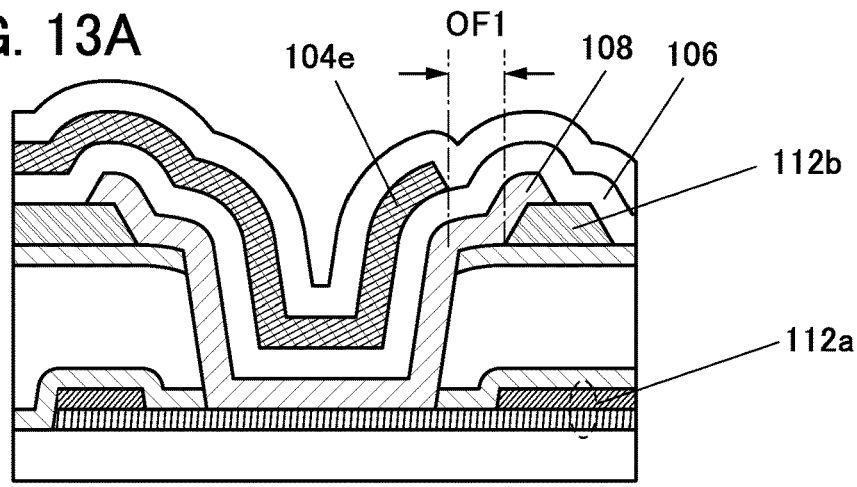
FIGS. 13A to 13C illustrate offset regions of a transistor.

For example, as illustrated in FIG. 13A, a region of the semiconductor layer 108 that is not in contact with the conductive layer 112b and does not overlap with the conductive layer 104e can be used as an offset region OF1. This structure can be formed by a lithography process.

Figure 13B:
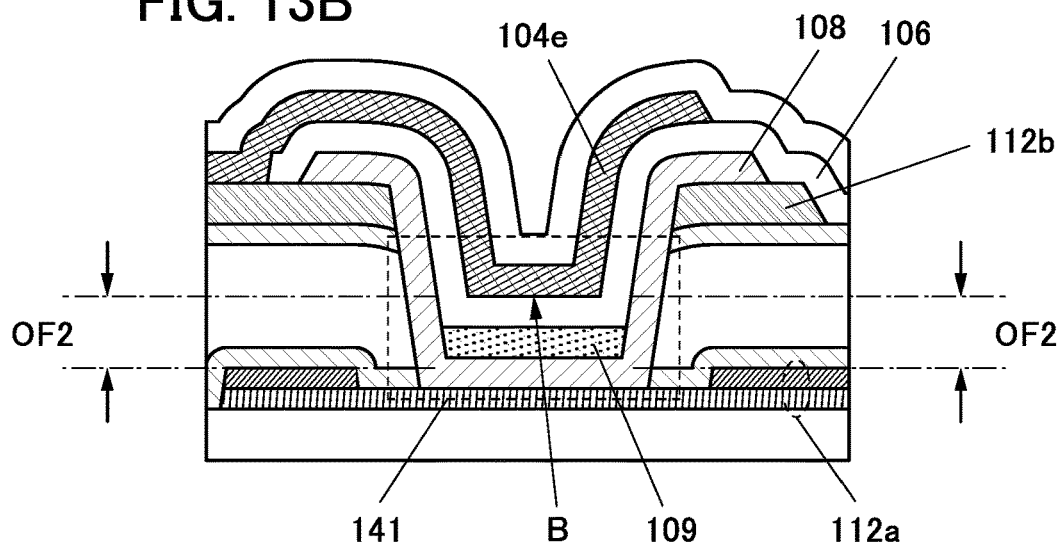

Alternatively, as illustrated in FIG. 13B, a region of the semiconductor layer 108 that is not in contact with the conductive layer 112a and provided below a bottom portion B of the conductive layer 104e in the opening 141 (an interface between the conductive layer 104e and the insulating layer 106) can be used as an offset region OF2. This structure can be formed by providing an insulating layer 109 over the semiconductor layer 108 provided in the bottom portion of the opening 141. The offset region OF2 can also be formed by forming the insulating layer 106 to be thick.

Figure 13C:
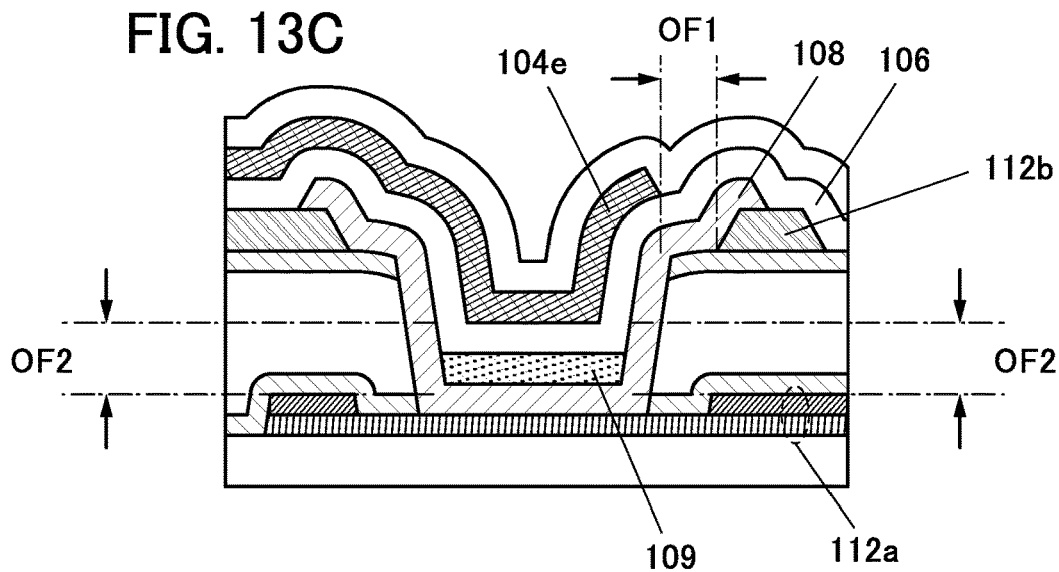

Alternatively, both the offset region OF1 and the offset region OF2 may be provided as illustrated in FIG. 13C. The structures in FIGS. 13A to 13C are examples, and an offset region can be formed in another structure.

The offset region functions as a resistor connected to the channel in series and thus can be used for adjusting the resistance value of the transistor. Note that as a resistor connected to the channel in series, an oxide conductor having a larger resistance value than a metal can be used for part or the whole of the conductive layers 112a and 112b.

At least part of this embodiment can be implemented in combination with any of the other embodiments described in this specification, as appropriate.

Embodiment 4

In this embodiment, pixel circuits included in the display device 30 will be described.

As illustrated in FIG. 1, the pixel of the display device of one embodiment of the present invention includes the subpixels 11 and 12. A pixel circuit PIX1 of the subpixel 11 includes a light-emitting device emitting visible light. A pixel circuit PIX2 of the subpixel 12 includes a light-receiving device.

Figure 14A:
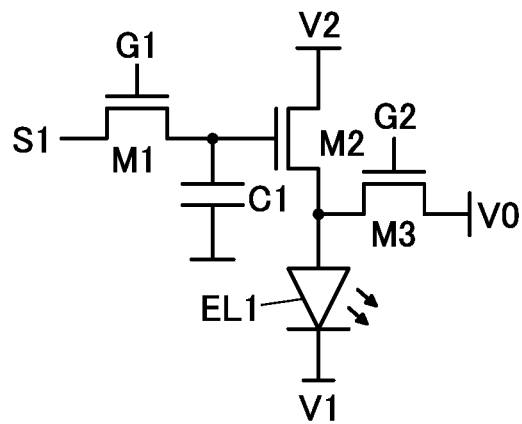
FIGS. 14A to 14C illustrate pixel circuits including light-emitting devices and FIG. 14D illustrates a pixel circuit including a light-receiving device.

FIG. 14A illustrates an example of the pixel circuit PIX1 of the subpixel 11. The pixel circuit PIX1 includes a light-emitting device EL1, a transistor M1, a transistor M2, a transistor M3, and a capacitor C1. Here, an example where a light-emitting diode is used as the light-emitting device EL1 is illustrated. An organic EL element that emits visible light is preferably used as the light-emitting device EL1.

A gate of the transistor M1 is electrically connected to a wiring G1, one of a source and a drain of the transistor M1 is electrically connected to a wiring S1, and the other of the source and the drain of the transistor M1 is electrically connected to one electrode of the capacitor C1 and a gate of the transistor M2. One of a source and a drain of the transistor M2 is electrically connected to a wiring V2, and the other of the source and the drain of the transistor M2 is electrically connected to an anode of the light-emitting device EL1 and one of a source and a drain of the transistor M3. A gate of the transistor M3 is electrically connected to a wiring G2, and the other of the source and the drain of the transistor M3 is electrically connected to a wiring V0. A cathode of the light-emitting device EL1 is electrically connected to a wiring V1.

A constant potential is supplied to each of the wiring V1 and the wiring V2. Light emission can be performed when the anode side of the light-emitting device EL1 is set to a high potential and the cathode side of the light-emitting device EL1 is set to a low potential. The transistor M1 is controlled by a signal supplied to the wiring G1 and functions as a selection transistor for controlling the selection state of the pixel circuit PIX1. In addition, the transistor M2 functions as a driving transistor that controls current flowing through the light-emitting device EL1 in accordance with a potential supplied to the gate.

When the transistor M1 is in a conduction state, a potential supplied to the wiring S1 is supplied to the gate of the transistor M2, and the emission luminance of the light-emitting device EL1 can be controlled in accordance with the potential. The transistor M3 is controlled by a signal supplied to the wiring G2. Accordingly, a potential between the transistor M2 and the light-emitting device EL1 can be reset to a constant potential supplied from the wiring V0; thus, a potential can be written to the gate of the transistor M2 in a state where a source potential of the transistor M2 is stabilized.

Figure 14B:
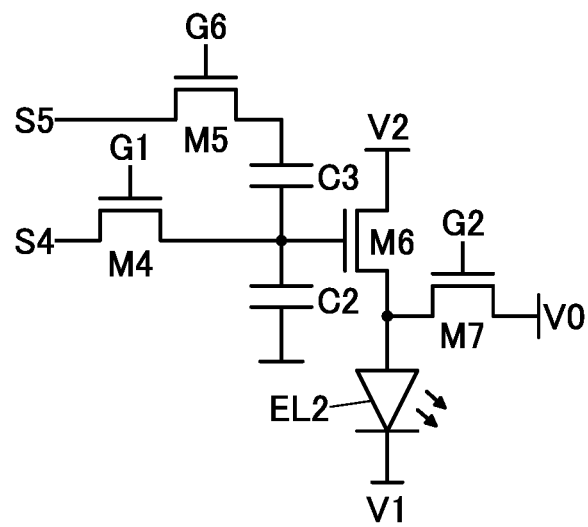

FIG. 14B illustrates an example of the pixel circuit PIX2 that is different from the pixel circuit PIX1. The pixel circuit PIX2 has a voltage boosting function. The pixel circuit PIX2 includes a light-emitting device EL2, a transistor M4, a transistor M5, a transistor M6, a transistor M7, a capacitor C2, and a capacitor C3. Here, an example where a light-emitting diode is used as the light-emitting device EL2 is illustrated. The pixel circuit PIX2 can be used for one or more subpixels 11 included in the pixel 10.

A gate of the transistor M4 is electrically connected to the wiring G1, one of a source and a drain of the transistor M4 is electrically connected to a wiring S4, and the other of the source and the drain of the transistor M4 is electrically connected to one electrode of the capacitor C2, one electrode of the capacitor C3, and a gate of the transistor M6. A gate of the transistor M5 is electrically connected to a wiring G6, one of a source and a drain of the transistor M5 is electrically connected to a wiring S5, and the other of the source and the drain of the transistor M5 is electrically connected to the other electrode of the capacitor C3.

One of a source and a drain of the transistor M6 is electrically connected to the wiring V2, and the other of the source and the drain of the transistor M6 is electrically connected to an anode of the light-emitting device EL2 and one of a source and a drain of the transistor M7. A gate of the transistor M7 is electrically connected to the wiring G2, and the other of the source and the drain of the transistor M7 is electrically connected to the wiring V0. A cathode of the light-emitting device EL2 is electrically connected to the wiring V1.

The transistor M4 is controlled by a signal supplied to the wiring G1, and the transistor M5 is controlled by a signal supplied to the wiring G6. The transistor M6 functions as a driving transistor that controls current flowing through the light-emitting device EL2 in accordance with a potential supplied to the gate.

The emission luminance of the light-emitting device EL2 can be controlled in accordance with the potential supplied to the gate of the transistor M6. The transistor M7 is controlled by a signal supplied to the wiring G2. A potential between the transistor M6 and the light-emitting device EL2 can be reset to a constant potential supplied from the wiring V0; thus, a potential can be written to the gate of the transistor M6 in a state where a source potential of the transistor M6 is stabilized. In addition, when the potential supplied from the wiring V0 is set to the same potential as the potential of the wiring V1 or a potential lower than that of the wiring V1, light emission of the light-emitting device EL2 can be inhibited.

The voltage boosting function of the pixel circuit PIX2 is described below.

First, a potential "D1" of the wiring S4 is supplied to the gate of the transistor M6 through the transistor M4, and at timing overlapping this, a reference potential "$V_{ref}$" is supplied to the other electrode of the capacitor C3 through the transistor M5. At this time, "D1-$V_{ref}$" is retained in the capacitor C3. Next, the gate of the transistor M6 is set to be floating, and a potential "D2" of the wiring S5 is supplied to the other electrode of the capacitor C3 through the transistor M5. Here, the potential "D2" is a potential for addition.

At this time, the potential of the gate of the transistor M6 is D1+($C_3$/($C_3$+$C_2$+$C_{M6}$))×(D2-$V_{ref}$)), where the capacitance value of the capacitor C3 is $C_3$, the capacitance value of the capacitor C2 is $C_2$, and the capacitance value of the gate of the transistor M6 is $C_{M6}$. Here, assuming that the value of $C_3$ is sufficiently larger than the value of $C_2$+$C_{M6}$, $C_3$/($C_3$+$C_2$+$C_{M6}$) approximates one. Thus, it can be said that the potential of the gate of the transistor M6 approximates "D1+(D2-$V_{ref}$)". Then, when D1=D2 and $V_{ref}$=0, "D1+(D2-$V_{ref}$))"="2D1".

That is, when the circuit is designed appropriately, a potential approximately twice as high as the potential that can be input from the wiring S4 or S5 can be supplied to the gate of the transistor M6.

Owing to such action, a high voltage can be generated in the pixel circuit. Thus, voltage to be input to the pixel circuit can be decreased and power consumption of the driver circuit can be reduced.

Figure 14C:
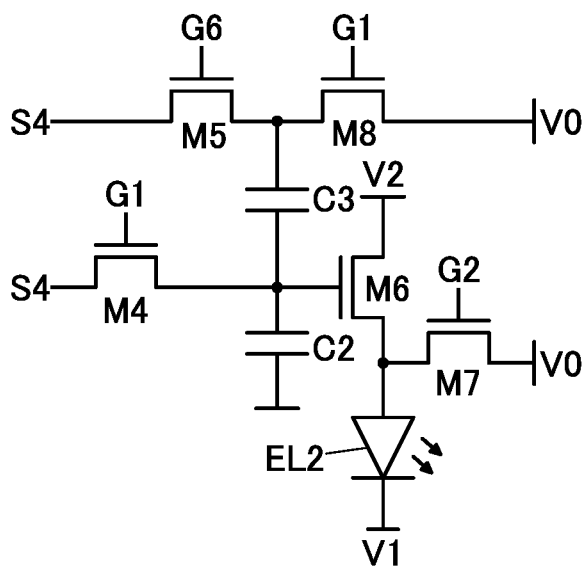

Alternatively, the pixel circuit PIX2 may have a structure illustrated in FIG. 14C. The pixel circuit PIX2 illustrated in FIG. 14C differs from the pixel circuit PIX2 illustrated in FIG. 14B in including a transistor M8. A gate of the transistor M8 is electrically connected to the wiring G1, one of a source and a drain of the transistor M8 is electrically connected to the other of the source and the drain of the transistor M5 and the other electrode of the capacitor C3, and the other of the source and the drain of the transistor M8 is electrically connected to the wiring V0. In addition, the one of the source and the drain of the transistor M5 is connected to the wiring S4.

As described above, in the pixel circuit PIX2 illustrated in FIG. 14B, operations of supplying the reference potential and the potential for addition to the other electrode of the capacitor C3 through the transistor M5 are performed. In this case, the two wirings S4 and S5 are necessary, and the reference potential and the potential for addition need to be rewritten alternately in the wiring S5.

In the pixel circuit PIX2 illustrated in FIG. 14C, although the transistor M8 is additionally provided, the wiring S5 can be omitted because a dedicated path for supplying the reference potential is provided. Furthermore, since the gate of the transistor M8 can be connected to the wiring G1 and the wiring V0 can be used as a wiring for supplying the reference potential, a wiring connected to the transistor M8 is not additionally provided. Moreover, alternately rewriting of the reference potential and the potential for addition is not performed in one wiring, which makes it possible to achieve high-speed operation with low power consumption.

Note that in FIG. 14B and FIG. 14C, "D1B", an inversion potential of "D1", may be used as the reference potential "$V_{ref}$". In this case, a potential approximately three times as high as the potential that can be input from the wiring S4 or S5 can be supplied to the gate of the transistor M6. Note that the inversion potential refers to a potential such that the absolute value of the difference between the potential and a reference potential is the same (or substantially the same) as that of the difference between the original potential and the reference potential, and the potential is different from the original potential. The relation $V_0$=(D1+D1B)/2 is satisfied, where the original potential is "D1," the inversion potential is "D1B," and the reference potential is $V_0$.

In the display device of this embodiment, the light-emitting device may be made to emit light in a pulsed manner to display an image. A reduction in the driving time of the light-emitting device can reduce power consumption of the display device and inhibit heat generation. An organic EL element is particularly suitable because of its excellent frequency characteristics. The frequency can be higher than or equal to 1 kHz and lower than or equal to 100 MHz, for example.

Figure 14D:
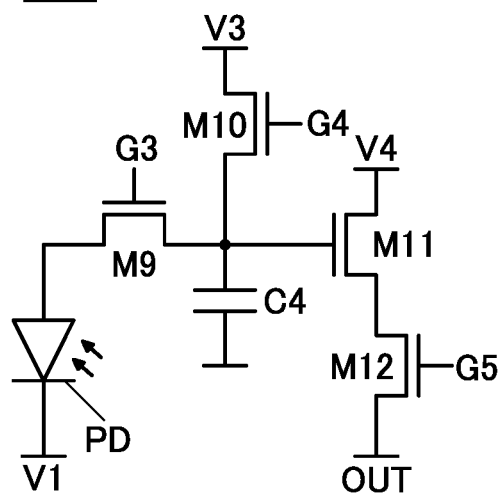

FIG. 14D illustrates an example of a pixel circuit PIX3 of the subpixel 12. The pixel circuit PIX3 includes a light-receiving device PD, a transistor M9, a transistor M10, a transistor M11, a transistor M12, and a capacitor C4. Here, an example where a photodiode is used as the light-receiving device PD is illustrated.

A cathode of the light-receiving device PD is electrically connected to the wiring V1, and an anode of the light-receiving device PD is electrically connected to one of a source and a drain of the transistor M9. A gate of the transistor M9 is electrically connected to a wiring G3, and the other of the source and the drain of the transistor M9 is electrically connected to one electrode of the capacitor C4, one of a source and a drain of the transistor M10, and a gate of the transistor M11. A gate of the transistor M10 is electrically connected to a wiring G4, and the other of the source and the drain of the transistor M10 is electrically connected to a wiring V3. One of a source and a drain of the transistor M11 is electrically connected to a wiring V4, and the other of the source and the drain of the transistor M11 is electrically connected to one of a source and a drain of the transistor M12. A gate of the transistor M12 is electrically connected to a wiring G5, and the other of the source and the drain of the transistor M12 is electrically connected to a wiring OUT.

A constant potential is supplied to each of the wiring V1, the wiring V3, and the wiring V4. In the case where the light-receiving device PD is driven with a reverse bias, a potential lower than the potential of the wiring V1 is supplied to the wiring V3. The transistor M10 is controlled by a signal supplied to the wiring G5 and has a function of resetting the potential of a node connected to the gate of the transistor M11 to a potential supplied to the wiring V3. The transistor M9 is controlled by a signal supplied to the wiring G3 and has a function of controlling timing at which the potential of the node changes, in accordance with current flowing through the light-receiving device PD. The transistor M11 functions as an amplifier transistor that performs output corresponding to the potential of the node. The transistor M12 is controlled by a signal supplied to the wiring G6 and functions as a selection transistor for reading the output corresponding to the potential of the node by an external circuit connected to the wiring OUT.

Here, as each of the transistors M1 to M12 included in the pixel circuits PIX1 to PIX3, it is preferable to use a transistor including a metal oxide (an oxide semiconductor) for a semiconductor layer where a channel is formed.

A transistor including a metal oxide having a wider band gap and a lower carrier density than silicon can achieve an extremely low off-state current. Such a low off-state current enables retention of electric charge accumulated in a capacitor that is connected in series with the transistor for a long time.

Therefore, it is preferable to use transistors including an oxide semiconductor particularly as the transistor M1, the transistor M4, the transistor M5, the transistor M8, the transistor M9, and the transistor M10, in each of which one or the other of the source and the drain is connected to the capacitor C1, the capacitor C2, the capacitor C3, or the capacitor C4. With the use of transistors including an oxide semiconductor in the subpixel 12, a global shutter system in which all the pixels perform the operation of accumulating electric charge at the same time can be employed without complicated circuit structures and driving methods.

Moreover, the use of transistors including an oxide semiconductor as the other transistors can reduce manufacturing cost.

Alternatively, transistors including silicon as a semiconductor in which a channel is formed can be used as the transistor M1 to the transistor M12. In particular, the use of silicon having high crystallinity, such as single crystal silicon or polycrystalline silicon, is preferable because high field-effect mobility is achieved and higher-speed operation is possible.

Alternatively, a structure may be employed in which a transistor including an oxide semiconductor is used as one or more of the transistors M1 to M12 and transistors including silicon are used as the other transistors.

Note that although FIG. 14A to FIG. 14D each illustrate an example where n-channel transistors are used, p-channel transistors can also be used.

The transistors included in the pixel circuit PIX1, the transistors included in the pixel circuit PIX2, and the transistors included in the pixel circuit PIX3 are preferably formed side by side over the same substrate.

In addition, one or more layers including one or both of the transistor and the capacitor are preferably provided at a position overlapping the light-receiving device PD, the light-emitting device EL1, or the light-emitting device EL2. Thus, the effective occupied area of each pixel circuit can be reduced, and a high-resolution light-receiving portion or display portion can be achieved.

At least part of this embodiment can be implemented in combination with any of the other embodiments described in this specification, as appropriate.

Embodiment 5

In this embodiment, a structure of a display portion of a display device of one embodiment of the present invention will be described. Note that a pixel 110, a subpixel including a light-emitting device, and a subpixel including a light-receiving device, which are described in this embodiment, respectively correspond to the pixel 10, the subpixel 11, and the subpixel 12, which are described in Embodiment 1.

Figure 15A:
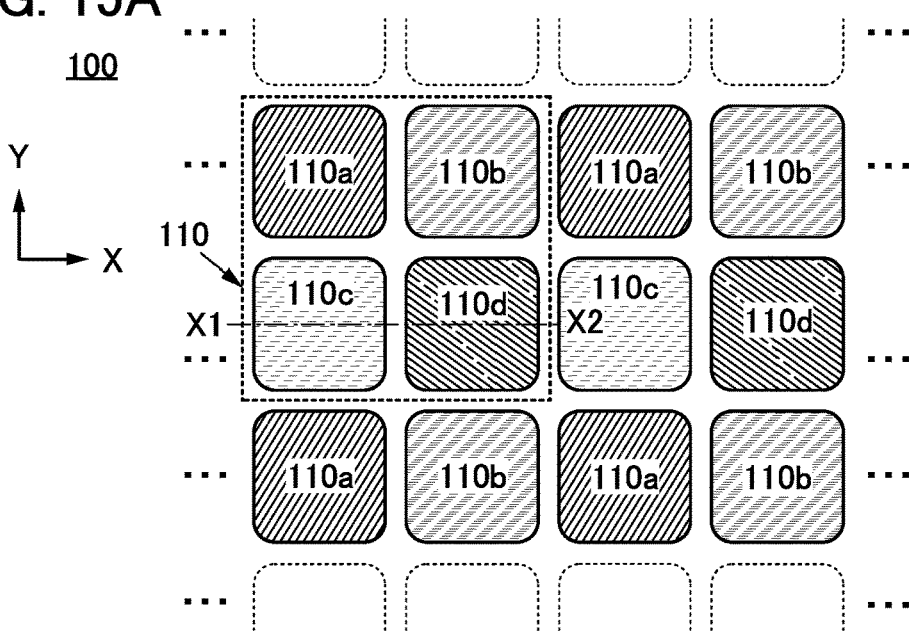
FIG. 15A is a top view illustrating an example of a display device and FIGS. 15B and 15C are cross-sectional views illustrating examples of display devices.

FIG. 15A is a top view of a display device 100 including a light-emitting device and a light-receiving device. The display device 100 includes a display portion where a plurality of pixels 110 are arranged. FIG. 15A illustrates some subpixels to show an example where the pixel 110 is formed with a plurality of subpixels arranged at a regular interval (the subpixels 110a, 110b, 110c, and 110d).

Note that in this specification and the like, the row direction is referred to as X direction and the column direction is referred to as Y direction, in some cases. The X direction and the Y direction intersect with each other and are orthogonal or substantially orthogonal to each other (see FIG. 15A).

The top surface shape of the subpixel illustrated in FIG. 15A corresponds to the top surface shape of a light-emitting region or a light-receiving region. Examples of the top surface shape of the subpixel may include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in FIG. 15A, and the components of the circuit may be placed outside the range of the subpixels. For example, transistors included in the subpixel 110a may be positioned within the range of the subpixel 110b, or some or all of the transistors may be positioned outside the range of the subpixel 110a.

The aperture ratio of each of the subpixels 110a, 110b, 110c, and 110d can be determined as appropriate. The subpixels 110a, 110b, 110c, and 110d may have different aperture ratios, or two or more of the subpixels 110a, 110b, 110c, and 110d may have the same or the substantially the same aperture ratio.

The display device of one embodiment of the present invention includes a light-receiving device in a pixel. For example, three of the four subpixels included in the pixel 110 illustrated in FIG. 15A can each include a light-emitting device and the other one can include a light-receiving device.

The three subpixels can include light-emitting devices emitting light of different colors. The three subpixels can be of three colors of red (R), green (G), and blue (B) or of three colors of yellow (Y), cyan (C), and magenta (M), for example.

Note that in the following description, as an example, the subpixels 110a, 110b, and 110c each include a light-emitting device and the subpixel 110d includes a light-receiving device 150. As components of a light-emitting device, components of a light-emitting device 130c of the subpixel 110c will be described and common components can also be applied to light-emitting devices of the subpixels 110a and 110b.

Figure 15B:
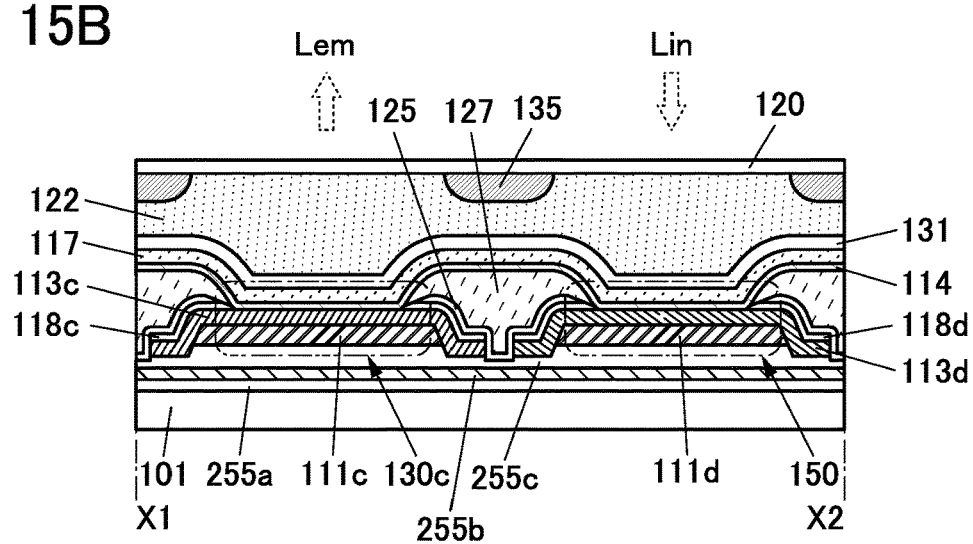

FIG. 15B is a cross-sectional view along the dashed-dotted line X1-X2 in FIG. 15A. As illustrated in FIG. 15B, an insulating layer is provided over a layer 101 including transistors and the light-emitting device 130c and the light-receiving device 150 are provided over the insulating layer. A protective layer 131 is provided to cover the light-emitting device 130c and the light-receiving device 150.

Alight-blocking layer 135 is bonded to the protective layer 131 with an adhesive layer 122 therebetween. The light-blocking layer 135 is provided between two subpixels adjacent to each other.

FIG. 15B illustrates an example where light is emitted from the light-emitting device 130c to the substrate 120 side and light coming from the substrate 120 side enters the light-receiving device 150 (see light Lem and light Lin).

In a region between the light-emitting device 130c and the light-receiving device 150 adjacent to each other, an insulating layer 125 and an insulating layer 127 over the insulating layer 125 are provided. Although not illustrated in FIG. 15B, the insulating layers 125 and 127 are provided also in a region between adjacent light-emitting devices.

[Light-Emitting Device]

First, a light-emitting device will be described. The display device of one embodiment of the present invention has a top-emission structure in which light is emitted in a direction opposite to the substrate where the light-emitting device is formed.

The layer 101 including transistors can employ a stacked-layer structure in which a plurality of transistors are provided over a substrate and an insulating layer is provided to cover these transistors. The insulating layer over the transistors may have a single-layer structure or a stacked-layer structure. In FIG. 15B, an insulating layer 255a, an insulating layer 255b over the insulating layer 255a, and an insulating layer 255c over the insulating layer 255b are illustrated as the insulating layers over the transistors.

As each of the insulating layers 255a, 255b, and 255c, any of a variety of inorganic insulating films such as an oxide insulating film, a nitride insulating film, an oxynitride insulating film, and a nitride oxide insulating film can be suitably used. As the insulating layers 255a and 255c, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferable that a silicon oxide film be used as the insulating layers 255a and 255c and a silicon nitride film be used as the insulating layer 255b. The insulating layer 255b preferably has a function of an etching protective film.

Note that in this specification and the like, oxynitride refers to a material that contains more oxygen than nitrogen, and nitride oxide refers to a material that contains more nitrogen than oxygen. For example, silicon oxynitride refers to a material that contains more oxygen than nitrogen, and silicon nitride oxide refers to a material that contains more nitrogen than oxygen.

The light-emitting device can emit infrared, red, green, blue, cyan, magenta, yellow, or white light, for example. When the light-emitting device has a microcavity structure, the color purity can be increased. The light-emitting device 130c can emit light of any one of three colors of red (R), green (G), and blue (B), for example.

As the light-emitting device, an OLED or a QLED is preferably used. Examples of a light-emitting substance contained in the light-emitting device include a substance exhibiting fluorescence (a fluorescent material), a substance exhibiting phosphorescence (a phosphorescent material), and a TADF material. Examples of the light-emitting substance contained in the light-emitting device include not only organic compounds but also inorganic compounds (e.g., quantum dot materials). An LED such as a micro-LED can also be used as the light-emitting device.

One of the pair of electrodes of the light-emitting device functions as a cathode, and the other electrode functions as an anode. The case where the pixel electrode functions as an anode and the common electrode functions as a cathode is described below as an example in some cases.

The light-emitting device 130c includes a pixel electrode 111c over the insulating layer 255c, an island-shaped layer 113c over the pixel electrode 111c, a common layer 114 over the layer 113c, and a common electrode 117 over the common layer 114. In the light-emitting device 130c, the layer 113c and the common layer 114 can be collectively referred to as an EL layer.

When the EL layer is provided in an island shape for each light-emitting device, a leakage current between adjacent light-emitting devices can be inhibited. This can prevent crosstalk due to unintended light emission, so that a display device with extremely high contrast can be obtained. Specifically, a display device having high current efficiency at low luminance can be obtained.

The light-emitting device of this embodiment can have a single structure (a structure including only one light-emitting unit).

In the case of using a light-emitting device having a single structure, the layer 113c can include a light-emitting layer emitting red, green, or blue light.

In the light-emitting device having a single structure, the layer 113c may include one or more of a hole-injection layer, a hole-transport layer, a hole-blocking layer, a charge-generation layer, an electron-blocking layer, an electron-transport layer, and an electron-injection layer.

For example, the layer 113c can include a hole-injection layer, a hole-transport layer, a light-emitting layer, and an electron-transport layer in this order. In addition, an electron-blocking layer may be provided between the hole-transport layer and the light-emitting layer. In addition, a hole-blocking layer may be provided between the electron-transport layer and the light-emitting layer. Furthermore, an electron-injection layer may be provided over the electron-transport layer.

Alternatively, the layer 113c can include an electron-injection layer, an electron-transport layer, a light-emitting layer, and a hole-transport layer in this order. In addition, a hole-blocking layer may be provided between the electron-transport layer and the light-emitting layer. In addition, an electron-blocking layer may be provided between the hole-transport layer and the light-emitting layer. Furthermore, a hole-injection layer may be provided over the hole-transport layer.

Moreover, the light-emitting device of this embodiment can have a tandem structure. The light-emitting device having a tandem structure can include two or more light-emitting units in the layer 113c, and each light-emitting unit can include one or more light-emitting layers. Each light-emitting unit may include one or more of a hole-injection layer, a hole-transport layer, a hole-blocking layer, an electron-blocking layer, an electron-transport layer, and an electron-injection layer. A charge-generation layer is preferably provided between the light-emitting units. The charge-generation layer includes at least a charge-generation region.

Figure 16:
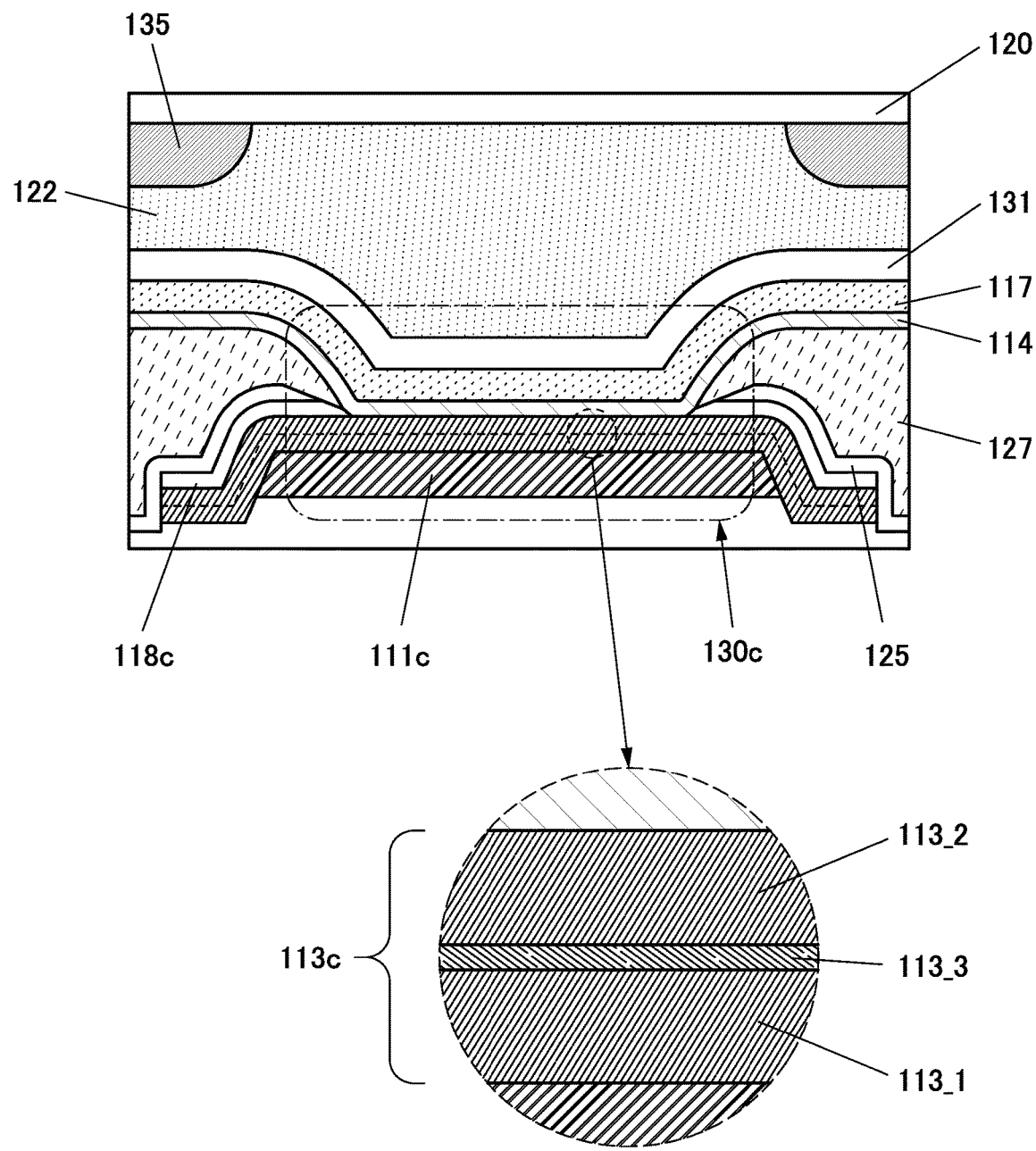
FIG. 16 is a cross-sectional view illustrating components of a display device.

For example, the layer 113c can have a stacked-layer structure of a light-emitting unit 113_1, a charge-generation layer 113_3, and a light-emitting unit 113_2 (see an enlarged view of the layer 113c in FIG. 16). Note that in the drawing used in this embodiment, the charge-generation layer is indicated by a dashed line in some cases.

In the case of using a light-emitting device having a tandem structure, the layer 113c can include a plurality of light-emitting units emitting light of the same color. For example, in the structure illustrated in FIG. 16, the light-emitting unit 113_1 and the light-emitting unit 113_2 can include the same kind of light-emitting units emitting red, green, or blue light.

Furthermore, to emit white light, a tandem structure in which light-emitting units emitting light of different colors are combined can be employed. To obtain white light, the light-emitting device is configured to obtain white light by combining light emitted from a plurality of light-emitting units. For example, in the structure illustrated in FIG. 16, one of the light-emitting units 113_1 and 113_2 emits blue light and the other emits yellow light. Alternatively, a light-emitting unit emitting red light and a light-emitting unit emitting cyan light may be combined. Alternatively, a light-emitting unit emitting green light and a light-emitting unit emitting magenta light may be combined.

Alternatively, three light-emitting units may be combined. For example, a light-emitting unit emitting red light, a light-emitting unit emitting green light, and a light-emitting unit emitting blue light may be combined. Alternatively, a light-emitting unit emitting blue light, a light-emitting unit emitting yellow- or yellowish-green light, and a light-emitting unit emitting blue light may be combined. Alternatively, a light-emitting unit emitting blue light, a light-emitting unit emitting green and red light, and a light-emitting unit emitting blue light may be combined.

Examples of the stacked structure of light-emitting units include, from an anode side, a two-unit structure of a light-emitting unit emitting blue light (B) and a light-emitting unit emitting yellow light (Y); a two-unit structure of B and a light-emitting unit X; a three-unit structure of B, Y, and B; and a three-unit structure of B, X, and B. Examples of the stacked structure of light-emitting layers in the light-emitting unit X include, from an anode side, a two-layer structure of a light-emitting layer emitting red light (R) and a light-emitting layer emitting yellow light (Y); a two-layer structure of R and a light-emitting layer emitting green light (G); a two-layer structure of G and R; a three-layer structure of G, R, and G; and a three-layer structure of R, G, and R. Another layer may be provided between two light-emitting layers.

A light-emitting device having a tandem structure emitting light from a plurality of light-emitting units requires a relatively high voltage for light emission but requires a small amount of current for obtaining the emission intensity at the same level as that from a light-emitting device having a single structure (including one light-emitting unit). Thus, with the tandem structure, current stress on each light-emitting unit can be reduced and the element lifetime can be extended. That is, with a light-emitting device having a tandem structure, a highly reliable display device can be formed.

In the structure illustrated in FIG. 16, it is preferable that the light-emitting unit 113_2 include a light-emitting layer and a carrier-transport layer (an electron-transport layer or a hole-transport layer) over the light-emitting layer. Alternatively, the light-emitting unit 113_2 preferably includes a light-emitting layer and a carrier-blocking layer (a hole-blocking layer or an electron-blocking layer) over the light-emitting layer. Alternatively, the light-emitting unit 113_2 preferably includes a light-emitting layer, a carrier-blocking layer over the light-emitting layer, and a carrier-transport layer over the carrier-blocking layer. Since the surface of the light-emitting unit 113_2 is exposed in the manufacturing process of the display device, providing one or both of the carrier-transport layer and the carrier-blocking layer over the light-emitting layer inhibits the light-emitting layer from being exposed on the outermost surface, so that damage to the light-emitting layer can be reduced. Accordingly, the reliability of the light-emitting device can be increased. Note that in the case where three or more light-emitting units are provided, the uppermost light-emitting unit preferably includes a light-emitting layer and one or both of a carrier-transport layer and a carrier-blocking layer over the light-emitting layer.

The structure and the material of the light-emitting device having a tandem structure are described in detail in another embodiment.

The common layer 114 can include an electron-injection layer or a hole-injection layer. Alternatively, the common layer 114 may be a stack of an electron-transport layer and an electron-injection layer, or may be a stack of a hole-transport layer and a hole-injection layer. The common layer 114 and the common electrode 117 are shared by the light-emitting devices included in the subpixels.

In FIG. 15B, the layer 113c is formed to cover the end portion of the pixel electrode 111c. A mask layer 118c is positioned over the layer 113c of the light-emitting device 130c. The mask layer 118c is a remaining part of a mask layer provided in contact with a top surface of the layer 113c at the time of processing the layer 113c.

In FIG. 15B, one end portion of the mask layer 118c is aligned or substantially aligned with the end portion of the layer 113c, and the other end portion of the mask layer 118c is positioned over the layer 113c. Here, the other end portion of the mask layer 118c preferably overlaps with the layer 113c and the pixel electrode 111c.

A side surface of the layer 113c is covered with the insulating layer 125. The insulating layer 127 overlaps with the side surface of the layer 113c with the insulating layer 125 therebetween.

The top surface of the layer 113c is partly covered with the mask layer 118c. The insulating layers 125 and 127 overlap with part the top surface of the layer 113c with the mask layer 118c therebetween. Note that the top surface of the layer 113c is not limited to the top surface of a flat portion overlapping with the top surface of the pixel electrode, and can include the top surfaces of the inclined portion and the flat portion which are positioned on the outer side of the top surface of the pixel electrode.

The side surface and part of the top surface of the layer 113c are covered with at least one of the insulating layer 125, the insulating layer 127, and the mask layer 118c, so that the common layer 114 (or the common electrode 117) can be inhibited from being in contact with the side surfaces of the pixel electrode 111c and the layer 113c, leading to inhibition of a short circuit between upper and lower layers in the light-emitting device.

The insulating layer 127 is provided over the insulating layer 125 to fill a depressed portion where the insulating layer 125 is formed. The insulating layer 127 can overlap with the side surface and part of the top surface of the layer 113c with the insulating layer 125 therebetween. The insulating layer 127 preferably covers at least part of a side surface of the insulating layer 125.

The insulating layers 125 and 127 can fill a gap between adjacent island-shaped layers, whereby the formation surface of the layers (e.g., the carrier-injection layer and the common electrode) provided over the island-shaped layers can have higher flatness with small unevenness. Consequently, coverage with the carrier-injection layer, the common electrode, and the like can be improved.

The common layer 114 and the common electrode 117 are provided over the layer 113c, the mask layer 118c, the insulating layer 125, and the insulating layer 127. Before the insulating layer 125 and the insulating layer 127 are provided, a step is generated due to a difference between a region where the pixel electrode and the island-shaped EL layer are provided and a region where neither the pixel electrode nor the island-shaped EL layer is provided (region between the light-emitting devices).

In the display device of one embodiment of the present invention, the step can be planarized with the insulating layer 125 and the insulating layer 127, and the coverage with the common layer 114 and the common electrode 117 can be improved. Thus, connection defects caused by step disconnection can be inhibited. In addition, an increase in electric resistance, which is caused by local thinning of the common electrode 117 due to a step, can be inhibited.

A top surface of the insulating layer 127 preferably has higher flatness, but may include a projection portion, a convex surface, a concave surface, or a depressed portion.

As illustrated in FIG. 15B, the common layer 114 and the common electrode 117 can be formed with good coverage owing to the mask layer 118c, the insulating layer 125, and the insulating layer 127. It is also possible to prevent formation of a disconnected portion and a locally thinned portion in the common layer 114 and the common electrode 117.

This can inhibit the common layer 114 and the common electrode 117 between the light-emitting devices from having connection defects due to the disconnected portion and an increased electric resistance due to the locally thinned portion. Thus, the display quality of the display device of one embodiment of the present invention can be improved.

Next, an example of materials for the insulating layers 125 and 127 are described.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer in forming the insulating layer 127 which is to be described later.

In particular, when an inorganic insulating film such as an aluminum oxide film, a hafnium oxide film, or a silicon oxide film formed by an ALD method is used as the insulating layer 125, the insulating layer 125 can have few pin holes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating film against at least one of water and oxygen. Alternatively, the insulating layer 125 preferably has a function of inhibiting diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as a function of less easily transmitting the substance). Alternatively, a barrier property refers to a function of capturing or fixing (also referred to as gettering) a particular substance.

When the insulating layer 125 has a function of the barrier insulating layer or a gettering function, entry of impurities (typically, at least one of water and oxygen) that would be diffused into the light-emitting devices from the outside can be inhibited. With this structure, a highly reliable light-emitting device and a highly reliable display device can be provided.

Note that the insulating layer 125 and the mask layer 118c can be formed using the same material. In this case, the boundary between the insulating layer 125 and the mask layer 118c is unclear and thus the insulating layer 125 and the mask layer 118c are sometimes observed as one layer.

The insulating layer 127 provided over the insulating layer 125 has a function of filling large unevenness of the insulating layer 125, which is formed between the adjacent light-emitting devices.

As the insulating layer 127, an insulating layer containing an organic material can be favorably used. As the organic material, a photosensitive organic resin is preferably used, and for example, a photosensitive resin composite containing an acrylic resin is used. Note that in this specification and the like, an acrylic resin refers to not only a polymethacrylic acid ester or a methacrylic resin, but also all the acrylic polymer in a broad sense in some cases.

Alternatively, the insulating layer 127 may be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. Alternatively, the insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. A photoresist may be used for the photosensitive resin. As the photosensitive organic resin, either a positive material or a negative material may be used.

The insulating layer 127 may be formed using a material absorbing visible light. When the insulating layer 127 absorbs light emitted from the light-emitting device, leakage of light (stray light) from the light-emitting device to the adjacent light-emitting device or the adjacent light-receiving device through the insulating layer 127 can be inhibited. Thus, the display quality and image capturing performance of the display device can be improved. Since no polarizing plate is required to improve the display quality, the weight and thickness of the display device can be reduced.

Examples of the material absorbing visible light include materials containing pigment of black or the like, materials containing dye, light-absorbing resin materials (e.g., polyimide), and resin materials that can be used for color filters (color filter materials). Using the resin material composed of stacked color filter materials of two or three or more colors is particularly preferred, in which case the effect of blocking visible light is enhanced. In particular, mixing color filter materials of three or more colors enables the formation of a black or nearly black resin layer.

Figure 15C:
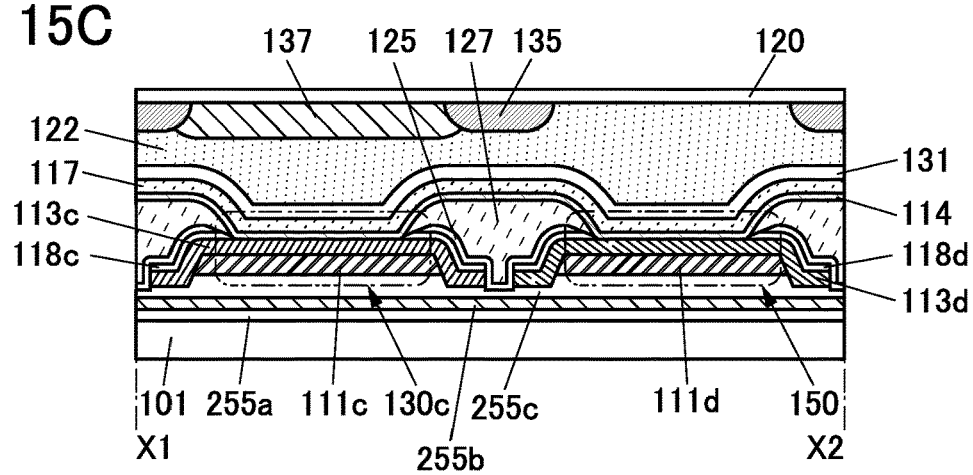

In addition, as illustrated in FIG. 15C, a coloring layer 137 such as a color filter may be provided in a region overlapping with the light-emitting device 130c. For example, in the case where the light-emitting device 130c emits white light, provision of the coloring layer 137 enables the subpixel to emit red light, green light, blue light, or the like. Alternatively, the color of light emitted from the light-emitting device 130c and the color of the coloring layer 137 may be the same. With such a structure, the subpixel can emit light with improved color purity.

[Light-Receiving Device]

Next, the light-receiving device 150 will be described. Note that description of components that are the same as the components of the light-emitting device 130c and components for the same purpose as that of the components of the light-emitting device 130c are omitted.

As the light-receiving device, a PN photodiode or a PIN photodiode can be used. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

The light-receiving device can detect one or both of visible light and infrared light. The light-receiving device that detects infrared light can detect an object even in a dark environment.

It is preferable to use an organic photodiode including a layer containing an organic compound as the light-receiving device. An organic photodiode, which is easily made thin, lightweight, and large in area and has a high degree of freedom for shape and design, can be used in a variety of display devices.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display device including the organic EL device.

The light-receiving device is driven by application of reverse bias between the pixel electrode and the common electrode, whereby light entering the light-receiving device can be detected and electric charge can be generated and extracted as a current.

A manufacturing method similar to that of the light-emitting device can be employed for the light-receiving device. An island-shaped active layer (also referred to as a photoelectric conversion layer) included in the light-receiving device is formed by processing a film to be the active layer and formed on the entire surface, not by using a fine metal mask; thus, the island-shaped active layer can have a uniform thickness. Moreover, providing the mask layer over the active layer can reduce damage to the active layer in the manufacturing process of the display device, resulting in an improvement in reliability of the light-receiving device.

The light-receiving device 150 includes a pixel electrode 111d over the insulating layer 255c, a layer 113d over the pixel electrode 111d, the common layer 114 over the layer 113d, and the common electrode 117 over the common layer 114.

Here, the layer 113d includes at least an active layer, preferably includes a plurality of functional layers. Examples of the functional layer include carrier-transport layers (a hole-transport layer and an electron-transport layer) and carrier-blocking layers (a hole-blocking layer and an electron-blocking layer). In addition, one or more layers are preferably formed over the active layer. A layer between the active layer and the mask layer can inhibit the active layer from being exposed on the outermost surface during the manufacturing process of the display device and can reduce damage to the active layer. Accordingly, the reliability of the light-receiving device 150 can be increased. Thus, the layer 113d preferably includes an active layer and a carrier-blocking layer (a hole-blocking layer or an electron-blocking layer) or a carrier-transport layer (an electron-transport layer or a hole-transport layer) over the active layer.

The layer 113d is provided in the light-receiving device 150, not in the light-emitting device 130c. Note that the functional layer other than the active layer in the layer 113d may include the same material as the functional layer other than the light-emitting layer in the layer 113c. Meanwhile, the common layer 114 is a continuous layer included in the light-receiving device 150 and the light-emitting device 130c.

Here, a layer shared by the light-receiving device and the light-emitting device may have a different function depending on which device the layer is in. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-receiving device and the light-emitting device. For example, the hole-transport layer functions as a hole-transport layer in both the light-emitting device and the light-receiving device, and the electron-transport layer functions as an electron-transport layer in both the light-emitting device and the light-receiving device.

The mask layer 118c is positioned between the layer 113c and the insulating layer 125, and a mask layer 118d is positioned between the layer 113d and the insulating layer 125. The mask layer 118c is a remaining part of the mask layer provided over the layer 113c at the time of processing the layer 113c. The mask layer 118d is a remaining part of a mask layer provided in contact with a top surface of the layer 113d at the time of processing the layer 113d, which is a layer including the active layer. The mask layers 118c and 118d may contain the same material or different materials.

The subpixel 110d may have a higher aperture ratio than at least one of the subpixels 110a, 110b, and 110c. The wide light-receiving area of the subpixel 110d can make it easy to detect an object in some cases. For example, in some cases, the aperture ratio of the subpixel 110d is higher than that of the other subpixels depending on the resolution of the display device and the circuit structure or the like of the subpixel.

The subpixel 110d may have a lower aperture ratio than at least one of the subpixels 110a, 110b, and 110c. The low aperture ratio of the subpixel 110d can enhance a pinhole effect and a clearer image can be obtained.

As described above, the detection wavelength, resolution, and aperture ratio of the subpixel 110d are preferably changed depending on the usage.

The protective layer 131 provided over the light-emitting device 130c and the light-receiving device 150 may have a single-layer structure or a stacked-layer structure of two or more layers. Providing the protective layer 131 can improve the reliability of the light-emitting device 130c and the light-receiving device 150.

There is no limitation on the conductivity of the protective layer 131. As the protective layer 131, at least one type of insulating films, semiconductor films, and conductive films can be used.

The protective layer 131 including an inorganic film can inhibit deterioration of the light-emitting devices and the light-receiving device by preventing oxidation of the common electrode 117 and inhibiting entry of impurities (e.g., moisture and oxygen) into the light-emitting devices and the light-receiving device, for example; thus, the reliability of the display device can be improved.

As the protective layer 131, an inorganic insulating film such as an oxide insulating film, a nitride insulating film, an oxynitride insulating film, or a nitride oxide insulating film can be used, for example. Specific examples of these inorganic films are as listed in the description of the insulating layer 125. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 117. The inorganic film may further contain nitrogen.

The protective layer 131 preferably has a high visible-light-transmitting property. It is preferable to use any of ITO, IGZO, and aluminum oxide because they are inorganic materials having a high visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can inhibit entry of impurities (e.g., water and oxygen) into the EL layer.

Furthermore, the protective layer 131 may include an organic film. The protective layer 131 may include both an organic film and an inorganic film. Examples of an organic material that can be used for the protective layer 131 include organic insulating materials that can be used for the insulating layer 127.

The protective layer 131 may have a stacked structure of two layers which are formed by different formation methods. Specifically, the first layer of the protective layer 131 may be formed by an ALD method, and the second layer of the protective layer 131 may be formed by a sputtering method.

For the adhesive layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferable. A two-component-mixture-type resin may be used. An adhesive sheet or the like may be used.

For the substrate 120, glass, quartz, ceramic, sapphire, a resin, a metal, an alloy, a semiconductor, or the like can be used. The substrate through which light from the light-emitting device is extracted is formed using a material that transmits the light. When a flexible material is used for the substrate 120, the flexibility of the display device can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic resin film.

When a film used as the substrate absorbs water, the shape of the display device might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

A variety of optical members can be provided on the outer surface of the substrate 120. Examples of optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120.

It is preferable to provide, as the surface protective layer, a glass layer or a silica layer ($SiO_x$ layer) because the surface contamination or damage can be prevented. The surface protective layer may be formed using diamond like carbon (DLC), aluminum oxide ($AlO_x$), a polyester-based material, a polycarbonate-based material, or the like. For the surface protective layer, a material having a high visible-light-transmitting property is preferably used. The surface protective layer is preferably formed using a material with high hardness.

In the display device of one embodiment of the present invention, each light-emitting device includes an island-shaped EL layer, which can inhibit generation of a leakage current between the subpixels. This can prevent crosstalk due to unintended light emission, so that a display device with extremely high contrast can be obtained. The insulating layer having a tapered end portion and being provided between adjacent island-shaped EL layers can inhibit formation of step disconnection at the time of forming the common electrode. This can inhibit the common layer and the common electrode from having connection defects due to the disconnected portion. Thus, the display device of one embodiment of the present invention can have both a higher resolution and higher display quality.

At least part of this embodiment can be implemented in combination with any of the other embodiments described in this specification, as appropriate.

Embodiment 6

In this embodiment, pixel layouts that can be employed for the display device of one embodiment of the present invention will be described.

[Pixel Layout]

There is no particular limitation on the arrangement of subpixels, and a variety of methods can be employed. Examples of the arrangement of subpixels include stripe arrangement, S stripe arrangement, matrix arrangement, delta arrangement, Bayer arrangement, and PenTile arrangement.

The top surface shape of the subpixel illustrated in the diagrams in this embodiment corresponds to the top surface shape of a light-emitting region or a light-receiving region.

Examples of the top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in the diagrams, and the components of the circuit may be placed outside the range of the subpixels.

Figure 17A:
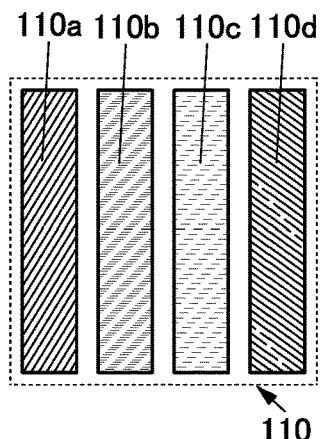
FIGS. 17A to 17K illustrate examples of pixels.
Figure 17B:
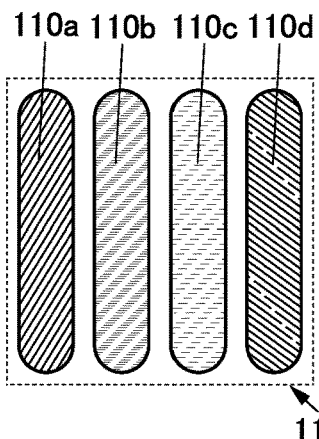
Figure 17C:
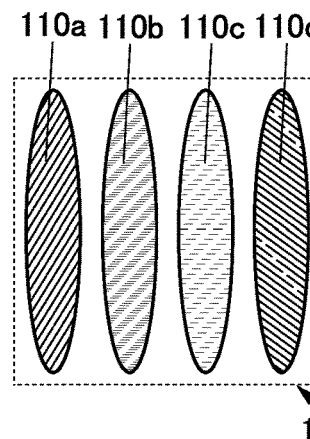

The pixels 110 illustrated in FIGS. 17A to 17C each employ stripe arrangement.

FIG. 17A illustrates an example where each subpixel has a rectangular top surface shape, FIG. 17B illustrates an example where each subpixel has a top surface shape formed by combining two half circles and a rectangle, and FIG. 17C illustrates an example where each subpixel has an elliptical top surface shape.

Figure 17D:
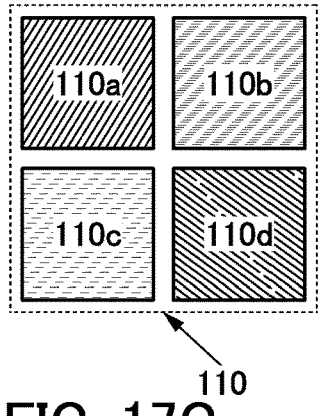
Figure 17E:
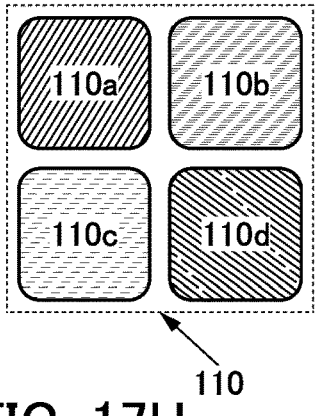
Figure 17F:
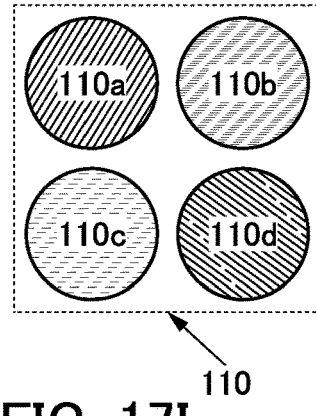

The pixels 110 illustrated in FIGS. 17D to 17F each employ matrix arrangement.

FIG. 17D illustrates an example where each subpixel has a square top surface shape, FIG. 17E illustrates an example where each subpixel has a rough square top surface shape with rounded corners, and FIG. 17F illustrates an example where each subpixel has a circular top surface shape.

Figure 17G:
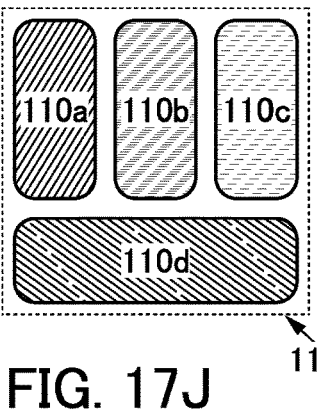
Figure 17H:
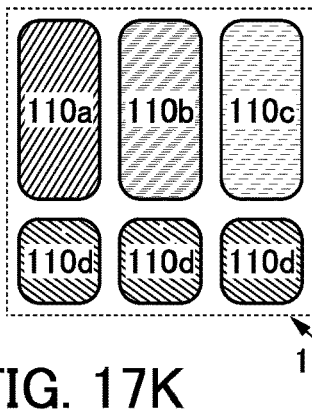

FIGS. 17G and 17H illustrate examples where one pixel 110 is composed of two rows and three columns.

The pixel 110 illustrated in FIG. 17G includes three subpixels (the subpixels 110a, 110b, and 110c) in the upper row (first row) and one subpixel (subpixel 110d) in the lower row (second row). In other words, the pixel 110 includes the subpixel 110a in the left column (first column), the subpixel 110b in the center column (second column), the subpixel 110c in the right column (third column), and the subpixel 110d across these three columns.

The pixel 110 illustrated in FIG. 17H includes three subpixels (the subpixels 110a, 110b, and 110c) in the upper row (first row) and three subpixels 110d in the lower row (second row). In other words, the pixel 110 includes the subpixel 110a and the subpixel 110d in the left column (first column), the subpixel 110b and another subpixel 110d in the center column (second column), and the subpixel 110c and another subpixel 110d in the right column (third column). Matching the positions of the subpixels in the upper row and the lower row as illustrated in FIG. 17H enables dust and the like that would be produced in the manufacturing process to be removed efficiently. Thus, a display device having high display quality can be provided.

Figure 17I:
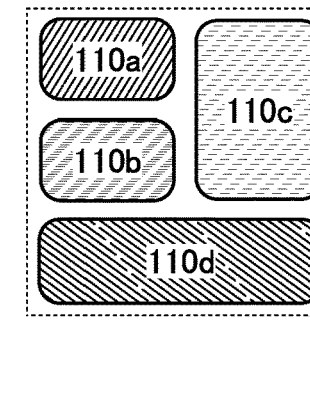

FIG. 17I illustrates an example where one pixel 110 is composed of three rows and two columns.

The pixel 110 illustrated in FIG. 17I includes the subpixel 110a in the upper row (first row), the subpixel 110b in the center row (second row), the subpixel 110c across the first and second rows, and one subpixel (the subpixel 110d) in the lower row (third row). In other words, the pixel 110 includes the subpixels 110a and 110b in the left column (first column), the subpixel 110c in the right column (second column), and the subpixel 110d across these two columns.

The pixels 110 illustrated in FIGS. 17A to 17I each include four types of subpixels 110a, 110b, 110c, and 110d. For example, any one of the subpixels 110a to 110d can include a light-receiving device and the other three subpixels can include light-emitting devices.

In each of the pixels 110 illustrated in FIGS. 17A to 17I, for example, it is preferable that the subpixel 110a be a subpixel R emitting red light, the subpixel 110b be a subpixel G emitting green light, the subpixel 110c be a subpixel B emitting blue light, and the subpixel 110d be a subpixel S including a light-receiving device. In the case of such a structure, stripe arrangement is employed as the layout of R, G, and B in each of the pixels 110 illustrated in FIGS. 17G and 17H, leading to higher display quality. In addition, what is called S stripe arrangement is employed as the layout of R, G, and B in the pixel 110 illustrated in FIG. 17I, leading to higher display quality.

There is no particular limitation on the wavelength of light detected by the subpixel S including a light-receiving device. The subpixel S can be configured to detect one or both of infrared light and visible light.

In the case where a light-receiving device is not provided, the subpixels 110a, 110b, 110c, and 110d can be of four colors of R, G, B, and white (W), of four colors of R, G, B, and Y, or of R, G, B and infrared (IR) light, for example.

Figure 17J:
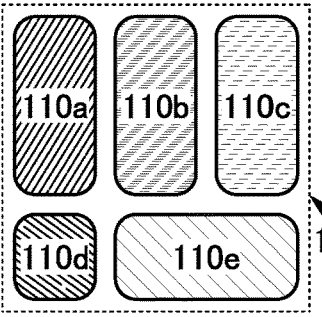
Figure 17K:
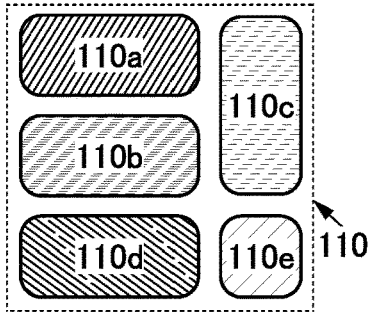

As illustrated in FIGS. 17J and 17K, the pixel can include five types of subpixels.

FIG. 17J illustrates an example where one pixel 110 is composed of two rows and three columns.

The pixel 110 illustrated in FIG. 17J includes three subpixels (the subpixels 110a, 110b, and 110c) in the upper row (first row) and two subpixels (the subpixel 110d and a subpixel 110e) in the lower row (second row). In other words, the pixel 110 includes the subpixels 110a and 110d in the left column (first column), the subpixel 110b in the center column (second column), the subpixel 110c in the right column (third column), and the subpixel 110e across the second and third columns.

FIG. 17K illustrates an example where one pixel 110 is composed of three rows and two columns.

The pixel 110 illustrated in FIG. 17K includes the subpixel 110a in the upper row (first row), the subpixel 110b in the center row (second row), the subpixel 110c across the first and second rows, and two subpixels (the subpixels 110d and 110e) in the lower row (third row). In other words, the pixel 110 includes the subpixels 110a, 110b, and 110d in the left column (first column), and the subpixels 110c and 110e in the right column (second column).

In each of the pixels 110 illustrated in FIGS. 17J and 17K, for example, it is preferable that the subpixel 110a be the subpixel R emitting red light, the subpixel 110b be the subpixel G emitting green light, and the subpixel 110c be the subpixel B emitting blue light. In the case of such a structure, stripe arrangement is employed as the layout of R, G, and B in each of the pixels 110 illustrated in FIGS. 17J, leading to higher display quality. In addition, what is called S stripe arrangement is employed as the layout of R, G, and B in the pixel 110 illustrated in FIG. 17K, leading to higher display quality.

In each of the pixels 110 illustrated in FIGS. 17J and 17K, for example, it is preferable to use the subpixel S including a light-receiving device as at least one of the subpixels 110d and 110e. In the case where light-receiving devices are used in both the subpixels 110d and 110e, the light-receiving devices may have different structures. For example, the wavelength ranges of detected light may be different at least partly. Specifically, one of the subpixels 110d and 110e may include a light-receiving device mainly detecting visible light and the other may include a light-receiving device mainly detecting infrared light.

In each of the pixels 110 illustrated in FIGS. 17J and 17K, for example, it is preferable that the subpixel S including a light-receiving device be used as one of the subpixels 110d and 110e and a subpixel including a light-receiving device that can be used as a light source be used as the other. For example, it is preferable that one of the subpixels 110d and 110e be a subpixel IR emitting infrared light and the other be the subpixel S including a light-receiving device detecting infrared light.

In the pixel including the subpixels R, G, B, IR, and S, while displaying an image using the subpixels R, G, and B, the subpixel S can detect reflected light of infrared light emitted from the subpixel IR that is used as a light source.

As described above, the pixel composed of the subpixels each including the light-emitting device can employ any of a variety of layouts in the display device of one embodiment of the present invention. The display device of one embodiment of the present invention can have a structure in which the pixel includes both a light-emitting device and a light-receiving device. Also in this case, any of a variety of layouts can be employed.

At least part of this embodiment can be implemented in combination with any of the other embodiments described in this specification, as appropriate.

Embodiment 7

In this embodiment, a display device of one embodiment of the present invention will be described.

The display device of one embodiment of the present invention can be a high-definition display device or a large-sized display device. Accordingly, the display device in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, desktop and laptop personal computers, a monitor of a computer and the like, digital signage, and a large game machine such as a pachinko machine.

[Display Device 100A]

Figure 18:
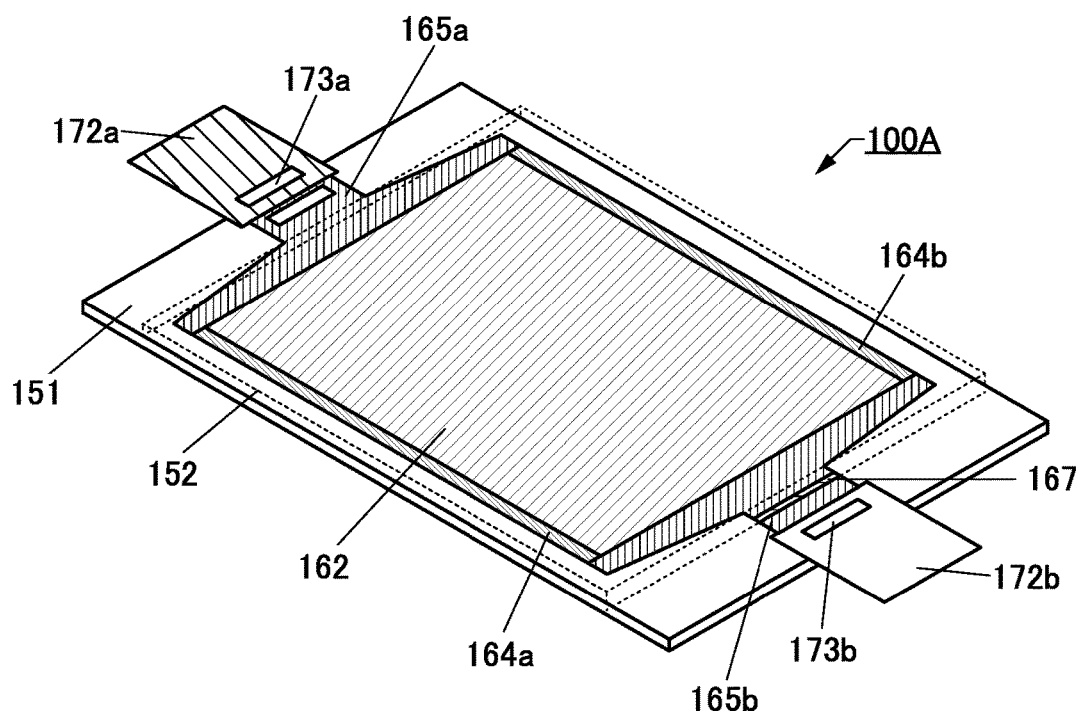
FIG. 18 is a perspective view illustrating an example of a display device.

FIG. 18 is a perspective view of a display device 100A that is the display device of one embodiment of the present invention, and FIG. 19A is a cross-sectional view of the display device 100A.

In the display device 100A, a substrate 151 and a substrate 152 are bonded to each other. In FIG. 18, the substrate 152 is indicated by a dashed line.

The display device 100A includes a display portion 162, circuits 164a and 164b, wirings 165a and 165b, and the like. FIG. 18 illustrates an example where IC chips (integrated circuits) 173a and 173b and FPCs 172a and 172b are mounted on the display device 100A. Thus, the structure illustrated in FIG. 18 can be regarded as a display module including the display device 100A, the IC chips, and the FPCs.

A gate driver for performing display can be used as the circuit 164a. A row driver for performing image capturing (light sensing) can be used as the circuit 164b.

The wiring 165a has a function of supplying a signal and power to the subpixels 11 and 12 and the circuits 164a and 164b illustrated in FIG. 1. The signal and power are input to the wiring 165a from the outside through the FPC 172a or from the IC chip 173a.

Although FIG. 18 illustrates an example where the IC chips 173a and 173b are mounted on the substrate 151 by a COF method, a TCP method, a COG method, or the like may be used.

An IC chip having a function of a source driver connected to the subpixel 11 illustrated in FIG. 1 can be used as the IC chip 173a, for example. An IC chip having functions of a column driver connected to the subpixel 12 and a reading circuit such as an A/D converter can be used as the IC chip 173b, for example.

Note that a circuit 167 including the circuit 18 and the like illustrated in FIG. 1 is provided over the substrate 151 in a manner similar to that for the transistor or the like included in the pixel circuit, and the circuit 167 is electrically connected to the IC chip 173b through the wiring 165b. Part or all of the circuits included in the source driver and the column driver may be provided over the substrate 151.

FIG. 19A illustrates an example of cross sections of part of a region including the FPC 172a, part of a region including the circuit 164a, part of a region including the display portion 162, part of a region including the circuit 167, and part of a region including an end portion of the display device 100A illustrated in FIG. 18.

The display device 100A illustrated in FIG. 19A includes, between the substrate 151 and the substrate 152, a transistor 201, a transistor 205, a transistor 206, a light-emitting device 130R emitting red light, a light-emitting device 130G emitting green light, a light-receiving device 150P, and the like.

Other than a difference in the structure of pixel electrode, the light-emitting devices 130R and 130G and the light-emitting device 150P each have a stacked-layer structure similar to those of the light-emitting device and the light-receiving device illustrated in FIG. 15B.

The light-emitting device 130R includes a conductive layer 112a, a conductive layer 126a over the conductive layer 112a, and a conductive layer 129a over the conductive layer 126a. All of the conductive layers 112a, 126a, and 129a can be referred to as pixel electrodes, or one or two of them can be referred to as pixel electrodes.

The light-emitting device 130G includes a conductive layer 112b, a conductive layer 126b over the conductive layer 112b, and a conductive layer 129b over the conductive layer 126b.

The light-receiving device 150P includes a conductive layer 112d, a conductive layer 126d over the conductive layer 112d, and a conductive layer 129d over the conductive layer 126d.

The conductive layer 112a is connected to a conductive layer 222b included in the transistor 205 through the opening provided in the insulating layer 214. An end portion of the conductive layer 126a is positioned on the outer side of an end portion of the conductive layer 112a. The end portion of the conductive layer 126a and the end portion of the conductive layer 129a are aligned or substantially aligned with each other. A conductive layer functioning as a reflective electrode can be used as the conductive layer 112a and the conductive layer 126a, and a conductive layer functioning as a transparent electrode can be used as the conductive layer 129a, for example.

Since the conductive layers 112b, 126b, and 129b of the light-emitting device 130G and the conductive layers 112d, 126d, and 129d of the light-receiving device 150P are similar to the conductive layers 112a, 126a, and 129a of the light-emitting device 130R, the detailed description thereof is omitted.

Depressed portions are formed in the conductive layers 112a, 112b, and 112d to cover the openings provided in the insulating layer 214. A layer 128 is embedded in the depressed portions.

The layer 128 has a function of filling the depressed portions of the conductive layers 112a, 112b, and 112d. The conductive layers 126a, 126b, and 126d electrically connected to the conductive layers 112a, 112b, and 112d, respectively, are provided over the conductive layers 112a, 112b, and 112d and the layer 128. Thus, regions overlapping with the depressed portions of the conductive layers 112a, 112b, and 112d can also be used as the light-emitting regions or the light-receiving regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material, particularly preferably formed using an organic insulating material. For the layer 128, an organic insulating material that can be used for the insulating layer 127 can be used, for example.

The protective layer 131 is provided over the light-emitting devices 130R and 130G and the light-receiving device 150P. A solid sealing structure, a hollow sealing structure, or the like can be employed to seal the light-emitting devices and the light-receiving device. In FIG. 19A, a solid sealing structure is employed, in which a space between the substrate 152 and the substrate 151 is filled with the adhesive layer 122.

Alternatively, a hollow sealing structure may be employed, in which the space is filled with an inert gas (e.g., nitrogen or argon). In this case, the adhesive layer 122 may be provided not to overlap with the light-emitting devices and the light-receiving device. Alternatively, the space may be filled with a resin other than the frame-like adhesive layer 122.

The display device 100A is a top-emission display device. Light emitted from the light-emitting devices is emitted toward the substrate 152. For the substrate 152, a material having a high visible-light-transmitting property is preferably used. The pixel electrode contains a material that reflects visible light, and the counter electrode (the common electrode 117) contains a material that transmits visible light.

A stacked-layer structure of the substrate 151 and the components thereover up to the insulating layer 214 corresponds to the layer 101 including transistors in Embodiment 1.

The transistors 201, 205, and 206 are formed over the substrate 151. The transistors 201 and 205 can be fabricated using the same materials in the same steps.

The transistor 206 is a vertical transistor included in the circuit 167. Embodiment 2 can be referred to for the details of the vertical transistor. In the transistors 201, 205, and 206, the semiconductor layers can include the same materials, the insulating layers can include the same materials, and the conductive layers can include the same materials.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen are not easily diffused is preferably used for at least one of the insulating layers covering the transistors. This is because such an insulating layer can function as a barrier layer. Such a structure can effectively inhibit diffusion of impurities into the transistors from the outside and improve the reliability of a display device.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating layer and an inorganic insulating layer. The outermost layer of the insulating layer 214 preferably has a function of an etching protective layer. Thus, the formation of a depressed portion in the insulating layer 214 can be inhibited in processing the conductive layer 112a, the conductive layer 126a, the conductive layer 129a, or the like. Alternatively, a depressed portion may be formed in the insulating layer 214 in processing the conductive layer 112a, the conductive layer 126a, the conductive layer 129a, or the like.

Each of the transistors 201 and 205 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a vertical transistor, a planar transistor, a fin-type transistor, a staggered transistor, or an inverted staggered transistor can be used. Either a top-gate transistor or a bottom-gate transistor can be used. Alternatively, gates may be provided above and below a semiconductor layer where a channel is formed.

The structure in which the semiconductor layer where a channel is formed is provided between two gates is employed for the transistors 201 and 205. The two gates may be connected to each other and supplied with the same signal to operate the transistor. Alternatively, the threshold voltage of the transistor may be controlled by supplying a potential for controlling the threshold voltage to one of the two gates and supplying a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, an OS transistor including a metal oxide in its channel formation region is preferably used in the display device of this embodiment. For a metal oxide that can be used for the OS transistor, the description of Embodiment 2 can be referred to.

The transistors included in the circuit 164a and the transistors included in the display portion 162 may have the same structure or different structures. One structure or two or more kinds of structures may be employed for a plurality of transistors included in the circuit 164a. Similarly, one structure or two or more kinds of structures may be employed for a plurality of transistors included in the display portion 162.

All of the transistors included in the display portion 162 may be OS transistors or transistors each including silicon in its channel formation region (hereinafter, Si transistors). Alternatively, some of the transistors included in the display portion 162 may be OS transistors and the others may be Si transistors.

Examples of silicon include single crystal silicon, polycrystalline silicon, and amorphous silicon. In particular, a transistor containing low-temperature polysilicon (LTPS) in its semiconductor layer (hereinafter also referred to as an LTPS transistor) can be used. The LTPS transistor has high field-effect mobility and excellent frequency characteristics.

With the use of Si transistors such as LTPS transistors, a circuit required to be driven at a high frequency (e.g., a source driver circuit) can be formed over the same substrate as the display portion. This allows simplification of an external circuit mounted on the display device and a reduction in costs of parts and mounting costs.

For example, when both an LTPS transistor and an OS transistor are used in the display portion 162, the display device can have low power consumption and high drive capability. Note that a structure in which the LTPS transistor and the OS transistor are combined is referred to as LTPO in some cases. As a favorable example, it is preferable that the OS transistor be used as a transistor functioning as a switch for controlling conduction or non-conduction between wirings and the LTPS transistor be used as a transistor for controlling current.

For example, one transistor included in the display portion 162 may function as a transistor for controlling current flowing through the light-emitting device and be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

By contrast, another transistor included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or lower); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting device having a metal maskless (MML) structure. With this structure, the leakage current that might flow through the transistor and the leakage current that might flow between adjacent light-emitting devices (also referred to as a lateral leakage current, a side leakage current, or the like) can become extremely low. With the structure, a viewer can observe any one or more of the image clearness, the image sharpness, a high chroma, and a high contrast ratio in an image displayed on the display device. When the leakage current that might flow through the transistor and the lateral leakage current that might flow between light-emitting devices are extremely low, display with little leakage of light at the time of black display (what is called black floating) can be achieved.

In particular, in the case where a light-emitting device having an MML structure employs the structure including the subpixels emitting light of different colors, a layer provided between light-emitting devices (for example, also referred to as an organic layer or a common layer which is shared by the light-emitting devices) is disconnected; accordingly, display with no or extremely small side leakage current can be achieved.

FIGS. 19B and 19C illustrate other structure examples of the transistor that can be used as the transistors 201 and 205.

A transistor 209 and a transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between at least the conductive layer 223 and the channel formation region 231i. Furthermore, an insulating layer 218 covering the transistor may be provided.

FIG. 19B illustrates an example of the transistor 209 where the insulating layer 225 covers top and side surfaces of the semiconductor layer 231. The conductive layers 222a and 222b are connected to the corresponding low-resistance regions 231n through openings provided in the insulating layers 225 and 215. One of the conductive layers 222a and 222b functions as a source, and the other functions as a drain.

In the transistor 210 illustrated in FIG. 19C, the insulating layer 225 overlaps with the channel formation region 231i of the semiconductor layer 231 and does not overlap with the low-resistance regions 231n. The structure illustrated in FIG. 19C is obtained by processing the insulating layer 225 using the conductive layer 223 as a mask, for example. In FIG. 19C, the insulating layer 215 is provided to cover the insulating layer 225 and the conductive layer 223, and the conductive layers 222a and 222b are connected to the corresponding low-resistance regions 231n through the openings in the insulating layer 215.

The connection portion 204 is provided in a region of the substrate 151 not overlapping with the substrate 152. In the connection portion 204, the wiring 165 is electrically connected to the FPC 172a through the conductive layer 166 and a connection layer 242. An example is illustrated where the conductive layer 166 has a stacked-layer structure of a conductive film obtained by processing the same conductive film as the conductive layers 112a, 112b, and 112d; a conductive film obtained by processing the same conductive film as the conductive layers 126a, 126b, and 126d; and a conductive film obtained by processing the same conductive film as the conductive layers 129a, 129b, and 129d. On a top surface of the connection portion 204, the conductive layer 166 is exposed. Thus, the connection portion 204 and the FPC 172a can be electrically connected to each other through the connection layer 242.

The light-blocking layer 135 is preferably provided on a surface of the substrate 152 on the substrate 151 side. The light-blocking layer 135 can be provided over a region between adjacent light-emitting devices, in the circuit 164a, and the like. A variety of optical members can be arranged on the outer surface of the substrate 152.

A material that can be used for the substrate 120 can be used for each of the substrates 151 and 152.

As the connection layer 242, an anisotropic conductive film (ACF), an anisotropic conductive paste (ACP), or the like can be used.

At least part of this embodiment can be implemented in combination with any of the other embodiments described in this specification, as appropriate.

Embodiment 8

In this embodiment, a light-emitting device that can be used in the display device of one embodiment of the present invention will be described.

Figure 20A:
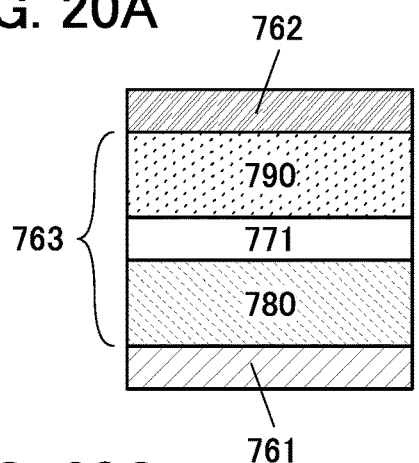
FIGS. 20A to 20F illustrate structure examples of light-emitting devices.

As illustrated in FIG. 20A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance (also referred to as a light-emitting material).

In the case where the lower electrode 761 is an anode and the upper electrode 762 is a cathode, the layer 780 includes one or more of a layer containing a substance having a high hole-injection property (a hole-injection layer), a layer containing a substance having a high hole-transport property (a hole-transport layer), and a layer containing a substance having a high electron-blocking property (an electron-blocking layer). The layer 790 includes one or more of a layer containing a substance having a high electron-injection property (an electron-injection layer), a layer containing a substance having a high electron-transport property (an electron-transport layer), and a layer containing a substance having a high hole-blocking property (a hole-blocking layer). In the case where the lower electrode 761 is a cathode and the upper electrode 762 is an anode, the structures of the layers 780 and 790 are replaced with each other.

The structure including the layer 780, the light-emitting layer 771, and the layer 790, which is provided between a pair of electrodes, can function as a single light-emitting unit, and the structure in FIG. 20A is referred to as a single structure in this specification.

Figure 20B:
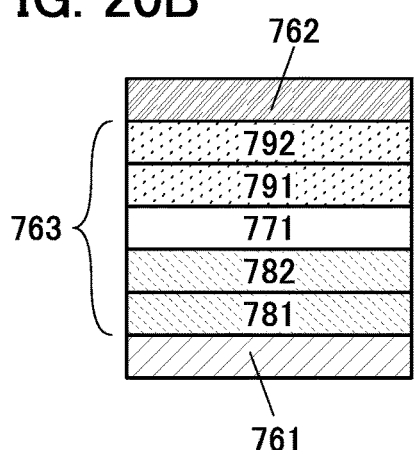

FIG. 20B is a variation example of the EL layer 763 included in the light-emitting device illustrated in FIG. 20A. Specifically, the light-emitting device illustrated in FIG. 20B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a layered structure, carriers can be efficiently injected to the light-emitting layer 771, and the efficiency of the recombination of carriers in the light-emitting layer 771 can be enhanced.

Figure 20C:
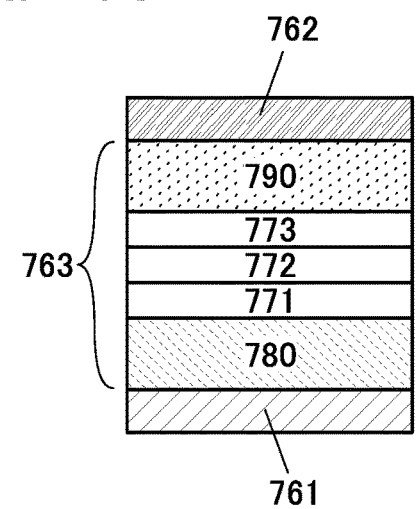
Figure 20D:
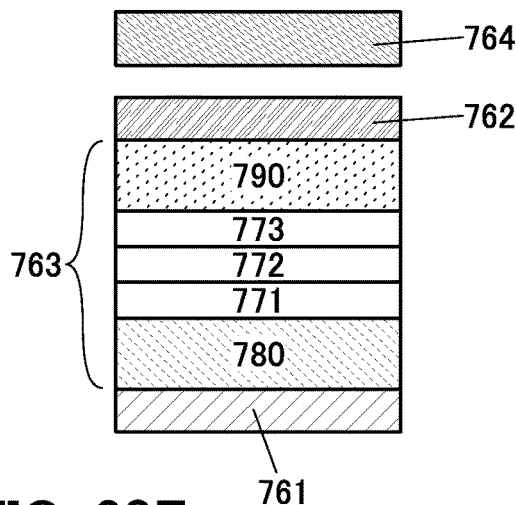

Note that structures in which a plurality of light-emitting layers (light-emitting layers 771, 772, and 773) are provided between the layers 780 and 790 as illustrated in FIGS. 20C and 20D are other variations of the single structure. Although FIGS. 20C and 20D illustrate the examples where three light-emitting layers are included, the number of light-emitting layers in the light-emitting device having a single structure may be two or four or more. In addition, the light-emitting device having a single structure may include a buffer layer between two light-emitting layers.

Figure 20E:
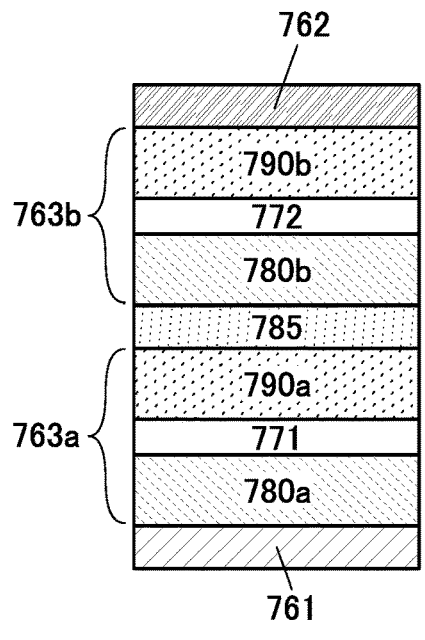
Figure 20F:
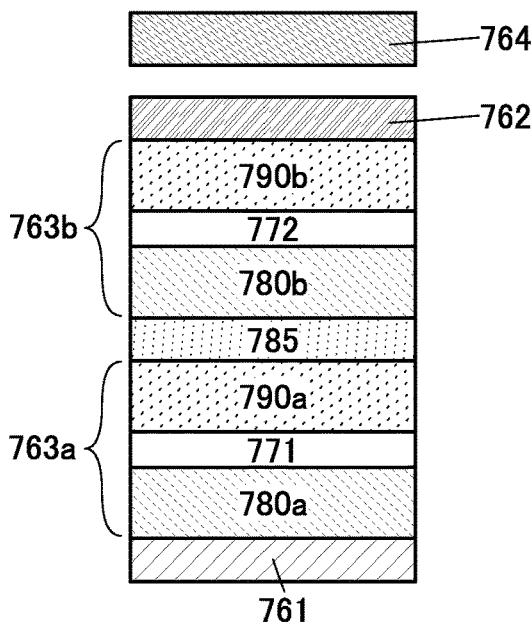

In this specification, as illustrated in FIGS. 20E and 20F, a structure in which a plurality of light-emitting units (a light-emitting unit 763a and a light-emitting unit 763b) are connected in series with a charge-generation layer 785 (also referred to as an intermediate layer) therebetween is referred to as a tandem structure. Note that a tandem structure may be referred to as a stack structure. The tandem structure enables a light-emitting device capable of high-luminance light emission. Furthermore, a tandem structure allows the amount of current needed for obtaining the same luminance to be reduced as compared to the case of using a single structure, and thus can improve the reliability.

Note that FIGS. 20D and 20F illustrate examples where the display device includes a layer 764 overlapping with the light-emitting device. FIG. 20D illustrates an example where the layer 764 overlaps with the light-emitting device illustrated in FIG. 20C, and FIG. 20F illustrates an example where the layer 764 overlaps with the light-emitting device illustrated in FIG. 20E.

One or both of a color conversion layer and a color filter (coloring layer) can be used as the layer 764.

In FIGS. 20C and 20D, light-emitting substances emitting light of the same color or the same light-emitting substance may be used for the light-emitting layers 771, 772, and 773. For example, a light-emitting substance emitting blue light may be used for each of the light-emitting layers 771, 772, and 773. In a subpixel emitting blue light, blue light emitted from the light-emitting device can be extracted. In each of a subpixel emitting red light and a subpixel emitting green light, a color conversion layer is provided as the layer 764 illustrated in FIG. 20D for converting blue light emitted from the light-emitting device into light with a longer wavelength, so that red light or green light can be extracted.

Light-emitting substances emitting light of different colors may be used for the light-emitting layers 771, 772, and 773. White light is obtained when the light-emitting layers 771, 772, and 773 emit light of complementary colors. The light-emitting device having a single structure preferably includes a light-emitting layer containing a light-emitting substance emitting blue light and a light-emitting layer containing a light-emitting substance emitting visible light with a longer wavelength than blue light, for example.

In the case where the light-emitting device having a single structure includes three light-emitting layers, for example, a light-emitting layer containing a light-emitting substance emitting red (R) light, a light-emitting layer containing a light-emitting substance emitting green (G) light, and a light-emitting layer containing a light-emitting substance emitting blue (B) light are preferably included. The stacking order of the light-emitting layers can be RGB or RBG from the anode side, for example. In that case, a buffer layer may be provided between R and G or between R and B.

For example, in the case where the light-emitting device having a single structure includes two light-emitting layers, the light-emitting device preferably includes a light-emitting layer containing a light-emitting substance emitting blue (B) light and a light-emitting layer containing a light-emitting substance emitting yellow (Y) light. Such a structure may be referred to as a BY single structure.

A color filter may be provided as the layer 764 illustrated in FIG. 20D. When white light passes through a color filter, light of a desired color can be obtained.

In the light-emitting device emitting white light, two or more kinds of light-emitting substances are preferably contained. To obtain white light, the two or more kinds of light-emitting substances are selected so as to emit light of complementary colors. For example, when emission colors of a first light-emitting layer and a second light-emitting layer are complementary colors, the light-emitting device can emit white light as a whole. The same applies to a light-emitting device including three or more light-emitting layers.

In FIGS. 20E and 20F, light-emitting substances emitting light of the same color or the same light-emitting substance may be used for the light-emitting layers 771 and 772.

For example, in light-emitting devices included in subpixels emitting light of different colors, a light-emitting substance emitting blue light may be used for each of the light-emitting layers 771 and 772. In a subpixel emitting blue light, blue light emitted from the light-emitting device can be extracted. In each of a subpixel emitting red light and a subpixel emitting green light, a color conversion layer is provided as the layer 764 illustrated in FIG. 20F for converting blue light emitted from the light-emitting device into light with a longer wavelength, so that red light or green light can be extracted.

In the case where the light-emitting device having any of the structures illustrated in FIG. 20E or 20F is used for the subpixels emitting different colors, the subpixels may use different light-emitting substances. Specifically, in the light-emitting device included in the subpixel emitting red light, a light-emitting substance emitting red light may be used for each of the light-emitting layers 771 and 772. Similarly, in the light-emitting device included in the subpixel emitting green light, a light-emitting substance emitting green light may be used for each of the light-emitting layers 771 and 772. In the light-emitting device included in the subpixel emitting blue light, a light-emitting substance emitting blue light may be used for each of the light-emitting layers 771 and 772. A display device having such a structure employs a light-emitting device having the tandem structure and thus is capable of high-luminance light emission and highly reliable.

In FIGS. 20E and 20F, light-emitting substances emitting light of different colors may be used for the light-emitting layers 771 and 772. White light is obtained when the light-emitting layers 771 and 772 emit light of complementary colors. A color filter may be provided as the layer 764 illustrated in FIG. 20F. When white light passes through a color filter, light of a desired color can be obtained.

Although FIGS. 20E and 20F illustrate examples where the light-emitting unit 763a includes one light-emitting layer 771 and the light-emitting unit 763b includes one the light-emitting layer 772, one embodiment of the present invention is not limited thereto. The light-emitting units 763a and 763b may each include two or more light-emitting layers.

In addition, although FIGS. 20E and 20F illustrate the light-emitting device including two light-emitting units, one embodiment of the present invention is not limited thereto. The light-emitting device may include three or more light-emitting units.

Figure 21A:
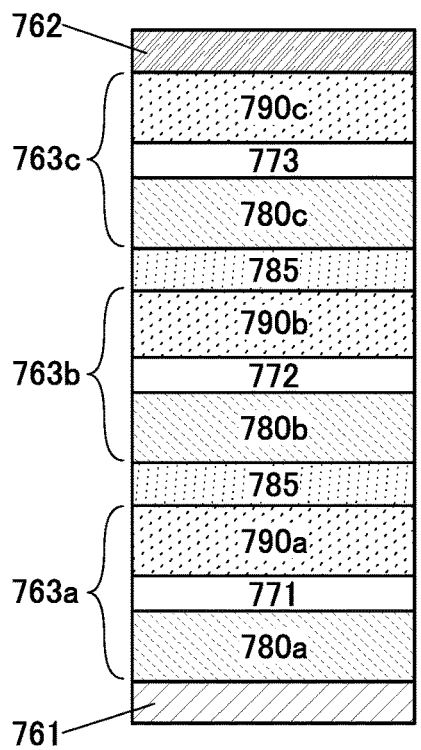
FIGS. 21A to 21C illustrate structure examples of light-emitting devices.
Figure 21B:
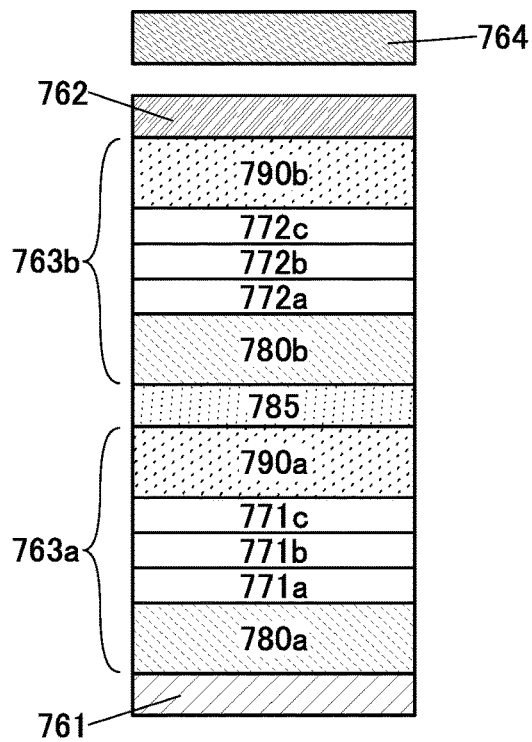
Figure 21C:
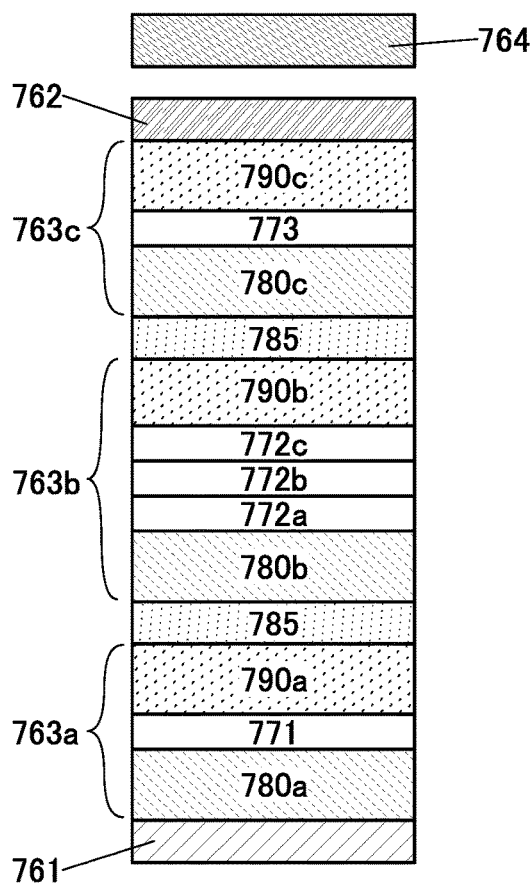

Specifically, the light-emitting device may have any of structures illustrated in FIGS. 21A to 21C.

FIG. 21A shows a structure including three light-emitting units. Note that a structure including two light-emitting units and a structure including three light-emitting units may be referred to as a two-unit tandem structure and a three-unit tandem structure, respectively.

In the structure illustrated in FIG. 21A, a plurality of light-emitting units (the light-emitting units 763a and 763b and a light-emitting unit 763c) are connected in series with the charge-generation layer 785 provided between each two light-emitting units. The light-emitting unit 763a includes a layer 780a, the light-emitting layer 771, and a layer 790a. The light-emitting unit 763b includes a layer 780b, the light-emitting layer 772, and a layer 790b. The light-emitting unit 763c includes a layer 780c, the light-emitting layer 773, and a layer 790c.

In the structure illustrated in FIG. 21A, the light-emitting layers 771, 772, and 773 each preferably contain a light-emitting substance emitting light of the same color. Specifically, the light-emitting layers 771, 772, and 773 can each contain a light-emitting substance emitting red (R) light (i.e., a so-called R\R\R three-unit tandem structure), can each contain a light-emitting substance emitting green (G) light (i.e., a so-called G\G\G three-unit tandem structure), or can each contain a light-emitting substance emitting blue (B) light (i.e., a so-called B\B\B three-unit tandem structure).

Note that the structures of the light-emitting substances emitting light of the same color are not limited to the above structure. For example, a light-emitting device having a tandem structure may be employed in which light-emitting units each containing a plurality of light-emitting substances are stacked as illustrated in FIG. 21B. FIG. 21B illustrates a structure in which a plurality of light-emitting units (the light-emitting units 763a and 763b) are connected in series with the charge-generation layer 785 therebetween. The light-emitting unit 763a includes the layer 780a, a light-emitting layer 771a, a light-emitting layer 771b, a light-emitting layer 771c, and the layer 790a. The light-emitting unit 763b includes the layer 780b, a light-emitting layer 772a, a light-emitting layer 772b, a light-emitting layer 772c, and the layer 790b.

In the structure illustrated in FIG. 21B, light-emitting substances for the light-emitting layers 771a, 771b, and 771c are selected so as to emit light of complementary colors to obtain white (W) light emission. Furthermore, light-emitting substances for the light-emitting layers 772a, 772b, and 772c are selected so as to emit light of complementary colors to obtain white (W) light emission. That is, the structure illustrated in FIG. 21C is a two-unit tandem structure of W\W. Note that there is no particular limitation on the stacking order of the light-emitting layers 771a, 771b, and 771c containing light-emitting substances emitting light of complementary colors. The practitioner can select the optimal stacking order as appropriate. Although not illustrated, a three-unit tandem structure of W\W\W or a tandem structure with four or more units may be employed.

In the case of a light-emitting device having a tandem structure, any of the following structure may be employed, for example: a two-unit tandem structure of B including a light-emitting unit emitting yellow (Y) light and a light-emitting unit emitting blue (B) light; a two-unit tandem structure of R•G\B including a light-emitting unit emitting red (R) and green (G) light and a light-emitting unit emitting blue (B) light; a three-unit tandem structure of B\Y\B including a light-emitting unit emitting blue (B) light, a light-emitting unit emitting yellow (Y) light, and a light-emitting unit emitting blue (B) light in this order; a three-unit tandem structure of B\YG\B including a light-emitting unit emitting blue (B) light, a light-emitting unit emitting yellowish-green (YG) light, and a light-emitting unit emitting blue (B) light in this order; and a three-unit tandem structure of B\G\B including a light-emitting unit emitting blue (B) light, a light-emitting unit emitting green (G) light, and a light-emitting unit emitting blue (B) light in this order.

Alternatively, a light-emitting unit containing one light-emitting substance and a light-emitting unit containing a plurality of light-emitting substances may be used in combination as illustrated in FIG. 21C.

Specifically, in the structure illustrated in FIG. 21C, a plurality of light-emitting units (the light-emitting units 763a, 763b, and 763c) are connected in series with the charge-generation layer 785 provided between each two light-emitting units. The light-emitting unit 763a includes the layer 780a, the light-emitting layer 771, and the layer 790a. The light-emitting unit 763b includes the layer 780b, the light-emitting layer 772a, the light-emitting layer 772b, the light-emitting layer 772c, and the layer 790b. The light-emitting unit 763c includes the layer 780c, the light-emitting layer 773, and the layer 790c.

The structure illustrated in FIG. 21C can be, for example, a three-unit tandem structure of B\R•G•YG\B where the light-emitting unit 763a is a light-emitting unit emitting blue (B) light, the light-emitting unit 763b is a light-emitting unit emitting red (R), green (G), and yellowish-green (YG) light, and the light-emitting unit 763c is a light-emitting unit emitting blue (B) light.

Examples of the stacked structure of light-emitting units include, from an anode side, a two-unit structure of B and Y; a two-unit structure of B and a light-emitting unit X; a three-unit structure of B, Y, and B; and a three-unit structure of B, X, and B. Examples of the stacked structure of light-emitting layers in the light-emitting unit X include, from an anode side, a two-layer structure of R and Y; a two-layer structure of R and G; a two-layer structure of G and R; a three-layer structure of G, R, and G; and a three-layer structure of R, G, and R. Another layer may be provided between two light-emitting layers.

In FIGS. 20C and 20D, each of the layers 780 and 790 may independently has a stacked-layer structure of two or more layers as in FIG. 20B.

In FIGS. 20E and 20F, the light-emitting unit 763a includes the layer 780a, the light-emitting layer 771, and the layer 790a, and the light-emitting unit 763b includes the layer 780b, the light-emitting layer 772, and the layer 790b.

In the case where the lower electrode 761 is an anode and the upper electrode 762 is a cathode, and the layers 780a and 780b each include one or more of a hole-injection layer, a hole-transport layer, and an electron-blocking layer. The layers 790a and 790b each include one or more of an electron-injection layer, an electron-transport layer, and a hole-blocking layer. In the case where the lower electrode 761 is a cathode and the upper electrode 762 is an anode, the structures of the layers 780a and 790a are replaced with each other, and the structures of the layers 780b and 790b are also replaced with each other.

In the case where the lower electrode 761 is an anode and the upper electrode 762 is a cathode, for example, the layer 780a includes a hole-injection layer and a hole-transport layer over the hole-injection layer, and may further include an electron-blocking layer over the hole-transport layer. The layer 790a includes an electron-transport layer, and may further include a hole-blocking layer between the light-emitting layer 771 and the electron-transport layer. The layer 780b includes a hole-transport layer, and may further include an electron-blocking layer over the hole-transport layer. The layer 790b includes an electron-transport layer and an electron-injection layer over the electron-transport layer, and may further include a hole-blocking layer between the light-emitting layer 772 and the electron-transport layer. In the case where the lower electrode 761 is a cathode and the upper electrode 762 is an anode, for example, the layer 780a includes an electron-injection layer and an electron-transport layer over the electron-injection layer, and may further include a hole-blocking layer over the electron-transport layer. The layer 790a includes a hole-transport layer, and may further include an electron-blocking layer between the light-emitting layer 771 and the hole-transport layer. The layer 780b includes an electron-transport layer, and may further include a hole-blocking layer over the electron-transport layer. The layer 790b includes a hole-transport layer and a hole-injection layer over the hole-transport layer, and may further include an electron-blocking layer between the light-emitting layer 772 and the hole-transport layer.

In the case of manufacturing a light-emitting device having a tandem structure, two light-emitting units are stacked with the charge-generation layer 785 therebetween. The charge-generation layer 785 includes at least a charge-generation region. The charge-generation layer 785 has a function of injecting electrons into one of the two light-emitting units and injecting holes to the other when voltage is applied between the pair of electrodes.

Next, materials that can be used for the light-emitting device will be described.

A conductive film transmitting visible light is used as the electrode through which light is extracted, which is either the lower electrode 761 or the upper electrode 762. A conductive film reflecting visible light is preferably used as the electrode through which light is not extracted. In the case where a display device includes a light-emitting device emitting infrared light, a conductive film transmitting visible light and infrared light is used as the electrode through which light is extracted, and a conductive film reflecting visible light and infrared light is preferably used as the electrode through which light is not extracted.

A conductive film that transmitting visible light may be used also for the electrode through which light is not extracted. In this case, this electrode is preferably provided between the reflective layer and the EL layer 763. In other words, light emitted from the EL layer 763 may be reflected by the reflective layer to be extracted from the display device.

For the pair of electrodes of the light-emitting device, a metal, an alloy, an electrically conductive compound, a mixture thereof, and the like can be used as appropriate. Specific examples of the material include metals such as aluminum, titanium, chromium, manganese, iron, cobalt, nickel, copper, gallium, zinc, indium, tin, molybdenum, tantalum, tungsten, palladium, gold, platinum, silver, yttrium, and neodymium, and an alloy containing any of these metals in appropriate combination. Other examples of the material include indium tin oxide (In—Sn oxide, also referred to as ITO), In—Si—Sn oxide (also referred to as ITSO), indium zinc oxide (In—Zn oxide), and In—W—Zn oxide. Other examples of the material include an alloy containing aluminum (aluminum alloy) such as an alloy of aluminum, nickel, and lanthanum (Al—Ni—La), and an alloy of silver, palladium, and copper (Ag—Pd—Cu, also referred to as APC). Other examples of the material include a Group 1 element and a Group 2 element of the periodic table, which are not described above (e.g., lithium, cesium, calcium, and strontium), rare earth metals such as europium and ytterbium, an alloy containing any of these elements in appropriate combination, and graphene.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

Note that the transflective electrode can have a stacked-layer structure of a conductive layer that can be used as a reflective electrode and a conductive layer having a visible-light-transmitting property (also referred to as a transparent electrode).

The transparent electrode has a light transmittance higher than or equal to 40%. For example, an electrode having a visible light (light with wavelengths greater than or equal to 400 nm and less than 750 nm) transmittance higher than or equal to 40% is preferably used in the transparent electrode of the light-emitting device. The transflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1 \times 10^{-2}$ Ωcm.

The light-emitting device includes at least a light-emitting layer. In addition to the light-emitting layer, the light-emitting device may further include a layer containing any of a substance with a high hole-injection property, a substance with a high hole-transport property, a hole-blocking material, a substance with a high electron-transport property, an electron-blocking material, a substance with a high electron-injection property, a substance with a bipolar property (also referred to as a substance with a high electron- and hole-transport property), and the like. For example, the light-emitting device can include one or more of a hole-injection layer, a hole-transport layer, a hole-blocking layer, a charge-generation layer, an electron-blocking layer, an electron-transport layer, and an electron-injection layer in addition to the light-emitting layer.

Either a low molecular compound or a high molecular compound can be used in the light-emitting device, and an inorganic compound may also be included. Each layer included in the light-emitting device can be formed, for example, by an evaporation method (including a vacuum evaporation method), a transfer method, a printing method, an inkjet method, or a coating method.

The light-emitting layer contains one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance emitting near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As the one or more kinds of organic compounds, one or both of a substance having a high hole-transport property (a hole-transport material) and a substance having a high electron-transport property (an electron-transport material) can be used. As the hole-transport material, it is possible to use a material having a high hole-transport property which can be used for the hole-transport layer and will be described later. As the electron-transport material, it is possible to use a material having a high electron-transport property which can be used for the electron-transport layer and will be described later. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

As the hole-transport material, it is possible to use a material having a high hole-transport property which can be used for the hole-transport layer and will be described later.

As the acceptor material, an oxide of a metal belonging to any of Group 4 to Group 8 of the periodic table can be used, for example. Specific examples include molybdenum oxide, vanadium oxide, niobium oxide, tantalum oxide, chromium oxide, tungsten oxide, manganese oxide, and rhenium oxide. Among these, molybdenum oxide is especially preferable since it is stable in the air, has a low hygroscopic property, and is easy to handle. Alternatively, an organic acceptor material containing fluorine can be used. Alternatively, organic acceptor materials such as a quinodimethane derivative, a chloranil derivative, and a hexaazatriphenylene derivative can also be used.

For example, a hole-transport material and a material containing an oxide of a metal belonging to any of Groups 4 to 8 of the periodic table (typically, molybdenum oxide) may be used as the material having a high hole-injection property.

The hole-transport layer transports holes injected from the anode by the hole-injection layer, to the light-emitting layer. The hole-transport layer contains a hole-transport material. The hole-transport material preferably has a hole mobility higher than or equal to $1\times10^{-6}$ cm$^2$/Vs. Note that other substances can also be used as long as the substances have a hole-transport property higher than an electron-transport property. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-blocking layer is provided in contact with the light-emitting layer. The electron-blocking layer has a hole-transport property and contains a material capable of blocking electrons. Any of the materials having an electron-blocking property among the above hole-transport materials can be used for the electron-blocking layer.

The electron-blocking layer has a hole-transport property, and thus can also be referred to as a hole-transport layer. A layer having an electron-blocking property among the hole-transport layers can also be referred to as an electron-blocking layer.

The electron-transport layer transports electrons injected from the cathode by the electron-injection layer, to the light-emitting layer. The electron-transport layer contains an electron-transport material. The electron-transport material preferably has an electron mobility higher than or equal to $1\times10^{-6}$ cm$^2$/Vs. Note that other substances can also be used as long as the substances have an electron-transport property higher than a hole-transport property. As the electron-transport material, any of the following materials with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The hole-blocking layer is provided in contact with the light-emitting layer. The hole-blocking layer has an electron-transport property and contains a material capable of blocking holes. Any of the materials having a hole-blocking property among the above electron-transport materials can be used for the hole-blocking layer.

The hole-blocking layer has an electron-transport property, and thus can also be referred to as an electron-transport layer. A layer having a hole-blocking property among the electron-transport layers can also be referred to as a hole-blocking layer.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The difference between the LUMO level of the material having a high electron-injection property and the work function value of the material used for the cathode is preferably small (specifically, smaller than or equal to 0.5 eV).

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_x$, where x is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate, for example. The electron-injection layer may have a stacked-layer structure of two or more layers. In the stacked-layer structure, for example, lithium fluoride can be used for the first layer and ytterbium can be used for the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, or a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10- phenanthroline (abbreviation: NBPhen), 2,2'-(1,3-phenylene)bis(9-phenyl-1,10-phenanthroline) (abbreviation: mPPhen2P), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition point (Tg) than BPhen and thus has high heat resistance.

As described above, the charge-generation layer includes at least a charge-generation region. The charge-generation region preferably contains an acceptor material, and for example, preferably contains a hole-transport material and an acceptor material which can be used for the hole-injection layer.

In addition, the charge-generation layer preferably includes a layer containing a material having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be used for the electron-injection buffer layer.

The charge-generation layer preferably includes a layer containing a material having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases depending on the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can inhibit an increase in driving voltage.

At least part of this embodiment can be implemented in combination with any of the other embodiments described in this specification, as appropriate.

Embodiment 9

In this embodiment, a light-receiving device that can be used for a display device of one embodiment of the present invention, and a display device having a light-emitting and light-receiving function will be described.

As the light-receiving device, a PN photodiode or a PIN photodiode can be used, for example. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound as the light-receiving device. An organic photodiode, which is easily made thin, lightweight, and large in area and has a high degree of freedom for shape and design, can be used in a variety of display devices.

[Light-Receiving Device]

Figure 22A:
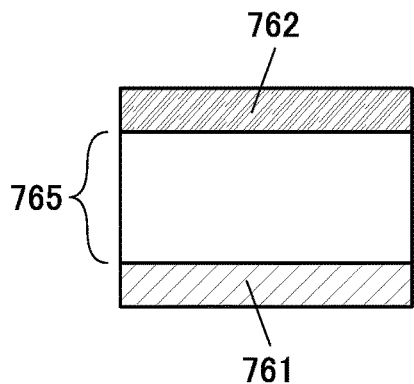
FIGS. 22A and 22B illustrate structure examples of light-receiving devices and FIGS. 22C to 22E illustrate a structure example of a display device.

As illustrated in FIG. 22A, the light-receiving device includes a layer 765 between a pair of electrodes (the lower electrode 761 and the upper electrode 762). The layer 765 includes at least one active layer, and may further include another layer.

Figure 22B:
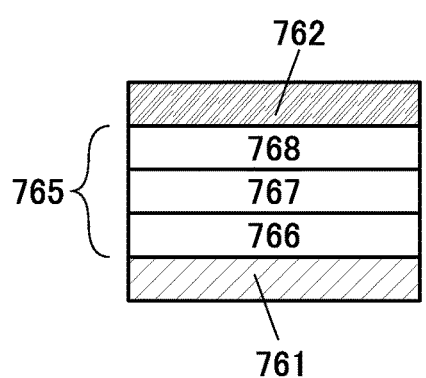

FIG. 22B is a variation example of the EL layer 765 included in the light-receiving device illustrated in FIG. 22A. Specifically, the light-receiving device illustrated in FIG. 22B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the structures of the layers 766 and 768 are replaced with each other.

Here, the display device of one embodiment of the present invention may include a layer shared by the light-receiving device and the light-emitting device (also referred to as a continuous layer included in the light-receiving device and the light-emitting device). Such a layer may have a different function depending on which device the layer is in. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device may have the same function in both the light-receiving device and the light-emitting device. For example, the hole-transport layer functions as a hole-transport layer in both the light-emitting device and the light-receiving device, and the electron-transport layer functions as an electron-transport layer in both the light-emitting device and the light-receiving device.

Next, materials that can be used for the light-receiving device will be described.

Either a low molecular compound or a high molecular compound can be used for the light-receiving device, and an inorganic compound may also be included. Each layer included in the light-receiving device can be formed, for example, by an evaporation method (including a vacuum evaporation method), a transfer method, a printing method, an inkjet method, or a coating method.

The active layer included in the light-receiving device includes a semiconductor. Examples of the semiconductor include an inorganic semiconductor such as silicon and an organic semiconductor including an organic compound. This embodiment describes an example where an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1'',4',4''-tetrahydro-di[1,4]methanonaphthaleno[1,2:2',3'56,60:2'',3''][5,6]fullerene-$C_{60}$ (abbreviation: ICBA).

Examples of the material of the n-type semiconductor include perylenetetracarboxylic acid derivatives such as N,N-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H, 8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer is preferably formed by co-evaporation of an n-type semiconductor and a p-type semiconductor. Alternatively, the active layer may be formed by stacking an n-type semiconductor and a p-type semiconductor.

Three or more kinds of materials may be mixed for the active layer. A third material may be mixed with an n-type semiconductor material and a p-type semiconductor material in order to extend the wavelength range. In this case, the third material may be a low molecular compound or a high molecular compound.

In addition to the active layer, the light-receiving device may further include a layer containing a substance having a high hole-transport property, a substance having a high electron-transport property, a substance having a bipolar property (a substance having a high electron- and hole-transport property), or the like. Without limitation to the above, the light-receiving device may further include a substance having a high hole-injection property, a hole-blocking material, a substance having a high electron-injection property, an electron-blocking material, or the like. Layers other than the active layer in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuT) can be used. As the electron-transport material or the hole-blocking material, an inorganic compound such as zinc oxide (ZnO), or an organic compound such as polyethylenimine ethoxylate (PETE) can be used. The light-receiving device may include a mixed film of PEIE and ZnO, for example.

[Display Device Having Light Detection Function]

In the display device of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light at the display portion, an image can be captured or the approach or contact of an object (e.g., a finger, a hand, or a stylus) can be detected. In other words, the display device including the light-receiving device can function as a touch panel.

Furthermore, in the display device of one embodiment of the present invention, the light-emitting devices can be used as a light source of the sensor. In the display device of one embodiment of the present invention, when an object reflects (or scatters) light emitted from the light-emitting device included in the display portion, the light-receiving device can detect the reflected light (or the scattered light); thus, image capturing or touch sensing is possible even in a dark place.

Accordingly, a light-receiving portion and a light source do not need to be provided separately from the display device; hence, the number of components of an electronic device can be reduced. For example, a biometric authentication device provided in the electronic device, a capacitive touch panel for scroll operation, or the like is not necessarily provided separately. Thus, with the use of the display device of one embodiment of the present invention, the electronic device can be provided at lower manufacturing costs.

Specifically, the display device of one embodiment of the present invention includes a light-emitting device and a light-receiving device in a pixel. In the display device of one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display device including the organic EL device.

The display device can detect the touch or approach of an object while displaying an image because the pixel included in the display device includes the light-emitting device and the light-receiving device and thus has a light-receiving function. For example, an image can be displayed by using all the subpixels included in a display device; or light can be emitted by some of the subpixels as a light source and an image can be displayed by using the remaining subpixels.

When the light-receiving device is used as an image sensor, the display device can capture an image with the use of the light-receiving device. For example, the display device of this embodiment can be used as a scanner.

For example, image capturing for personal authentication with the use of a fingerprint, a palm print, the iris, the shape of a blood vessel (including the shape of a vein and the shape of an artery), a face, or the like is possible by using the image sensor.

For example, an image of the periphery, surface, or inside (e.g., fundus) of an eye of a user of a wearable device can be captured with the use of the image sensor. Therefore, the wearable device can have a function of sensing one or more selected from blinking, movement of an iris, and movement of an eyelid of the user.

Moreover, the light-receiving device can be used in a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect an approach or contact of an object (e.g., a finger, a hand, or a pen).

The touch sensor can detect the object when the display device and the object come in direct contact with each other. Furthermore, the near touch sensor can detect the object even when the object is not in contact with the display device. For example, the display device is preferably capable of sensing an object positioned in the range of 0.1 mm to 300 mm inclusive, more preferably 3 mm to 50 mm inclusive from the display device. This structure enables the display device to be operated without direct contact of an object. In other words, the display device can be operated in a contactless (touchless) manner. With the above-described structure, the display device can have a reduced risk of being dirty or damaged, or can be controlled without the object directly touching a dirt (e.g., dust, bacteria, or a virus) attached to the display device.

The refresh rate of the display device of one embodiment of the present invention can be variable. For example, the refresh rate is adjusted (in the range from 1 Hz to 240 Hz, for example) in accordance with contents displayed on the display device, whereby power consumption can be reduced. The driving frequency of the touch sensor or the near touch sensor may be changed in accordance with the refresh rate. In the case where the refresh rate of the display device is 120 Hz, for example, the drive frequency of a touch sensor or a near touch sensor can be higher than 120 Hz (typically 240 Hz). With this structure, low power consumption can be achieved, and the response speed of the touch sensor or the near touch sensor can be increased.

In the display device of one embodiment of the present invention, a lens can be provided over the light-receiving device. The lens having a larger width than a light-receiving portion can improve light condensing capability, and accordingly the light-receiving device can have improved sensitivity to light.

Figure 22C:
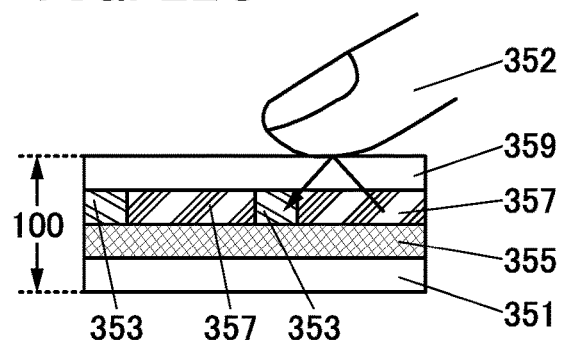
Figure 22D:
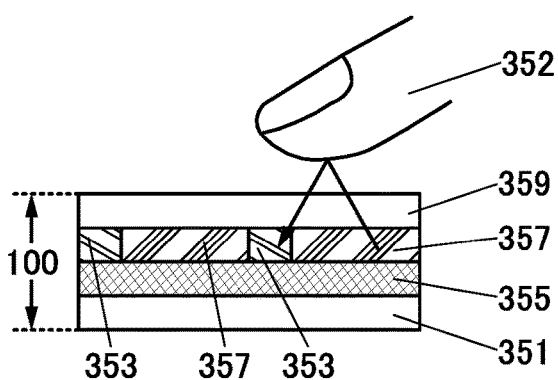
Figure 22E:
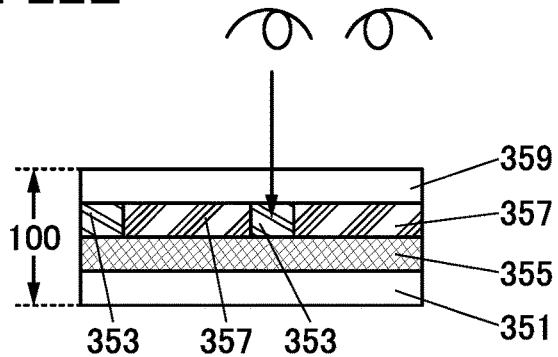

The display device 100 illustrated in FIGS. 22C to 22E includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch or a transistor may be employed.

For example, after light emitted from the light-emitting device in the layer 357 including light-emitting devices is reflected by a finger 352 that touches the display device 100 as illustrated in FIG. 22C, the light-receiving device in the layer 353 including light-receiving devices detects the reflected light. Thus, the touch of the finger 352 on the display device 100 can be detected.

The display device may have a function of detecting an object that is approaching (but is not touching) the display device or capturing an image of such an object, as illustrated in FIGS. 22D and 22E. FIG. 22D illustrates an example where a human finger is detected, and FIG. 22E illustrates an example where information on the periphery, surface, or inside of the human eye (e.g., the number of blinks, the movement of an eyeball, and the movement of an eyelid) is detected.

At least part of this embodiment can be implemented in combination with any of the other embodiments described in this specification, as appropriate.

Embodiment 10

In this embodiment, electronic devices of embodiments of the present invention will be described with reference to FIGS. 23A to 23F and FIGS. 24A to 24G.

Electronic devices of this embodiment are each provided with the display device of one embodiment of the present invention in a display portion. The display device of one embodiment of the present invention can be easily increased in resolution and definition. Thus, the display device of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
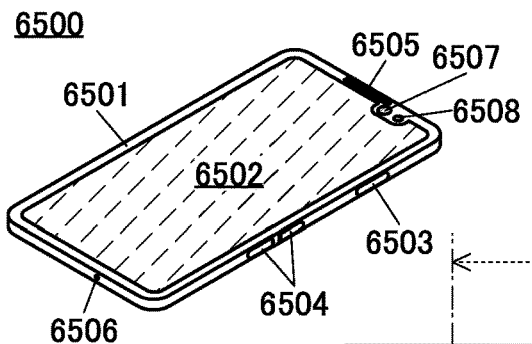
FIGS. 23A to 23F illustrate examples of electronic devices.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used for the display portion 6502. Since the aperture ratio of the pixel can be increased, the display device of one embodiment of the present invention has high outcoupling efficiency and can display an extremely bright image.

Figure 23B:
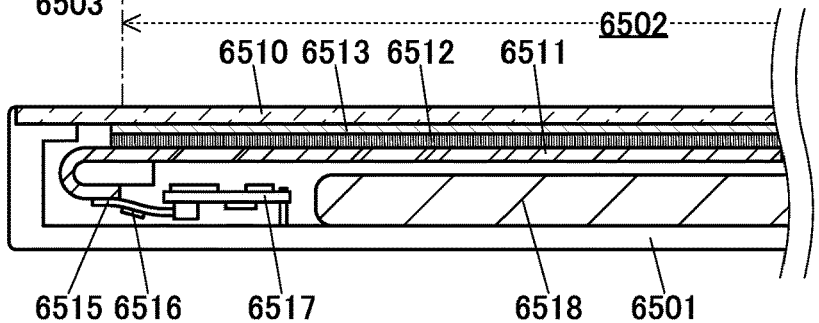

FIG. 23B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch panel 6513, a printed circuit board 6517, a battery 6518, and the like are provided in a space surrounded by the housing 6501 and the protection member 6510.

The display panel 6511, the optical member 6512, and the touch panel 6513 are fixed to the protection member 6510 with an adhesive layer (not illustrated). The light-receiving device of the display device of one embodiment of the present invention can have the function of the touch panel. The light-receiving device of the display device of one embodiment of the present invention is configured to detect light through a lens, has high sensitivity to light, and excels in detecting a touched position. Moreover, an image for fingerprint authentication can be obtained with the use of the light-receiving device.

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 23C:
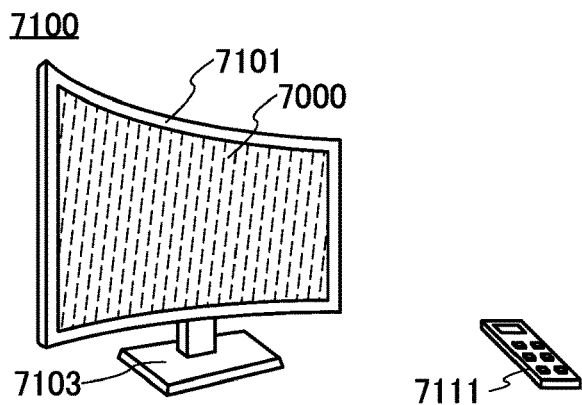

FIG. 23C illustrates an example of a television device. In a television device 7100, a display portion 7000 is incorporated in a housing 7101. Here, the housing 7101 is supported by a stand 7103.

The display device of one embodiment of the present invention can be used for the display portion 7000. Since the aperture ratio of the pixel can be increased, the display device of one embodiment of the present invention has high outcoupling efficiency and can display an extremely bright image.

Operation of the television device 7100 illustrated in FIG. 23C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network by wire or wirelessly via the modem, one-way (from a transmitter to a receiver) or two-way (between a transmitter and a receiver or between receivers, for example) data communication can be performed.

Figure 23D:
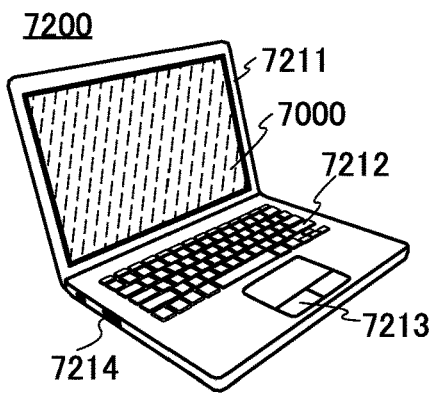

FIG. 23D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used for the display portion 7000. Since the aperture ratio of the pixel can be increased, the display device of one embodiment of the present invention has high outcoupling efficiency and can display an extremely bright image.

Figure 23E:
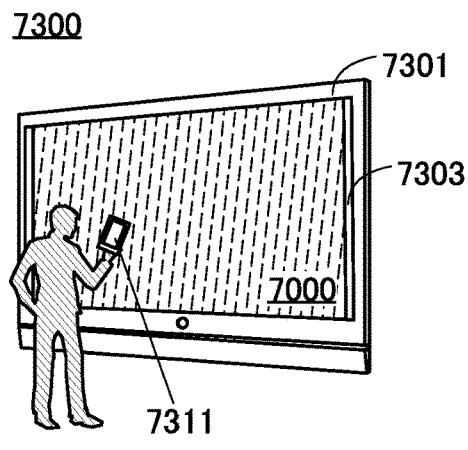
Figure 23F:
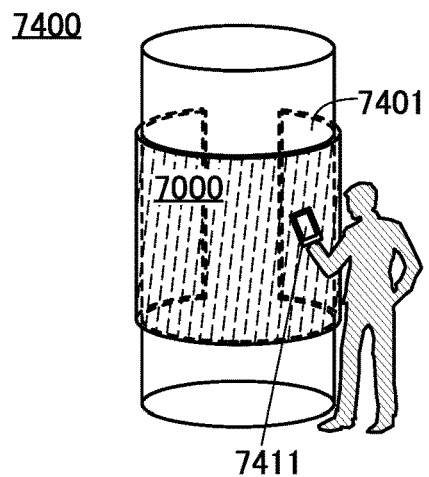

FIGS. 23E and 23F illustrate examples of digital signage.

Digital signage 7300 illustrated in FIG. 23E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 23F illustrates digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIGS. 23E and 23F. Since the aperture ratio of the pixel can be increased, the display device of one embodiment of the present invention has high outcoupling efficiency and can display an extremely bright image.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation. The touch panel can include the light-receiving device of the display device of one embodiment of the present invention. The light-receiving device of the display device of one embodiment of the present invention is configured to detect light through a lens and has high sensitivity to light. Thus, the touch panel can have high sensitivity and excel in detecting a touched position.

As illustrated in FIGS. 23E and 23F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 24A to 24G include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 24A to 24G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 24A to 24G are described in detail below. The display device of one embodiment of the present invention can be applied to the electronic devices. Since the aperture ratio of the pixel can be increased, the display device of one embodiment of the present invention has high outcoupling efficiency and can display an extremely bright image. In addition, the electronic devices can have a touch panel function. The light-receiving device of the display device of one embodiment of the present invention can have the function of the touch panel. The light-receiving device of the display device of one embodiment of the present invention is configured to detect light through a lens, has high sensitivity to light, and excels in detecting a touched position. Moreover, an image for fingerprint authentication can be obtained with the use of the light-receiving device.

Figure 24A:
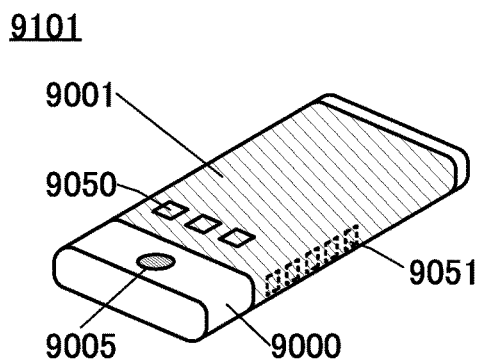
FIGS. 24A to 24G illustrate examples of electronic devices.

FIG. 24A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 24A illustrates an example where three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 24B:
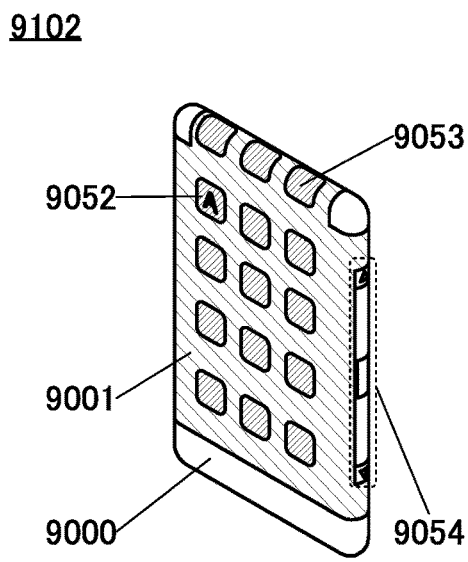

FIG. 24B is a perspective view of a portable information terminal 9102. The portable information terminal 9102 has a function of displaying information on three or more surfaces of the display portion 9001. Here, information 9052, information 9053, and information 9054 are displayed on different surfaces. The user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call.

Figure 24C:
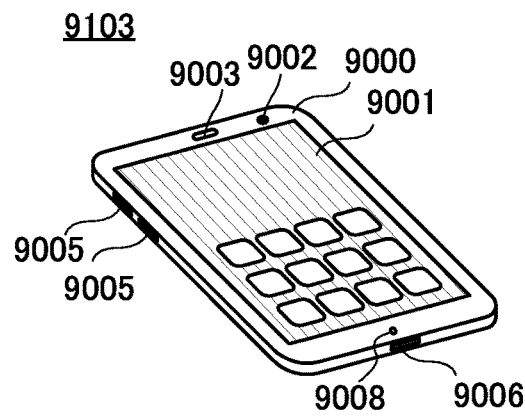

FIG. 24C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 24D:
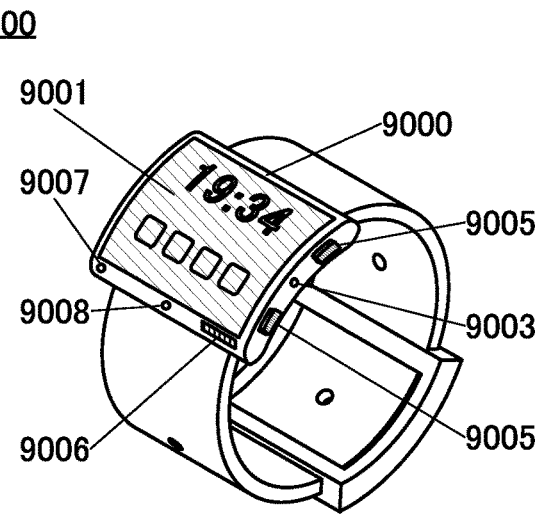

FIG. 24D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 24E:
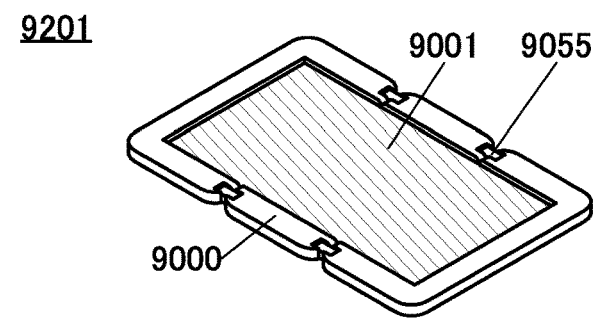
Figure 24F:
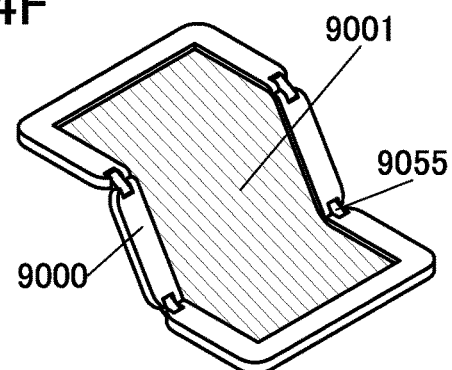
Figure 24G:
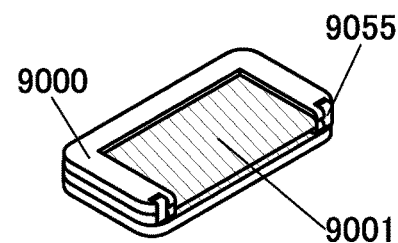

FIGS. 24E to 24G are perspective views of a foldable portable information terminal 9201. FIG. 24E is a perspective view illustrating the portable information terminal 9201 that is opened. FIG. 24G is a perspective view illustrating the portable information terminal 9201 that is folded. FIG. 24F is a perspective view illustrating the portable information terminal 9201 that is shifted from one of the states in FIGS. 24E and 24G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

At least part of this embodiment can be implemented in combination with any of the other embodiments described in this specification, as appropriate.

This application is based on Japanese Patent Application Serial No. 2022-075019 filed with Japan Patent Office on Apr. 28, 2022, the entire contents of which are hereby incorporated by reference.

What is claimed is:

1. A display device comprising:
a substrate;
a first pixel circuit; and
an A/D converter circuit,
wherein the A/D converter circuit comprises a first circuit,
wherein the first pixel circuit and the first circuit are over the same substrate,
wherein the first circuit comprises a resistive divider circuit,
wherein the resistive divider circuit comprises a plurality of transistors,
wherein each of the plurality of transistors comprises:
a semiconductor layer;
a first insulating layer;
a source;
a drain; and
a first gate,
wherein the first gate and the drain are electrically connected to each other,
wherein each of the plurality of transistors comprises a channel formation region in the semiconductor layer,
wherein each of the plurality of transistors comprises a metal oxide in the channel formation region,
wherein each channel formation region of the plurality of transistors is provided along a side surface of the first insulating layer,
wherein the plurality of transistors are electrically connected in series so that the source of a first transistor of the plurality of transistors is electrically connected to the drain and the first gate of a second transistor of the plurality of transistors adjacent to the first transistor,
wherein each of the plurality of transistors comprises a second gate,
wherein a source potential of the second transistor is lower than a source potential of the first transistor, and
wherein the second gate of the first transistor is electrically connected to the source of the second transistor.

2. A display device comprising:
a substrate;
a first pixel circuit over the substrate; and
an A/D converter circuit,
wherein the A/D converter circuit comprises a first circuit over the substrate,
wherein the first circuit comprises a resistive divider circuit,
wherein the resistive divider circuit comprises a plurality of transistors,
wherein each of the plurality of transistors comprises:
a semiconductor layer;
a first insulating layer;
an opening;
a source;
a drain;
a first gate; and
a second gate,
wherein the drain and the first gate are electrically connected to each other,
wherein each of the plurality of transistors comprises a channel formation region in the semiconductor layer,
wherein each of the plurality of transistors comprises a metal oxide in the channel formation region,
wherein each channel formation region of the plurality of transistors is provided along a side surface of the first insulating layer,
wherein the plurality of transistors are electrically connected in series so that the source of a first transistor of the plurality of transistors is electrically connected to the drain and the first gate of a second transistor of the plurality of transistors adjacent to the first transistor,
wherein a source potential of the second transistor is lower than a source potential of the first transistor,
wherein the second gate of the first transistor is electrically connected to the source of the second transistor,
wherein the source of the first transistor, the drain of the first transistor, and the first insulating layer are provided over the substrate, and
wherein the first insulating layer and the source of the first transistor include the opening reaching the drain.

3. The display device according to claim 2, further comprising:
   a second insulating layer over the semiconductor layer,
   wherein the first gate of the first transistor is provided over the second insulating layer, and
   wherein the semiconductor layer, the second insulating layer, and the first gate of the first transistor cover the opening.
4. The display device according to claim 2,
   wherein the first transistor comprises an offset region provided between the channel formation region and the drain.
5. The display device according to claim 3, further comprising:
   a third insulating layer over the source,
   wherein the second gate is overlapping with the source and the drain, and
   wherein the second gate is provided between the first insulating layer and the third insulating layer.
6. A display device comprising:
   a substrate;
   a first pixel circuit over the substrate; and
   an A/D converter circuit,
   wherein the A/D converter circuit comprises a first circuit over the substrate,
   wherein the first circuit comprises a resistive divider circuit,
   wherein the resistive divider circuit comprises a plurality of transistors,
   wherein each of the plurality of transistors comprises:
      a semiconductor layer;
      a first insulating layer;
      a second insulating layer over the semiconductor layer;
      a first conductive layer under the first insulating layer;
      a second conductive layer over the first insulating layer;
      a third conductive layer over the second insulating layer;
      a fourth conductive layer overlapping with the second conductive layer,
      an opening;
      a source;
      a drain;
      a first gate; and
      a second gate,
   wherein each of the plurality of transistors comprises a channel formation region in the semiconductor layer,
   wherein each of the plurality of transistors comprises a metal oxide in the channel formation region,
   wherein each channel formation region of the plurality of transistors is provided along a side surface of the first insulating layer,
   wherein the plurality of transistors are electrically connected in series so that the source of a first transistor of the plurality of transistors is electrically connected to the drain and the first gate of a second transistor of the plurality of transistors adjacent to the first transistor,
   wherein a source potential of the second transistor is lower than a source potential of the first transistor,
   wherein the second gate of the first transistor is electrically connected to the source of the second transistor,
   wherein the first insulating layer and the second conductive layer include the opening reaching the first conductive layer,
   wherein the semiconductor layer, the second insulating layer, and the third conductive layer cover the opening,
   wherein the first conductive layer is configured to be the source of the first transistor,
   wherein the second conductive layer is configured to be the drain of the second transistor,
   wherein the third conductive layer is configured to be the first gate of the second transistor, and
   wherein the fourth conductive layer is configured to be the second gate of the first transistor.
7. The display device according to claim 1,
   wherein the A/D converter circuit comprises a second circuit,
   wherein the second circuit is provided in an IC chip on the substrate, and
   wherein the second circuit is electrically connected to the first circuit.
8. The display device according to claim 1,
   wherein the first pixel circuit comprises a light-receiving device.
9. The display device according to claim 8, further comprising a second pixel circuit,
   wherein the second pixel circuit comprises a light-emitting device.
10. An electronic device comprising the display device according to claim 1, wherein an image of a fingerprint is obtained with use of the first pixel circuit so that fingerprint authentication is performed.
11. The display device according to claim 2,
   wherein the A/D converter circuit comprises a second circuit,
   wherein the second circuit is provided in an IC chip on the substrate, and
   wherein the second circuit is electrically connected to the first circuit.
12. The display device according to claim 2,
   wherein the first pixel circuit comprises a light-receiving device.
13. The display device according to claim 12, further comprising a second pixel circuit,
   wherein the second pixel circuit comprises a light-emitting device.
14. An electronic device comprising the display device according to claim 2, wherein an image of a fingerprint is obtained with use of the first pixel circuit so that fingerprint authentication is performed.
15. The display device according to claim 6,
   wherein the A/D converter circuit comprises a second circuit,
   wherein the second circuit is provided in an IC chip on the substrate, and
   wherein the second circuit is electrically connected to the first circuit.
16. The display device according to claim 6,
   wherein the first pixel circuit comprises a light-receiving device.
17. The display device according to claim 16, further comprising a second pixel circuit,
   wherein the second pixel circuit comprises a light-emitting device.
18. An electronic device comprising the display device according to claim 6, wherein an image of a fingerprint is obtained with use of the first pixel circuit so that fingerprint authentication is performed.

* * * * *